United States Patent
Yamazaki et al.

(10) Patent No.: US 7,825,007 B2
(45) Date of Patent: Nov. 2, 2010

(54) METHOD OF JOINING A PLURALITY OF SOI SUBSTRATES ON A GLASS SUBSTRATE BY A HEAT TREATMENT

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/078,410

(22) Filed: Mar. 31, 2008

(65) Prior Publication Data
US 2008/0280424 A1 Nov. 13, 2008

(30) Foreign Application Priority Data
May 11, 2007 (JP) ............... 2007-127148

(51) Int. Cl.
H01L 21/30 (2006.01)
H01L 21/301 (2006.01)
H01L 21/304 (2006.01)
H01L 21/46 (2006.01)

(52) U.S. Cl. ............ 438/458; 438/455; 438/457; 438/459

(58) Field of Classification Search .......... 438/458
See application file for complete search history.

(56) References Cited

U.S. PATENT DOCUMENTS

| | | | |
|---|---|---|---|
| 6,372,609 B1 | 4/2002 | Aga et al. | |
| 6,534,380 B1 | 3/2003 | Yamauchi et al. | |
| 7,148,124 B1 | 12/2006 | Usenko | |
| 2003/0183876 A1* | 10/2003 | Takafuji et al. | 257/347 |
| 2004/0147095 A1* | 7/2004 | Yamazaki | 438/479 |
| 2004/0248380 A1 | 12/2004 | Aulnette et al. | 438/459 |
| 2004/0259328 A1* | 12/2004 | Ito et al. | 438/459 |
| 2007/0117354 A1* | 5/2007 | Gadkaree et al. | 438/478 |
| 2007/0281399 A1* | 12/2007 | Cites et al. | 438/149 |
| 2007/0281440 A1 | 12/2007 | Cites et al. | |
| 2008/0038908 A1 | 2/2008 | Henley | |
| 2008/0246109 A1 | 10/2008 | Ohnuma et al. | |
| 2009/0081849 A1 | 3/2009 | Yamazaki et al. | |

FOREIGN PATENT DOCUMENTS

| | | |
|---|---|---|
| JP | 11-097379 | 4/1999 |
| JP | 11-163363 | 6/1999 |
| JP | 2000-124092 | 4/2000 |
| JP | 2000-294754 | 10/2000 |
| JP | 2005-203596 | 7/2005 |
| JP | 2005-252244 | 9/2005 |

* cited by examiner

Primary Examiner—N Drew Richards
Assistant Examiner—Michael Jung
(74) Attorney, Agent, or Firm—Eric J. Robinson; Robinson Intellectual Property Law Office, P.C.

(57) ABSTRACT

After the plurality of single-crystal semiconductor layers are provided adjacent to each other with a certain distance over a glass substrate which is a support substrate, heat treatment is performed on the glass substrate. The support substrate shrinks by this heat treatment, and the adjacent single-crystal semiconductor layers are in contact with each other due to the shrink. Energy beam irradiation is performed with the plurality of single-crystal semiconductor layers being in contact with each other, the plurality of single-crystal semiconductor layers are integrated, and thus a continuous single-crystal semiconductor layer is formed.

40 Claims, 31 Drawing Sheets

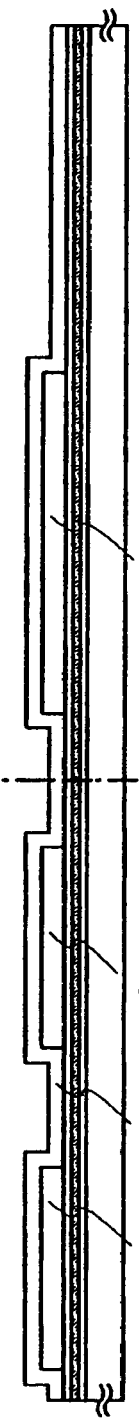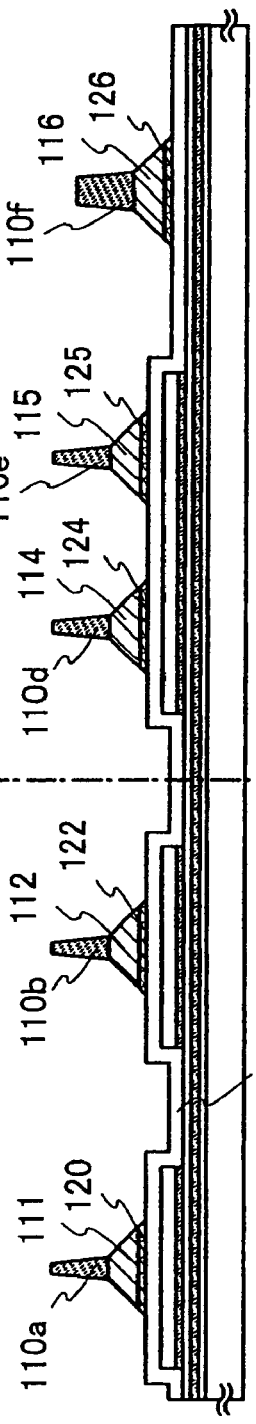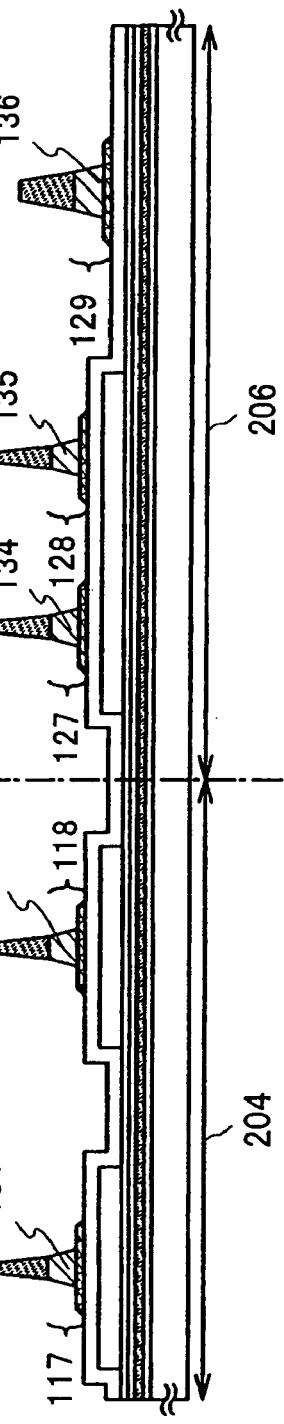
FIG. 4A
FIG. 4B
FIG. 4C
FIG. 4D

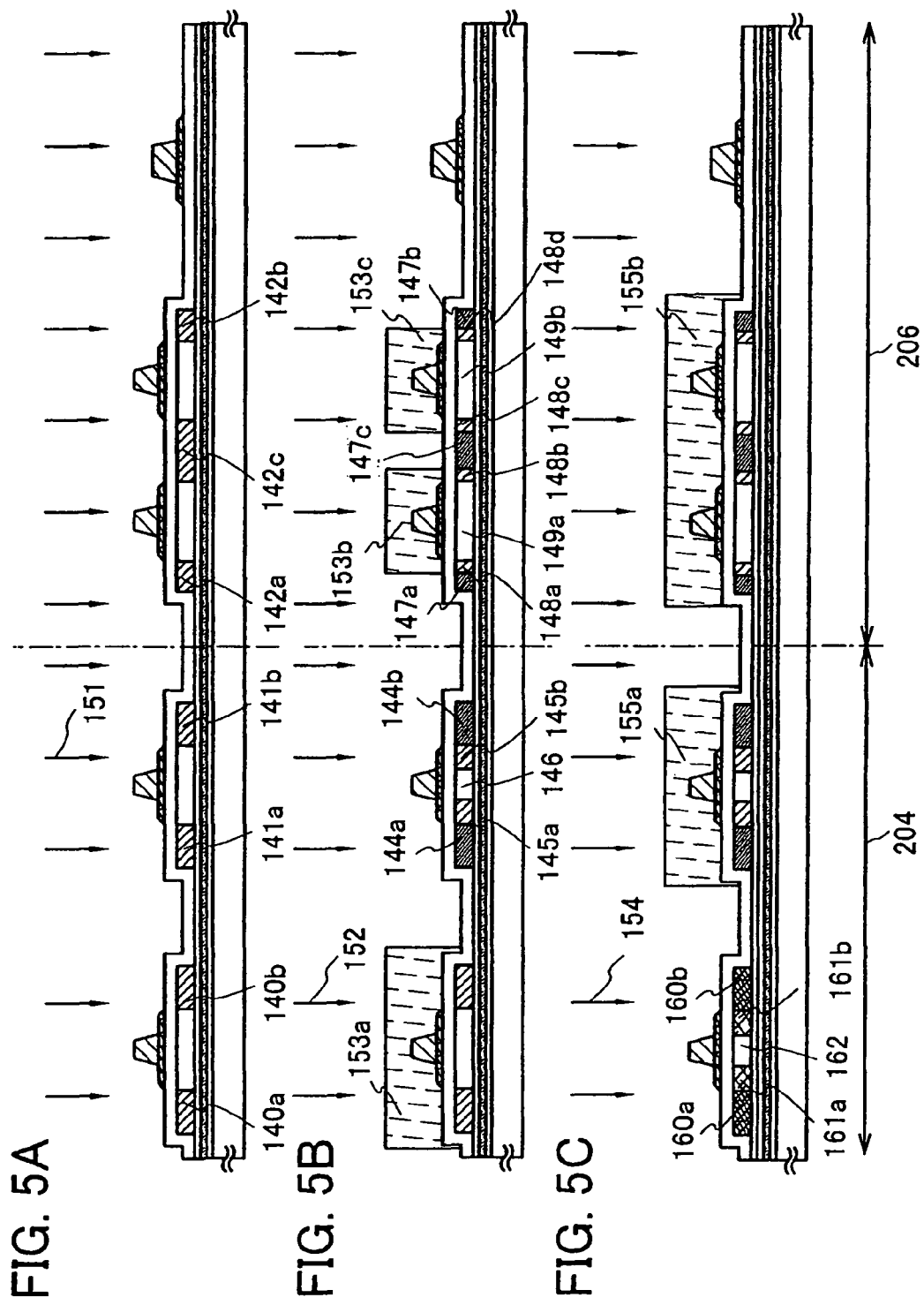

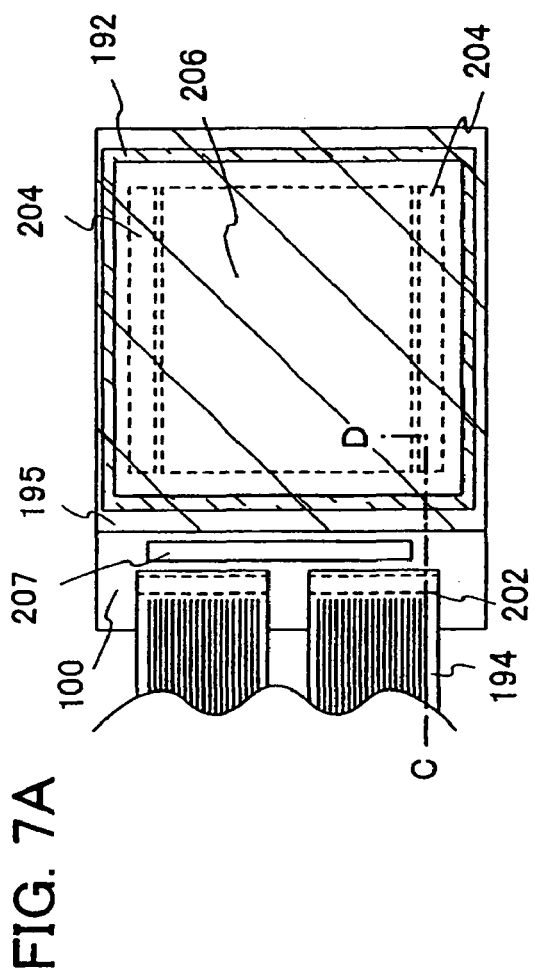
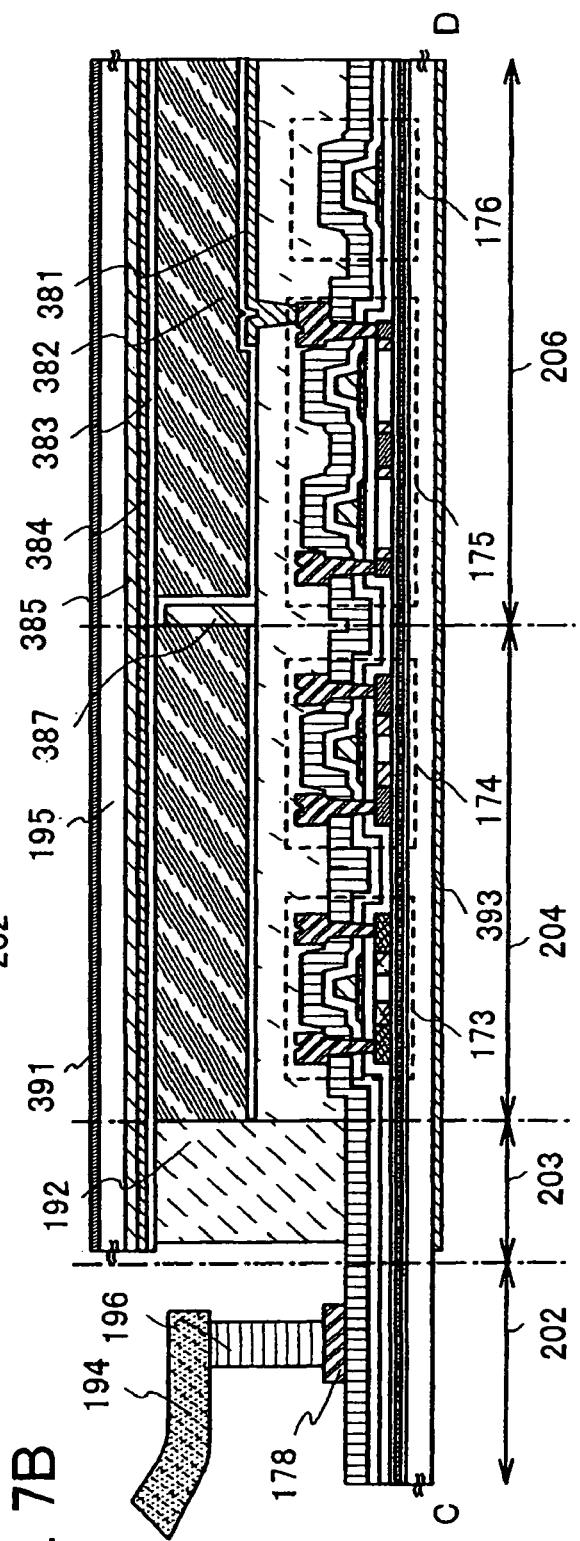
FIG. 7A
FIG. 7B

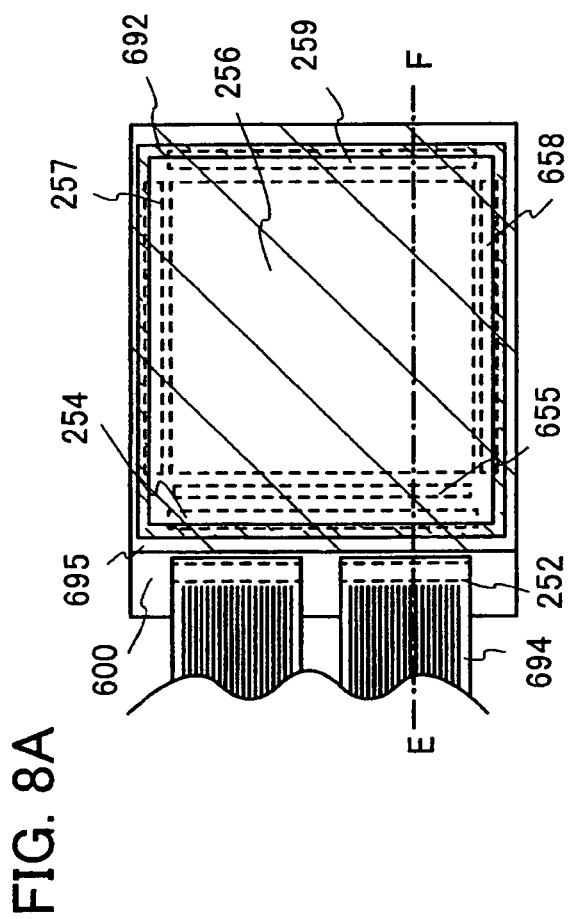
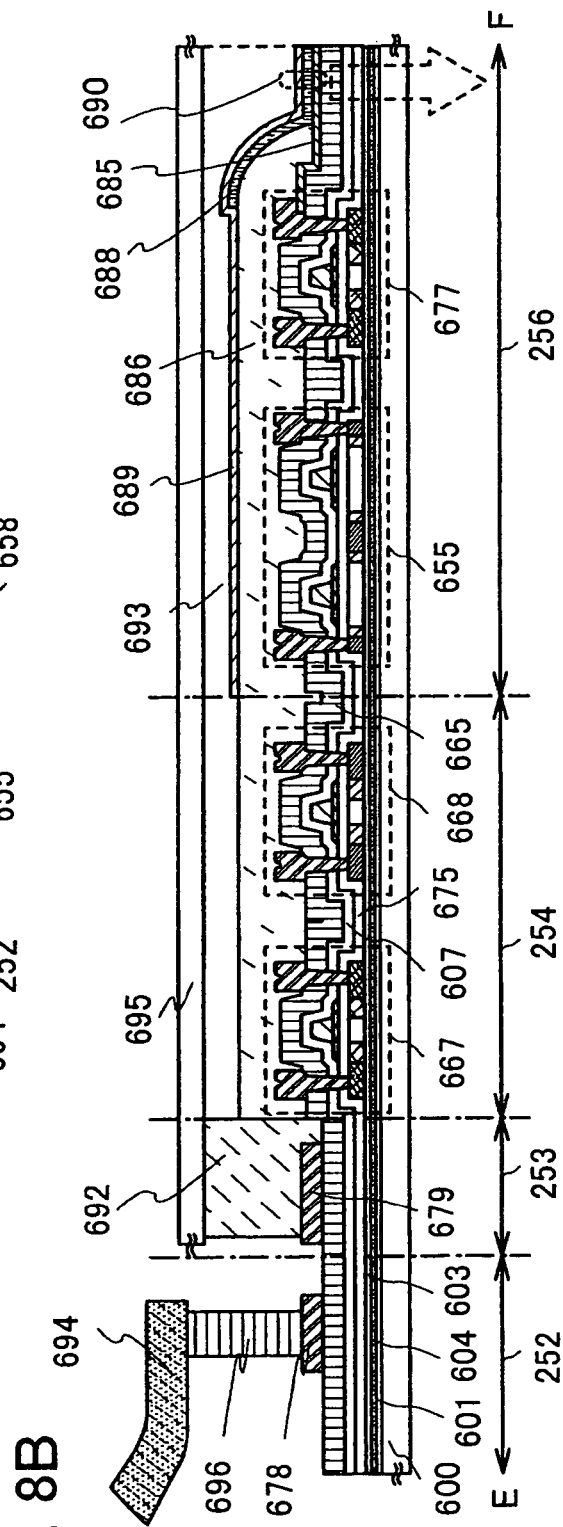
FIG. 8A
FIG. 8B

FIG. 31

| Accelerating voltage | Ratio of hydrogen atom (H) (X : Y) | Ratio of hydrogen ion species (X : Y／3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD OF JOINING A PLURALITY OF SOI SUBSTRATES ON A GLASS SUBSTRATE BY A HEAT TREATMENT

BACKGROUND OF THE INVENTION

1. Field of the Invention

The present invention relates to a method for manufacturing a silicon-on-insulator (SOI) substrate having a so-called SOI structure in which a semiconductor layer is provided on an insulating surface, and a method for manufacturing semiconductor device having an SOI structure.

2. Description of the Related Art

As an alternative to a silicon wafer which is manufactured by thinly slicing an ingot of a single-crystal semiconductor, an integrated circuit using a semiconductor substrate which is referred to as a silicon on an insulator (hereinafter also referred to as "SOI") substrate in which a thin single-crystal semiconductor layer is provided on an insulating surface has been developed. The integrated circuit using an SOI substrate has attracted attention as an integrated circuit which reduces parasitic capacitance between a drain of a transistor and the substrate and improves the performance of a semiconductor integrated circuit.

As a method for manufacturing SOI substrates, a hydrogen ion implantation separation method is known (for example, see Patent Document 1: Japanese Published Patent Application No. 2000-124092). The hydrogen ion implantation separation method is a method in which hydrogen ions are implanted into a silicon wafer to form a microbubble layer at a predetermined depth from the surface to cause separation using the microbubble layer as a cleavage plane, and a thin silicon layer (SOI layer) is bonded to the other silicon wafer. In addition to the heat treatment for separation of an SOI layer, it is necessary to perform heat treatment in an oxidizing atmosphere to form an oxide film on the SOI layer, remove the oxide film, and perform heat treatment at 1000 to 1300° C. in a reducing atmosphere to increase bonding strength.

On the other hand, a semiconductor device in which a single-crystal silicon layer is provided over an insulating substrate such as a high heat-resistance glass substrate is disclosed (for example, see Patent Document 2: Japanese Published Patent Application No. H11-163363). As a structure of this semiconductor device, an entire surface of a crystallized glass substrate, a strain point of which is 750° C. or more, is protected by an insulating silicon film, and a single-crystal layer which is obtained by a separation method of hydrogen ion implantation is firmly fixed to the insulating silicon film.

SUMMARY OF THE INVENTION

On the other hand, in order to realize increase in size of a semiconductor device such as a semiconductor device of a large-screen television device and further improvement in productivity, a technology for forming a large-area semiconductor layer over a large-area substrate has been required. However, in a conventional method, a single-crystal silicon layer that can be formed over a substrate depends on the size of a silicon wafer; thus, it has been difficult to form a large-area single-crystal silicon layer as described above over a substrate.

In view of such a problem, one object of the present invention is to provide a method for manufacturing an SOI substrate provided with a large-area single-crystal semiconductor layer. Another object of the present invention is to provide a method for manufacturing an SOI substrate that can realize low cost and high productivity with the use of a glass substrate as a substrate. Further another object of the present invention is to provide a large-sized semiconductor device or a low-price semiconductor device by manufacturing a semiconductor device with high throughput and high productivity with the use of such an SOI substrate.

A substrate that shrinks by heat treatment is used as a support substrate having an insulating surface, and a plurality of single-crystal semiconductor layers are provided adjacent to each other with a certain distance over the support substrate. Any substrate may be used for the support substrate as long as a substrate shrinks by heat treatment, and a glass substrate can be preferably used.

The plurality of single-crystal semiconductor layers are bonded to the support substrate at a temperature less than or equal to a strain point of the support substrate having an insulating surface. As to a semiconductor substrate which is a base of these single-crystal semiconductor layers, a surface thereof is coated with an insulating film by heat treatment at a high temperature of greater than or equal to the strain point of the support substrate. On the other hand, as to the support substrate, a blocking layer that prevents diffusion of impurities is formed at a temperature less than or equal to the strain point of the support substrate. After that, the semiconductor substrate, where a separation layer is formed, and the support substrate are bonded, and a single-crystal semiconductor layer is formed over the support substrate by performing heat treatment which separates the semiconductor substrate.

In the present invention, a separation layer is a region which is made fragile so as to have minute voids (cavities) by ions with which a single-crystal semiconductor substrate is irradiated. This separation layer is separated by subsequent heat treatment, so that a single-crystal semiconductor layer can be separated from the single-crystal semiconductor substrate.

After the plurality of single-crystal semiconductor layers are provided adjacent to each other with a certain distance over the support substrate, heat treatment is performed on the support substrate. The support substrate shrinks by this heat treatment, and the adjacent single-crystal semiconductor layers are in contact with each other due to the shrink. Energy beam irradiation is performed with the plurality of single-crystal semiconductor layers being in contact with each other, the plurality of single-crystal semiconductor layers are integrated, and thus a continuous single-crystal semiconductor layer is formed. Laser light is preferable as an energy beam.

A condition of heat treatment which is performed on the support substrate and the distance of the plurality of single-crystal semiconductor layers are set so that the distance between the single-crystal semiconductor layers over the support substrate is eliminated and the single-crystal semiconductor layers are in contact with each other by heat treatment performed on the support substrate. In order to deform the support substrate so as to shrink, a heat treatment temperature is preferably greater than or equal to a strain point of a glass substrate. The distance between the single-crystal semiconductor layers depends on the size of the semiconductor substrate which is a base and the size of the support substrate. For example, the distance may be greater than or equal to 0.1 μm and less than or equal to 1 μm. This heat treatment may be performed under reduced pressure or atmospheric pressure, and as to an atmosphere, the heat treatment may be performed under a nitrogen atmosphere, an oxygen atmosphere, or the like.

The shrink of the support substrate due to heat treatment is utilized so that a distance between single-crystal semiconductor layers, which are provided in advance, is made to disappear. Therefore, warpage of the support substrate and the single-crystal semiconductor layers and peeling of the single-crystal semiconductor layers from the support substrate can be prevented. Further, since the plurality of single-crystal semiconductor layers can be integrated to form a continuous film, an SOI substrate having a large-area single-crystal semiconductor layer can be manufactured.

Thus, even in a case of a large-sized semiconductor device, a semiconductor device having high performance and high reliability can be manufactured with high throughput and high productivity.

Heat treatment on the semiconductor substrate is preferably performed under an oxidizing atmosphere. More preferably, the heat treatment is performed under an oxidizing atmosphere containing halogen. For example, oxygen is added with a small amount of a hydrochloric acid to perform heat treatment, so that an oxide film is formed over the semiconductor substrate. Accordingly, a dangling bond of an interface between the semiconductor substrate and the oxide film is terminated with hydrogen, so that the interface is inactivated and electric characteristics can be stabilized. Chlorine acts so as to react with metal contained in the semiconductor substrate and remove the metal (gettering).

A silicon nitride film or a silicon nitride oxide film which prevents diffusion of impurity elements is provided over the support substrate as a blocking layer. A silicon oxynitride film may be further combined as an insulating film which has an operation of relieving stress. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

According to one mode of a method for manufacturing an SOI substrate of the present invention includes the steps of: forming an oxide film on each surface of a first semiconductor substrate and a second semiconductor substrate by performing heat treatment in an oxidizing atmosphere containing halogen; performing irradiation with ions including one or a plurality of atoms, which are different in mass, from each one surface side of the first semiconductor substrate and the second semiconductor substrate to form a separation layer having a porous structure in each region, a depth of which is close to an average depth at which the ions reach from each one surface of the first semiconductor substrate and the second semiconductor substrate; forming a blocking layer formed of a silicon nitride film or a silicon nitride oxide film on each one surface of the first semiconductor substrate and the second semiconductor substrate; forming a silicon oxide film over the blocking layer of each of the first semiconductor substrate and the second semiconductor substrate; generating a crack in the separation layer, performing heat treatment for separating each of the first semiconductor substrate and the second semiconductor substrate with the separation layer, and forming a first single-crystal semiconductor layer from the first semiconductor substrate and a second single-crystal semiconductor layer from the second semiconductor substrate with a certain distance over the glass substrate, in a state where each one surface of the first semiconductor substrate and the second semiconductor substrate are overlapped with a glass substrate with the silicon oxide film interposed therebetween; and integrating the first single-crystal semiconductor layer and the second single-crystal semiconductor layer by performing heat treatment on the glass substrate at a temperature greater than or equal to a strain point of the glass substrate and irradiating the first single-crystal semiconductor layer and the second single-crystal semiconductor layer with laser light. As a result, a continuous third single-crystal semiconductor layer is formed.

Another mode of a method for manufacturing an SOI substrate of the present invention includes the steps of: forming an oxide film on each surface of a first semiconductor substrate and a second semiconductor substrate by performing heat treatment in an oxidizing atmosphere containing halogen; performing irradiation with ions including one or a plurality of atoms, which are different in mass, from each one surface side of the first semiconductor substrate and the second semiconductor substrate to form a separation layer having a porous structure in each region, a depth of which is close to an average depth at which the ions reach from each one surface of the first semiconductor substrate and the second semiconductor substrate; forming a blocking layer formed of a silicon nitride film or a silicon nitride oxide film on each one surface of the first semiconductor substrate and the second semiconductor substrate; forming a silicon oxide film over the blocking layer of each of the first semiconductor substrate and the second semiconductor substrate; generating a crack in the separation layer, performing heat treatment for separating each of the first semiconductor substrate and the second semiconductor substrate with the separation layer, and forming a first single-crystal semiconductor layer from the first semiconductor substrate and a second single-crystal semiconductor layer from the second semiconductor substrate with a certain distance over the glass substrate, in a state where each one surface of the first semiconductor substrate and the second semiconductor substrate are overlapped with a glass substrate with the silicon oxide film interposed therebetween; and performing heat treatment on the glass substrate at a temperature of greater than or equal to a strain point of the glass substrate to shrink the first single-crystal semiconductor layer and the second single-crystal semiconductor layer so as to be in contact with each other; and irradiating the first single-crystal semiconductor layer and the second single-crystal semiconductor layer with laser light and integrating the first single-crystal semiconductor layer and the second single-crystal semiconductor layer. As a result, a continuous third single-crystal semiconductor layer is formed.

In any of the above structures, heat treatment for separating each of the first semiconductor substrate and the second semiconductor substrate with the separation layer is performed at a temperature lower than a temperature of heat treatment of the glass substrate which is higher than a strain point of the glass substrate.

A semiconductor device can be manufactured using the single-crystal semiconductor layer formed by the method for manufacturing an SOI substrate.

Note that a "semiconductor device" indicates devices which can function by using semiconductor characteristics, in the present invention. According to the present invention, devices which include a circuit having a semiconductor element (such as a transistor, a memory element, or a diode) or semiconductor devices such as chips which includes a processor circuit can be manufactured.

The present invention can be used for a semiconductor device (also referred to as a display device) that is a device having a display function. The semiconductor device using the present invention includes, in its category, a semiconductor device (a light-emitting display device) where a TFT is connected to a light-emitting element in which a layer containing an organic material, an inorganic material or a mixture of organic and inorganic materials which exhibits light emission called electroluminescence (hereinafter also referred to as "EL"), is interposed between electrodes, a semiconductor device (a liquid crystal display device) using a liquid crystal element including a liquid crystal material as a display element, and the like. In the present invention, a "semiconductor device having a display function" means devices having display elements (e.g., liquid crystal elements or light-emitting elements). Note that the semiconductor device also includes a display panel itself where a plurality of pixels including a display element such as a liquid crystal element or an EL element, and/or a peripheral driver circuit for driving the pixels are formed over a substrate. Further, it may include a flexible printed circuit (FPC) or a printed wiring board (PWB) having an IC, a resistor element, a capacitor, an inductor, a transistor, or the like). Such display devices may also include an optical sheet such as a polarizing plate or a retardation plate. Further, it may include a backlight (which may include a light guide plate, a prism sheet, a diffusion sheet, a reflective sheet, or a light source (e.g., an LED or a cold-cathode tube)).

Note that a display element or a semiconductor device may be in various modes and may include various elements. For example, there are display media of which contrast changes by an electromagnetic function, such as EL elements (e.g., organic EL elements, inorganic EL elements, or EL elements containing both organic and inorganic materials), electron-emissive elements, liquid crystal elements, electronic inks, grating light valves (GLV), plasma displays (PDP), digital micromirror devices (DMD), piezoceramic displays, and carbon nanotubes. In addition, semiconductor devices using an EL element include EL displays; semiconductor devices using an electron-emissive element include field emission displays (FED), surface-conduction electron-emitter displays (SED), and the like; semiconductor devices using a liquid crystal element include liquid crystal displays, transmissive liquid crystal displays, semi-transmissive liquid crystal displays, and reflective liquid crystal displays; and semiconductor devices using electronic ink include electronic paper.

Shrink of a glass substrate due to heat treatment is utilized so that a distance between single-crystal semiconductor layers, which are provided in advance, is made to disappear. Therefore, warpage of the glass substrate and the single-crystal semiconductor layers and peeling of the single-crystal semiconductor layers from the glass substrate can be prevented. Further, since the plurality of single-crystal semiconductor layers can be integrated to form a continuous film, an SOI substrate having a large-area single-crystal semiconductor layer can be manufactured.

A semiconductor substrate is subjected to heat treatment at a high temperature of greater than or equal to a strain point of the glass substrate, and the glass substrate is provided with a blocking layer at a temperature less than or equal to the strain point to bond together. Accordingly, a single-crystal semiconductor layer can be prevented from being contaminated by impurities. Further, interface state density of an interface between the single-crystal semiconductor layer and the glass substrate can be lowered. Accordingly, a semiconductor device which is sufficient for practical use can be provided.

Thus, even in a case of a large-sized semiconductor device, a semiconductor device having high performance and high reliability can be manufactured with high throughput and high productivity. In addition, a semiconductor device can be manufactured at low cost with the use of an inexpensive glass substrate; therefore, a low-price semiconductor device can be provided.

BRIEF DESCRIPTION OF THE DRAWINGS

In the accompanying drawings:

FIGS. 4A to 4D are cross-sectional views illustrating a method for manufacturing a semiconductor device of the present invention;

FIGS. 5A to 5C are cross-sectional views illustrating a method for manufacturing a semiconductor device of the present invention;

FIGS. 7A and 7B are a top view and a cross-sectional view illustrating a semiconductor device of the present invention;

FIGS. 8A and 8B are a top view and a cross-sectional view illustrating a semiconductor device of the present invention;

FIG. 31 is a list of ratios of fitting parameters (hydrogen atom ratios and hydrogen ion species ratios).

DETAILED DESCRIPTION OF THE INVENTION

Figure 1A:
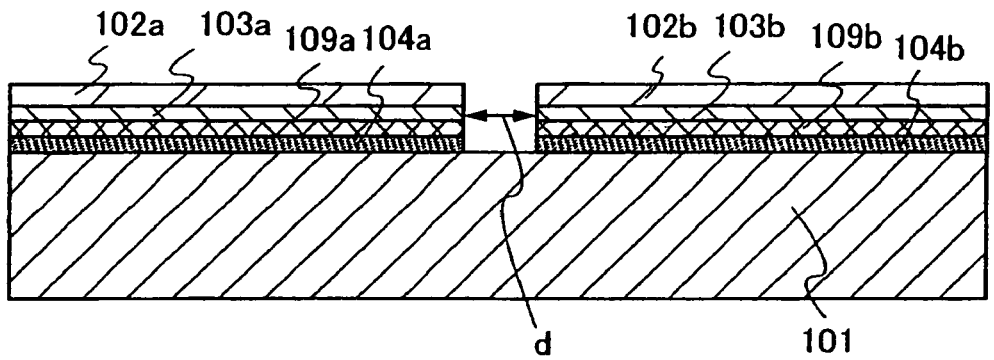
FIGS. 1A to 1C are cross-sectional views illustrating a method for manufacturing an SOI substrate of the present invention.

Embodiment modes of the present invention will be described hereinafter with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes below. Note that in structures of the present invention to be described below, the same portions or portions having the same function are denoted by the same reference numerals in different drawings and repetitive description thereof will be omitted.

Embodiment Mode 1

A method for manufacturing a semiconductor substrate of the present invention will be described with reference to FIGS. 1A to 1C, FIGS. 2A to 2E, and FIGS. 3A to 3D.

Figure 2A:
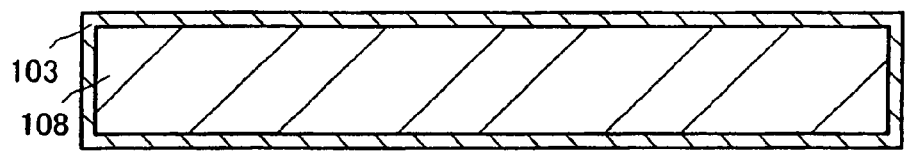
FIGS. 2A to 2E are cross-sectional views illustrating a method for manufacturing an SOI substrate of the present invention.

In FIG. 2A, an n-type or p-type single-crystal silicon substrate (a silicon wafer) is typically used as a semiconductor substrate 108. Alternatively, as another crystal semiconductor substrate, a substrate of silicon or germanium, or a substrate of a compound semiconductor such as gallium arsenide or indium phosphide can also be applied. In this embodiment mode, an ion irradiation separation method whereby a crystal semiconductor substrate is irradiated with ions of hydrogen or fluorine to reach a predetermined depth and then heat treatment is performed to separate a single-crystal silicon layer on a surface layer is applied; however, a method whereby epitaxial growth of single-crystal silicon is performed over a porous silicon layer and then the porous silicon layer is separated by water jet may also be applied.

Degreasing cleaning is performed on the semiconductor substrate 108 and an oxide film on the surface is removed to perform thermal oxidation. As thermal oxidation, general dry oxidation may be performed; however, oxidation in an oxidizing atmosphere to which halogen is added is preferably performed. For example, heat treatment is performed at a temperature of greater than or equal to 700° C. in an atmosphere containing HCl at 0.5 to 10 volume % (preferably 3 volume %) with respect to oxygen. The thermal oxidation may be performed at a temperature of 950 to 1100° C. The processing time may be 0.1 to 6 hours, preferably 0.5 to 1 hour. The film thickness of an oxide film 103 which is formed is 10 to 1000 nm (preferably 50 to 200 nm), for example, 100 nm.

Besides HCl as a material including halogen, one or plural kinds selected from among HF, $NF_3$, HBr, $Cl_2$, $ClF_3$, $BCl_3$, $F_2$, $Br_2$, or dichloroethylene can be used.

Heat treatment is performed in such a temperature range, so that a gettering effect by a halogen element can be obtained. Gettering particularly has an effect of removing a metal impurity. That is, an impurity such as metal changes into a volatile chloride and is diffused into the air to be removed by an operation of chlorine. The gettering is effective on the surface of the semiconductor substrate 108 subjected to chemical mechanical polishing (CMP). In addition, hydrogen has an operation of compensating defects at an interface between the semiconductor substrate 108 and the oxide film 103 so as to lower local level density of the interface, and the interface between the semiconductor substrate 108 and the oxide film 103 is inactivated and thus electric characteristics are stabilized.

The oxide film 103 formed by this heat treatment can contain halogen. The halogen element is contained at a concentration of $1 \times 10^{17}$ to $5 \times 10^{20}/cm^3$, so that the oxide film 103 can have a function as a protective film which captures an impurity such as metal and prevents contamination of the semiconductor substrate 108.

Figure 2B:
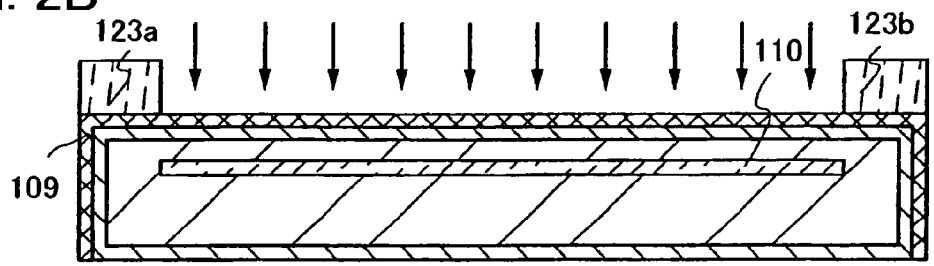

In FIG. 2B, a blocking layer 109 is formed over the semiconductor substrate 108 to form a separation layer 110 by irradiation with hydrogen or halogen ions. In the present invention, a plurality of single-crystal semiconductor layers which are separated from a plurality of semiconductor substrates are integrated to form a continuous large-area single-crystal semiconductor layer. Thus, edge portions of the single-crystal semiconductor layers which are separated (which are cut off from the semiconductor substrates) need to be exposed without being covered with the oxide film 103 and the blocking layer 109.

In this embodiment mode, mask layers 123a and 123b are selectively provided over the semiconductor substrate 108 to selectively form the separation layer 110 by irradiation with hydrogen or halogen ions. As illustrated in FIGS. 2A to 2E, the separation layer 110 can be selectively formed in the semiconductor substrate 108 without being in contact with the oxide film 103 and the blocking layer 109.

As the blocking layer 109, a silicon nitride film or a silicon nitride oxide film is formed with a thickness of 50 to 200 nm by a vapor phase growth method. For example, a silicon nitride film is formed by a plasma CVD method with the use of $SiH_4$ and $NH_3$ as a source gas. A silicon nitride oxide film is formed by a plasma CVD method with the use of $SiH_4$, $N_2O$, and $NH_3$. The blocking layer 109 has an effect of preventing diffusion of impurities against a single-crystal semiconductor layer which is formed from this semiconductor substrate 108. In addition, in forming the separation layer 110, the blocking layer 109 has an effect of preventing a surface of the semiconductor substrate 108 from being damaged by irradiation with the ions and from losing planarity.

The separation layer 110 is formed by irradiating the surface of the semiconductor substrate 108 with ions which are accelerated by an electric field to reach a predetermined depth. The depth of the separation layer 110 which is formed in the semiconductor substrate 108 is controlled by accelerated energy of the ions and an incidence angle of the ions. The separation layer 110 is formed in a region, a depth of which is close to an average depth at which the ions reach from the surface of the semiconductor substrate 108. For example, the single-crystal semiconductor layer has a thickness of 5 to 500 nm, preferably 10 to 200 nm, and an acceleration voltage at the time of ion irradiation is applied in consideration of such a thickness. Ion irradiation is preferably performed using an ion doping apparatus. That is, a doping method in which irradiation with plural ion species which are generated by making the source gas into plasma are performed without separation by mass is employed. In the case of this embodiment mode, it is preferable to perform irradiation with ions including one or the plurality of the same atoms, which are different in mass. Ion doping may be performed, in which an acceleration voltage is 10 to 100 kV, preferably 30 to 80 kV; a dose is $1\times10^{16}$ to $4\times10^{16}/cm^2$; and beam current density is greater than or equal to $2\ \mu A/cm^2$, preferably greater than or equal to $5\ \mu A/cm^2$, more preferably greater than or equal to $10\ \mu A/cm^2$, so that defects formed in the semiconductor layer due to the irradiation can be reduced.

In the case of irradiation with hydrogen ions, it is preferable to increase a rate of an $H_3^+$ ion and to contain $H^+$, $H_2^+$, and $H_3^+$ ions as well. In the case of irradiation with hydrogen ions, irradiation efficiency can be increased and thus an irradiation time can be shortened by increasing a rate of an $H_3^+$ ion and containing $H^+$, $H_2^+$, and $H_3^+$ ions as well. Accordingly, the region of the separation layer 110 which is formed in the semiconductor substrate 108 can contain hydrogen which is greater than or equal to $1\times10^{20}/cm^3$ (preferably $5\times10^{20}/cm^3$). When a high-concentration hydrogen addition region is locally formed in the semiconductor substrate 108, the crystal structure is disordered and minute voids are formed, so that the separation layer 110 can have a porous structure. In this case, the minute voids which are formed in the separation layer 110 by heat treatment at comparatively low temperature vary in volume and separation is performed thereon along the separation layer, so that a thin single-crystal semiconductor layer can be formed.

The separation layer 110 can be formed in a similar manner by irradiating the semiconductor substrate 108 with ions which are separated by mass. In this case, when irradiation with an ion which is high in mass (for example, an $H_3^+$ ion) is selectively performed, an effect similar to that of the above can be obtained, which is preferable.

An ion irradiation method, which is one aspect of the present invention, is considered below.

In the present invention, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

  (1)

  (2)

  (3)

  (4)

  (5)

  (6)

  (7)

  (8)

  (9)

Figure 24:
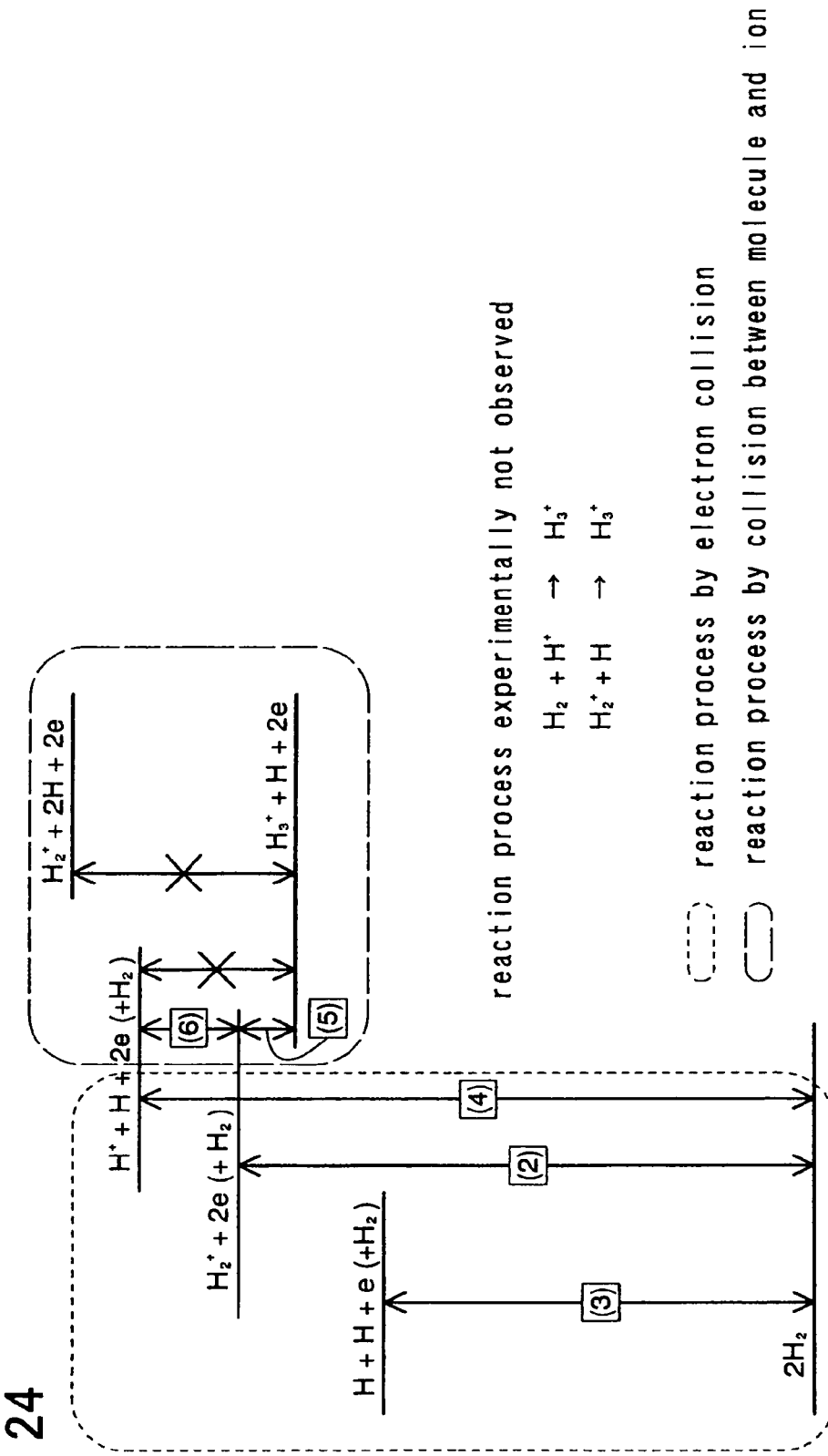
FIG. 24 is an energy diagram of hydrogen ion species.

FIG. 24 is an energy diagram which schematically illustrates some of the above reactions. Note that the energy diagram illustrated in FIG. 24 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than approximately 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than approximately 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 25:
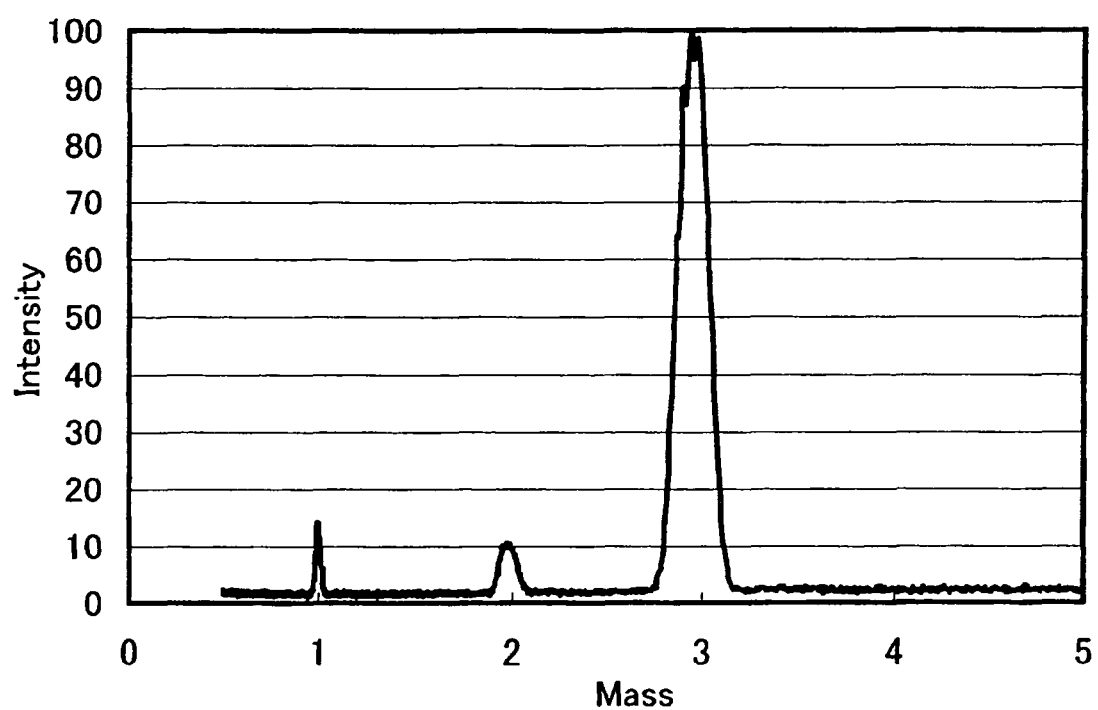
FIG. 25 is a diagram illustrating the results of ion mass spectrometry.

Here, an example, in which the proportions of ion species (particularly, the proportion of $H_3^+$) are different, is described. FIG. 25 is a graph illustrating the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 25, the number of ions with different masses is expressed as a relative proportion where the number of ions with a mass of 3 is defined as 100. It can be seen from FIG. 25 that the ratio between ion species that are generated from the ion source, i.e., the ratio between $H^+$, $H_2^+$, and $H_3^+$, is approximately 1:1:8. Note that ions at such a ratio can also be generated by an ion doping apparatus which has a plasma source portion (ion source) that generates a plasma, an extraction electrode that extracts an ion beam from the plasma, and the like.

Figure 26:
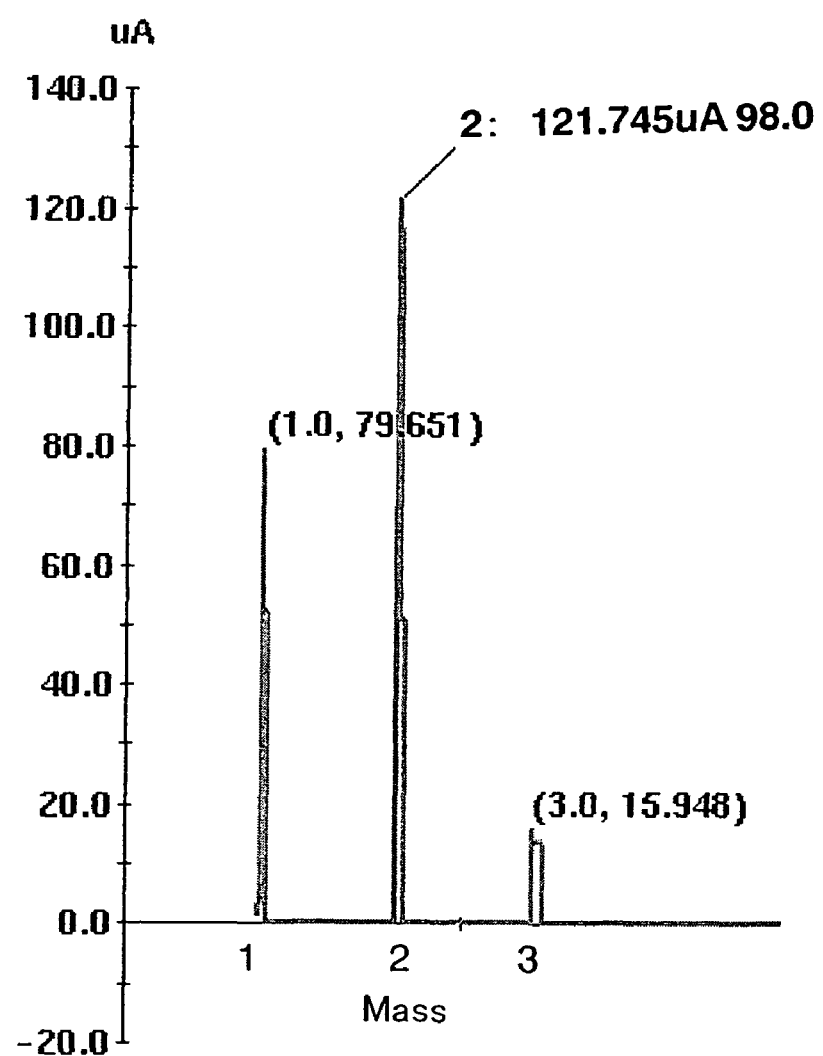
FIG. 26 is a diagram illustrating the results of ion mass spectrometry.

FIG. 26 is a graph illustrating the results of mass spectrometry of ions that are generated from $PH_3$ when an ion source different from that for the case of FIG. 25 is used and the pressure of the ion source is approximately $3 \times 10^{-3}$ Pa. The results of this mass spectrometry focus on the hydrogen ion species. In addition, the mass spectrometry was performed by measurement of ions that were extracted from the ion source. As in FIG. 25, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 26 that the ratio between ion species in a plasma, i.e., the ratio between $H^+$, $H_2^+$, and $H_3^+$, is approximately 37:56:7. Note that although FIG. 26 illustrates the data obtained when the source gas is $PH_3$, the ratio between the hydrogen ion species is about the same when a 100% hydrogen gas is used as a source gas, as well.

In the case of the ion source from which the data illustrated in FIG. 26 is obtained, $H_3^+$, of $H^+$, $H_2^+$, and $H_3^+$, is generated at a proportion of only approximately 7%. On the other hand, in the case of the ion source from which the data illustrated in FIG. 25 is obtained, the proportion of $H_3^+$ can be greater than or equal to 50% (under the above-described conditions, approximately 80%). This is thought to result from the pressure and electric field inside a chamber, which is clearly shown in the above consideration.

($H_3^+$ Irradiation Mechanism)

When a plasma that contains a plurality of ion species as illustrated in FIG. 25 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered. Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 27:
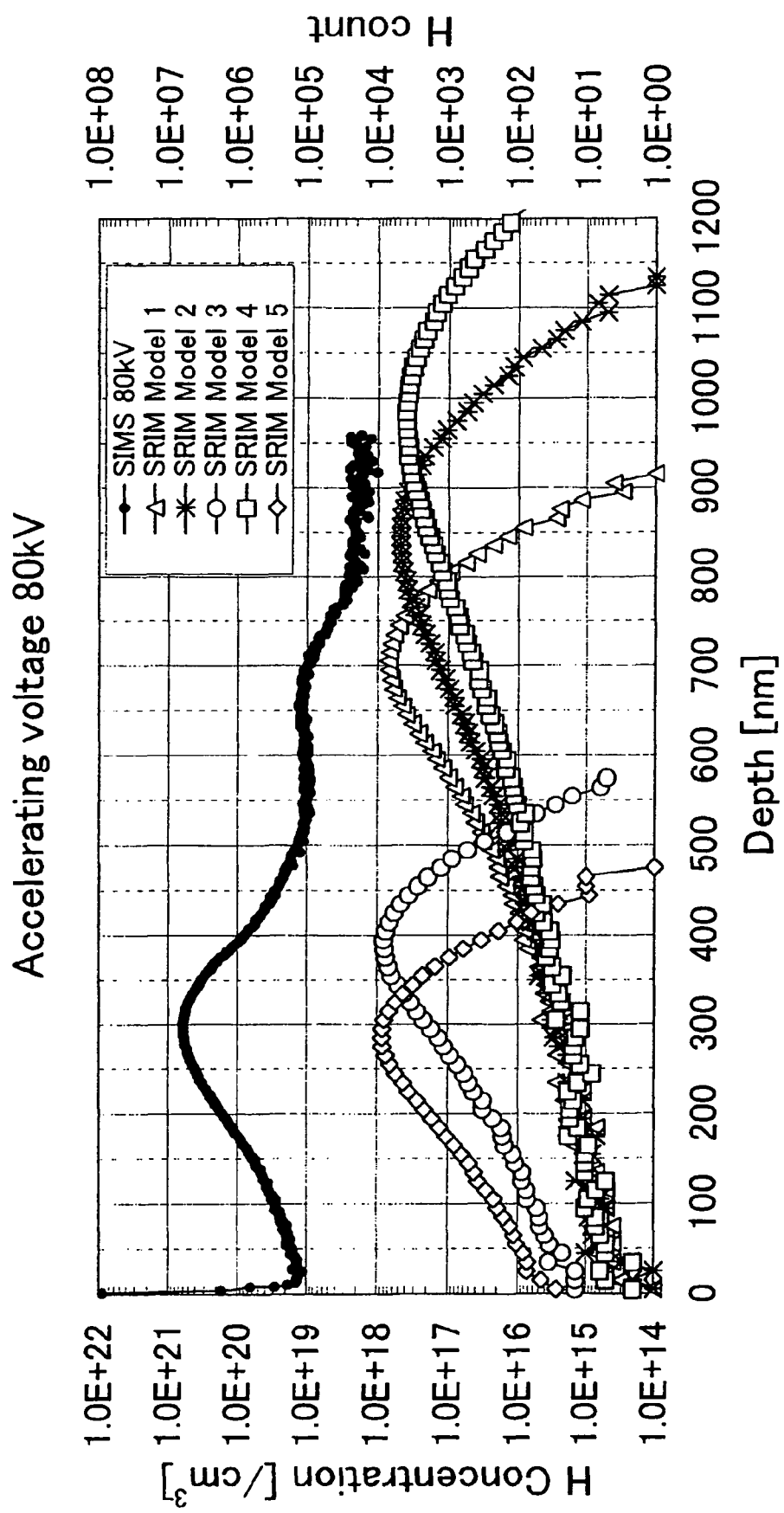
FIG. 27 is a diagram illustrating the profile (measured values and calculated values) of hydrogen in the depth direction when the acceleration voltage is 80 kV.

FIG. 27 illustrates the calculation results obtained when irradiation with the hydrogen ion species (irradiation with 100,000 atoms for H) is performed using Models 1 to 5. FIG. 27 also illustrates the hydrogen concentration (secondary ion mass spectrometry (SIMS) data) in an Si substrate irradiated with the hydrogen ion species of FIG. 25. The results of calculations performed using Models 1 to 5 are expressed on the vertical axis (right axis) as the number of hydrogen atoms, and the SIMS data is expressed on the vertical axis (left axis) as the concentration of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figure 28:
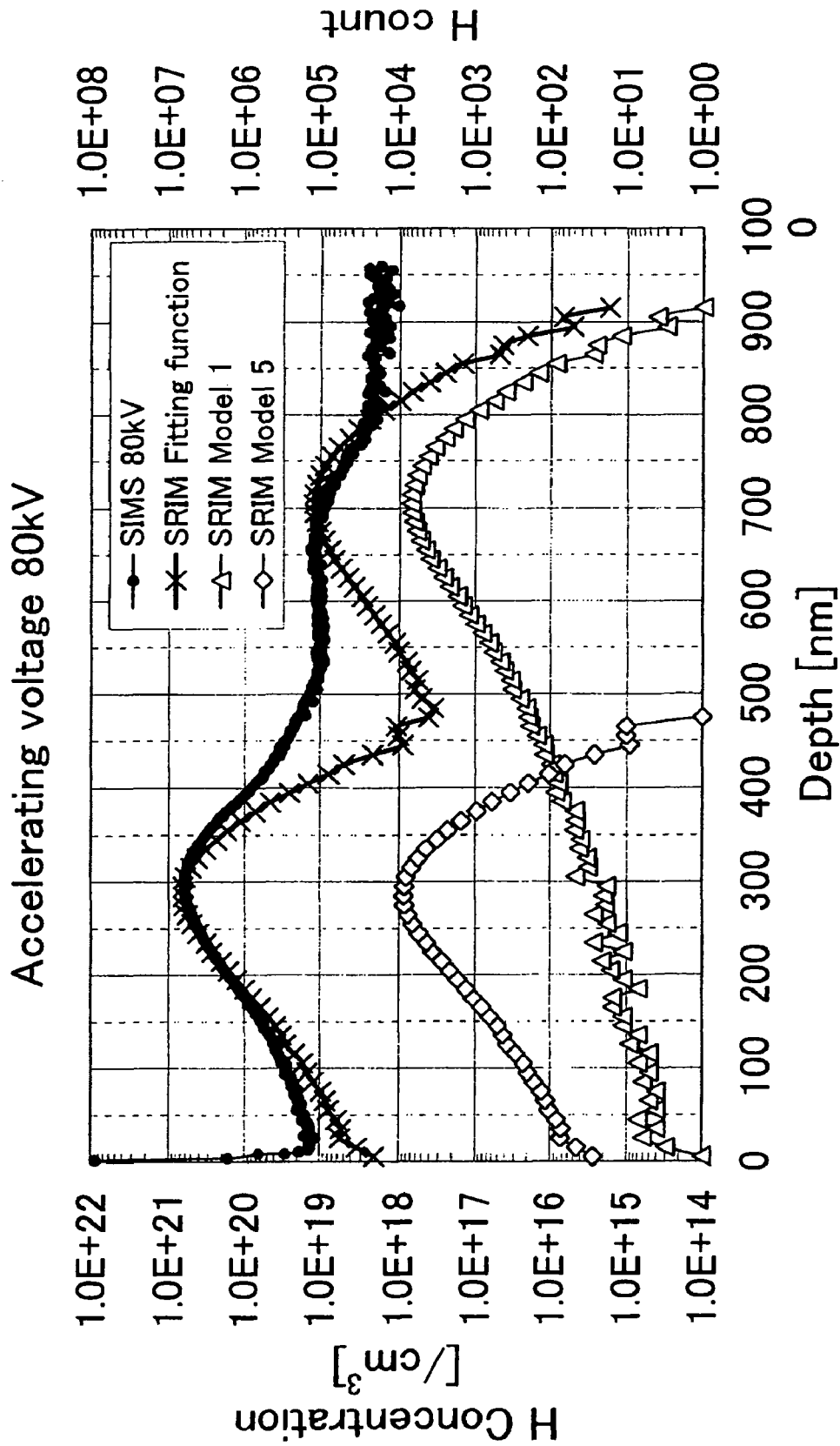
FIG. 28 is a diagram illustrating the profile (measured values, calculated values, and fitting functions) of hydrogen in the depth direction when the acceleration voltage is 80 kV.
Figure 29:
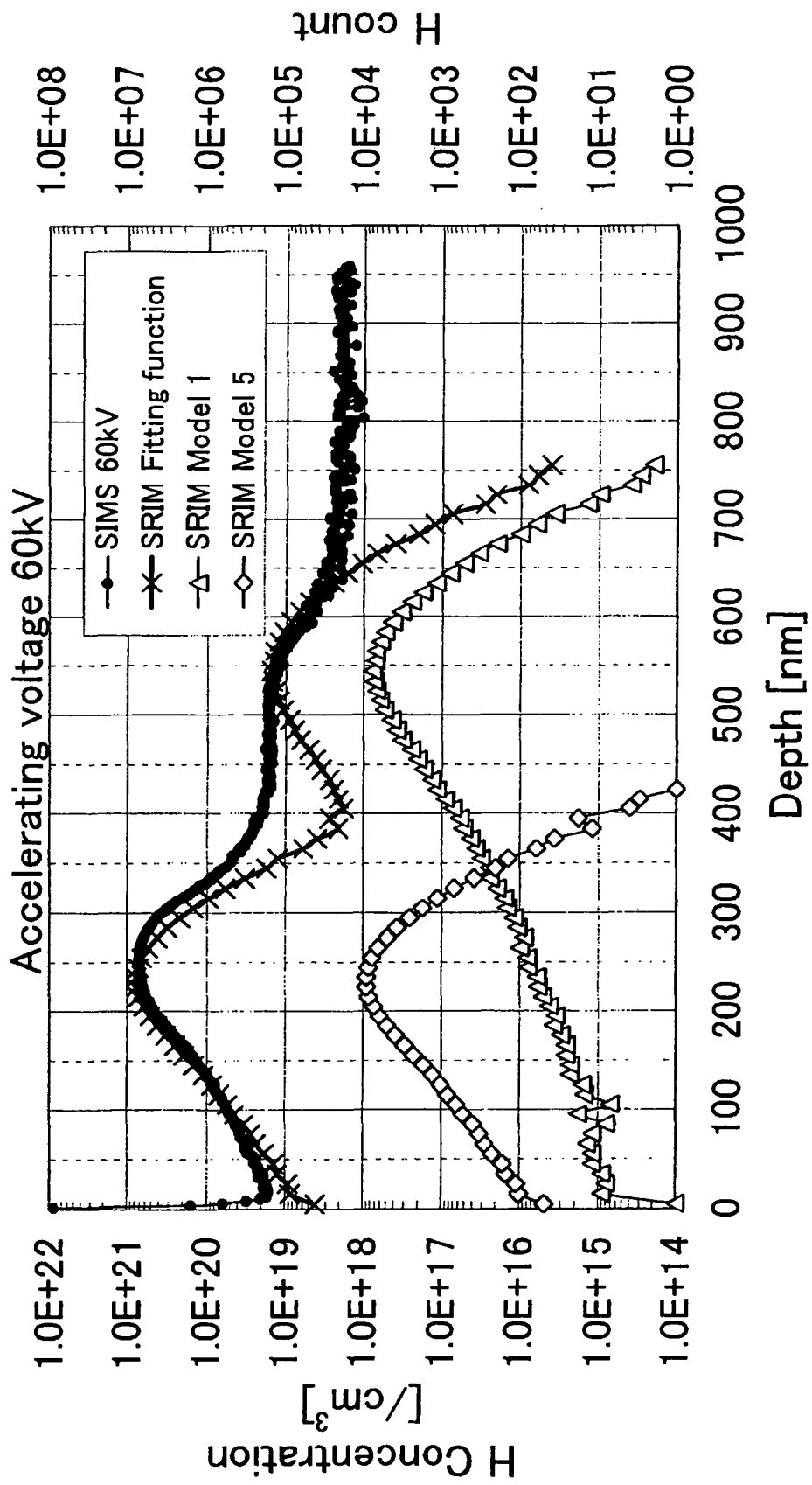
FIG. 29 is a diagram illustrating the profile (measured values, calculated values, and fitting functions) of hydrogen in the depth direction when the acceleration voltage is 60 kV.
Figure 30:
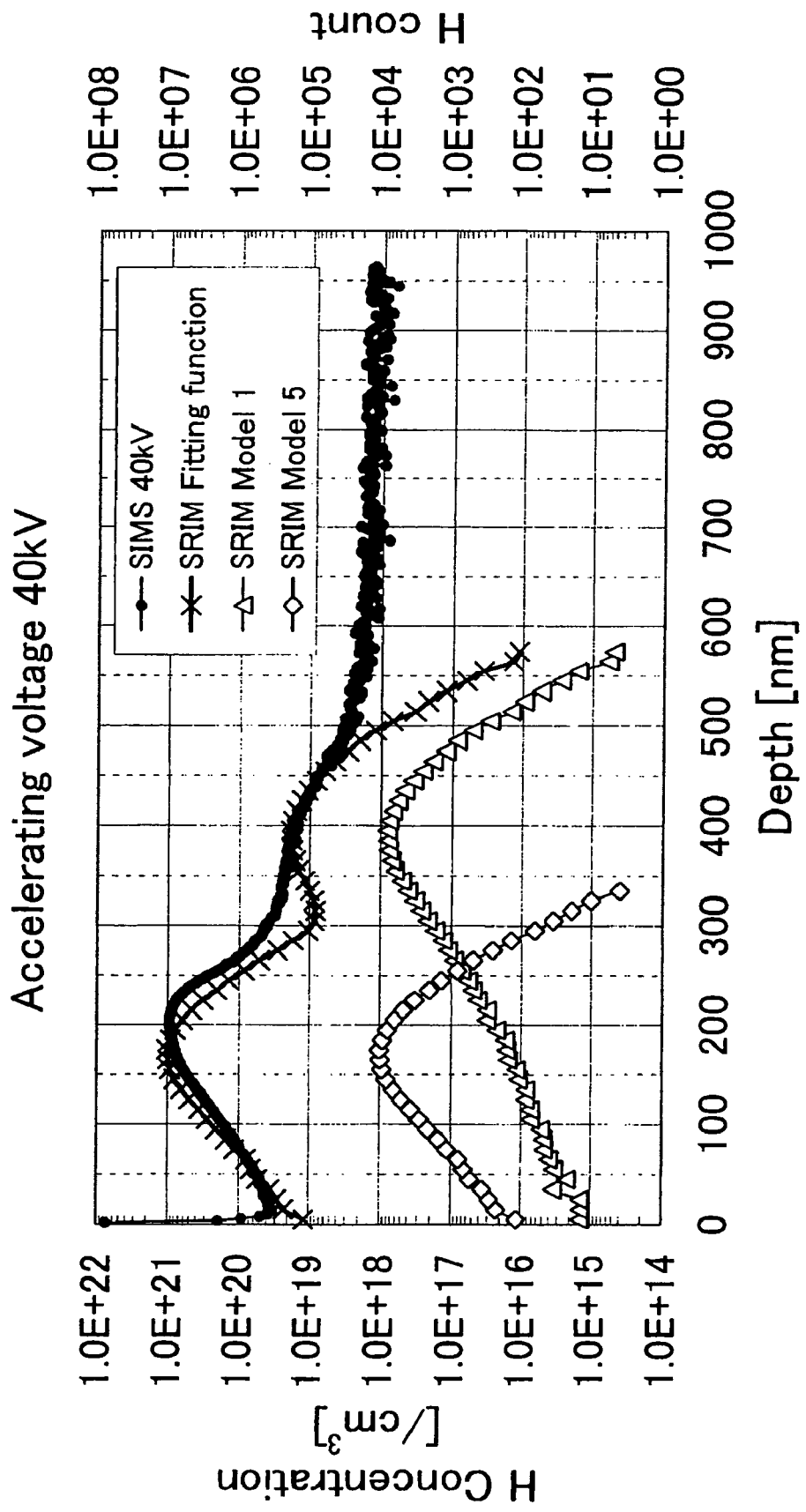
FIG. 30 is a diagram illustrating the profile (measured values, calculated values, and fitting functions) of hydrogen in the depth direction when the acceleration voltage is 40 kV.

Accordingly, Models 2 to 4 will not be considered hereinafter. FIGS. 28 to 30 each illustrate the calculation results obtained when irradiation with the hydrogen ion species (irradiation with 100,000 atoms for H) is performed using Models 1 and 5. FIGS. 28 to 30 also each illustrate the hydrogen concentration (SIMS data) in an Si substrate irradiated with the hydrogen ion species of FIG. 25, and the simulation results fitted to the SIMS data (hereinafter referred to as a fitting function). Here, FIG. 28 illustrates the case where the acceleration voltage is 80 kV; FIG. 29, the case where the acceleration voltage is 60 kV; and FIG. 30, the case where the acceleration voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is approximately 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si, and the influence due to crystallinity is not considered.

FIG. 31 lists the above-described fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ions used for irradiation, $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15). Considering that Model 3 is not considered and the calculation assumes amorphous Si, it can be said that values close to that of the ratio between ion species used for actual irradiation ($H^+:H_2^+:H_3^+$ is approximately 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as illustrated in FIG. 25. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that in this specification, a method is described in which an ion doping apparatus that is capable of irradiation with the hydrogen ion species as illustrated in FIG. 25 is used in order to efficiently perform irradiation with $H_3^+$. Ion doping apparatuses are inexpensive and excellent for use in large-area treatment. Therefore, by irradiation with $H_3^+$ with the use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

As a gas which generates an ion species for generating ions, deuterium or an inert gas such as helium as well as hydrogen can be selected. With the use of helium for a material gas and an ion doping apparatus without a function of separation by mass, an ion beam in which a rate of a $He^+$ ion is high can be obtained. With irradiation of the semiconductor substrate 108 with such ions, minute voids can be formed and the separation layer 110 which is similar to the above can be provided in the semiconductor substrate 108.

Figure 2C:
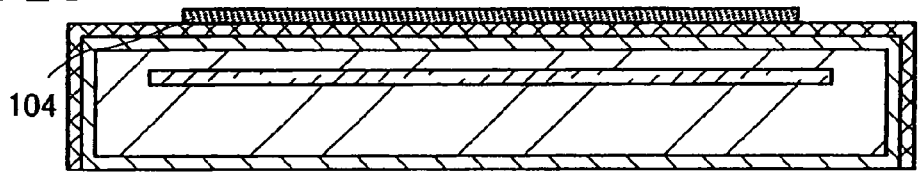

FIG. 2C illustrates a phase in which an insulating layer having a bonding surface (a bonding layer) 104 is formed. In this embodiment mode, the insulating layer 104 is formed in almost the same region as the separation layer 110, preferably in a small region more in inside than the separation layer 110. A new mask may be formed in order to selectively form the insulating layer 104. Alternatively, the masks 123a and 123b may be used.

It is preferable to form a silicon oxide film as the insulating layer 104. The thickness of the silicon oxide film is 10 to 200 nm, preferably 10 to 100 nm, and more preferably 20 to 50 nm. A silicon oxide film which is formed by a chemical vapor deposition method with the use of an organic silane gas is preferable as the silicon oxide film. As the organic silane gas, a compound containing silicon, such as the following can be used: tetraethoxysilane (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); or trisdimethylaminosilane (chemical formula: $SiH(N(CH_3)_2)_3$). Alternatively, a silicon oxide film which is formed by a chemical vapor deposition method with the use of a silane gas can be applied. In forming the silicon oxide film by a chemical vapor deposition method, a film formation temperature of, for example, less than or equal to 350° C. is applied as a temperature at which degasification does not occur from the separation layer 110 which is formed in the semiconductor substrate. In addition, at heat treatment in which a single-crystal semiconductor layer is separated from a single-crystal semiconductor substrate or a polycrystalline semiconductor substrate, a heat treatment temperature which is higher than the film formation temperature is applied.

In addition, in the steps of FIGS. 2B and 2C, the blocking layer 109 and the insulating layer 104 may be formed after the separation layer 110 is formed. According to these steps, the blocking layer 109 and the insulating layer 104 can be formed successively without being exposed to an atmosphere and thus mixture of foreign matter and contamination of potassium, sodium, or the like can be prevented. Similarly to the insulating layer 104, the blocking layer 109 may be formed selectively in accordance with the separation layer 110.

Figure 2D:
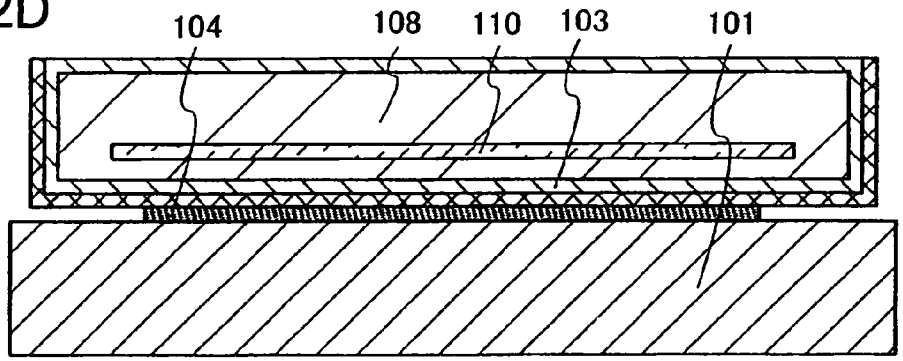

FIG. 2D illustrates a phase in which a support substrate 101 and the semiconductor substrate 108 are bonded. The support substrate 101 has insulating properties or an insulating surface, and glass substrates which are used in the electronics industry (also referred to as a "non-alkaline glass substrate"), such as aluminosilicate glass substrates, aluminoborosilicate glass substrates, and barium borosilicate glass substrates, can be applied. That is, a glass substrate, a thermal expansion coefficient of which is $25\times10$ to $50\times10^{-7}$/° C. (preferably $30\times10$ to $40\times10^{-7}$/° C.) and a strain point of which is 580 to 680° C. (preferably 600 to 800° C.), can be applied.

The support substrate 101 and a surface of the semiconductor substrate 108, on which the insulating layer 104 is formed, are made to face each other and are disposed in close contact with each other to form a bond. The surface where the bond is formed is cleaned sufficiently. Then, the bond is formed by disposing the support substrate 101 and the insulating layer 104 in close contact with each other. It is considered that Van der Waals forces act in an initial phase of the bond, and a firm bond can be formed by a hydrogen bond which is obtained by pressing the support substrate 101 and the semiconductor substrate 108 against each other.

In order to form a favorable bond, the insulating layer 104 and a surface of the support substrate 101 may be activated. For example, the surface which is to form a bond is irradiated with an atomic beam or an ion beam. When an atomic beam or an ion beam is utilized, an inert gas neutral atom beam or inert gas ion beam of argon or the like can be used. Alternatively, plasma irradiation or radical treatment is performed. Such surface treatment makes it possible to increase bonding strength between different kinds of materials even in a case of a temperature of 200 to 400° C.

Figure 2E:
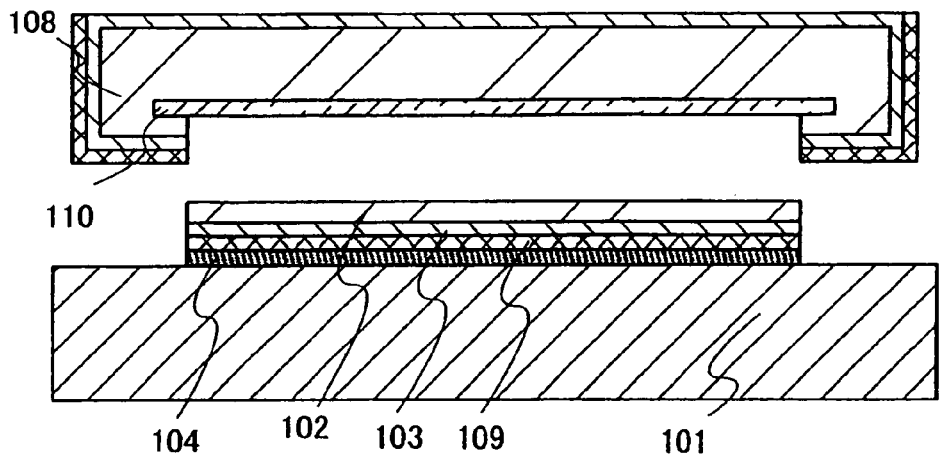

FIG. 2E illustrates a phase in which a single-crystal semiconductor layer 102 is separated from the semiconductor substrate 108. Heat treatment is performed with the semiconductor substrate 108 and the support substrate 101 being overlapped with each other. The semiconductor substrate 108 is separated by heat treatment with the single-crystal semiconductor layer 102 left over the support substrate 101. Heat treatment is preferably performed at a temperature of greater than or equal to a film formation temperature, preferably a temperature of greater than or equal to 400° C. and less than or equal to 600° C. Heat treatment is performed in this temperature range, so that the minute voids which are formed in the separation layer 110 vary in volume and the semiconductor layer can be separated along the separation layer 110. Since the insulating layer 104 is bonded to the support substrate 101, the single-crystal semiconductor layer 102 having the same crystallinity as the semiconductor substrate 108 is bonded over the support substrate 101.

The single-crystal semiconductor layer 102 is formed by separating a formation region of the insulating layer 104 in the semiconductor substrate 108. In this embodiment mode, since the insulating layer 104 is selectively formed more in inside than the separation layer 110, the edge portions of the single-crystal semiconductor layer 102 which is bonded over the support substrate 101 by being separated are exposed and are not covered with the oxide film 103 and the blocking layer 109.

Next, a step of integrating the plurality of single-crystal semiconductor layers 102, which are provided over the support substrate 101 through the above steps, as a continuous film is described with reference to FIGS. 1A to 1C.

FIG. 1A illustrates an example in which single-crystal semiconductor layers 102a and 102b are provided over the support substrate 101 from the semiconductor substrate 108 in the above steps. The single-crystal semiconductor layers 102a and 102b may be separated from the semiconductor substrate 108 which is the same base or each may be separated from a different semiconductor substrate. The single-crystal semiconductor layers 102a and 102b are bonded to each other through similar steps to FIG. 2E: a stacked layer of an insulating layer 104a, a blocking layer 109a, an oxide film 103a, and a single-crystal semiconductor layer 102a, and a stacked layer of an insulating layer. 104b, a blocking layer 109b, an oxide film 103b, and a single-crystal semiconductor layer 102b are provided adjacent to each other with a certain distance d therebetween.

In this embodiment mode, a glass substrate having an insulating surface is used as the support substrate 101. The glass substrate shrinks by heat and the shape thereof is deformed. There is a concern that a failure such as peeling or warpage of the single-crystal semiconductor layers may occur due to shrink of this glass substrate. However, in the present invention, the single-crystal semiconductor layers are provided with the certain distance d therebetween and the support substrate which is a glass substrate is shrank by heat treatment, whereby the distance d is made to disappear and thus the single-crystal semiconductor layers are made to be in contact with each other.

Figure 1B:
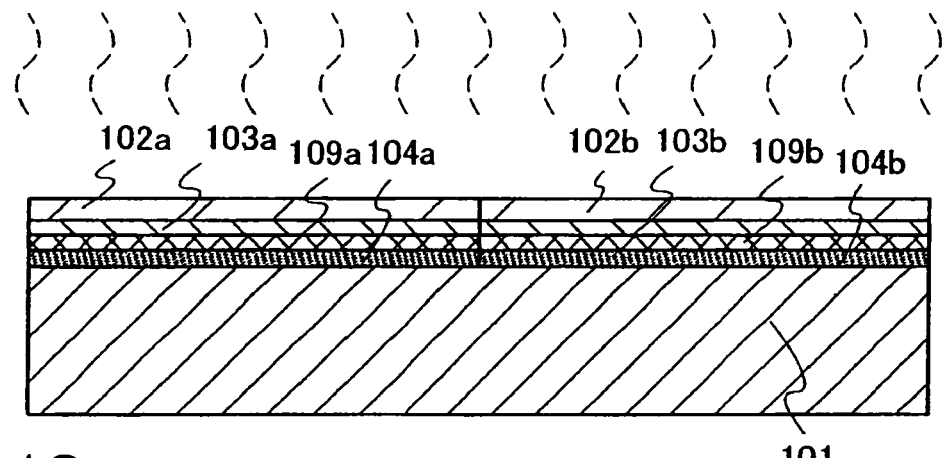

As illustrated in FIG. 1B, the support substrate 101 is subjected to heat treatment. The support substrate 101 shrinks by heat treatment and the distance d between the single-crystal semiconductor layers 102a and 102b is reduced, and consequently the single-crystal semiconductor layers 102a and 102b are in contact with each other.

A condition of heat treatment which is performed on the support substrate and the distance of the plurality of single-crystal semiconductor layers are set so that the distance between the single-crystal semiconductor layers over the support substrate is eliminated and the single-crystal semiconductor layers are in contact with each other by heat treatment performed on the support substrate. In order to deform the support substrate so as to shrink, a heat treatment temperature is preferably greater than or equal to a strain point of a glass substrate. The distance between the single-crystal semiconductor layers depends on the size of the semiconductor substrate which is a base and the size of the support substrate. For example, the distance may be greater than or equal to 0.1 μm and less than or equal to 1 μm. This heat treatment may be performed under reduced pressure or atmospheric pressure, and as to an atmosphere, the heat treatment may be performed under a nitrogen atmosphere, an oxygen atmosphere, or the like.

In addition, hydrogen or halogen which is added in forming the separation layer 110 can be removed from the single-crystal semiconductor layers 102a and 102b by this heat treatment. Minute voids in the bonding portion of the support substrate 101 and the single-crystal semiconductor layers 102a and 102b can be removed, which is preferable. A temperature at which heat treatment is performed is greater than or equal to a temperature at which hydrogen or halogen is discharged from the single-crystal semiconductor layers 102a and 102b, and a temperature less than approximate to a strain point of the support substrate 101 is accepted. For example, the heat treatment is performed in a temperature range of 400 to 730° C. As a heat treatment apparatus, an electrically-heated oven, a lamp annealing furnace, or the like can be applied. The heat treatment may be performed by changing temperature through multiple steps. Alternatively, a rapid thermal annealing (RTA) apparatus may be used. In the case of performing heat treatment by an RTA apparatus, the support substrate 101 can also be heated at a temperature approximate to or slightly higher than the strain point of the support substrate 101.

There is the case where excessive hydrogen contained in the single-crystal semiconductor layers 102a and 102b indicates a complicate behavior and acts to deteriorate characteristics of a semiconductor element depending on thermal history. For example, hydrogen contained between lattices of silicon acts to inactivate an impurity element which is doped in order to control value electrons. Accordingly, a threshold voltage of a transistor varies and thus a source or drain region is made to have high resistance. When hydrogen is contained in lattices of silicon, the coordination number of silicon varies and behaves so as to generate lattice defects. Needless to say, hydrogen or halogen has an operation of compensating a dangling bond in silicon, that is, repairing the defects. However, hydrogen or halogen which is added to form the separation layer 110 is preferably once removed from the single-crystal semiconductor layers 102a and 102b.

In a bonding surface of the support substrate 101 and the single-crystal semiconductor layers 102a and 102b, a hydrogen bond can be changed to a firmer covalent bond by performing such heat treatment.

Energy beam irradiation is performed with the plurality of single-crystal semiconductor layers being in contact with each other, the plurality of single-crystal semiconductor layers are integrated, and thus a continuous single-crystal semiconductor layer is formed. In this embodiment mode, laser light is used as an energy beam.

As the energy beam, an energy beam selectively absorbed by the single-crystal semiconductor layers 102a and 102b is preferable, and laser light (also referred to as a laser beam) is preferably applied. This is to repair defects of the single-crystal semiconductor layers 102a and 102b without the support substrate 101 being heated excessively. As the laser light, a gas laser typified by an excimer laser or a solid state laser typified by a YAG laser can be used as a light source. A wavelength of the laser beam is preferably in a range of from that of ultraviolet light to that of visible light, and a wavelength of 190 to 700 nm is applied. The laser light emitted from the light source is preferably converged in a rectangular or linear shape, and the treatment may be performed by the single-crystal semiconductor layers 102a and 102b being scanned with the laser beam.

In the case of using laser irradiation, a continuous-wave laser beam (a CW laser beam) or a pulsed laser beam can be used. Laser beams that can be used here are beams emitted from one or more kinds of the following lasers: a gas laser such as an Ar laser, a Kr laser, or an excimer laser; a laser using, as a medium, single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta is added as a dopant; a glass laser; a ruby laser; an alexandrite laser; a Ti:sapphire laser; a copper vapor laser; or a gold vapor laser. Crystals having a large grain diameter can be obtained by irradiation with the fundamental wave of the above laser beam or the second harmonic to the fourth harmonic of the fundamental wave thereof. For example, the second harmonic (532 nm) or the third harmonic (355 nm) of a Nd:YVO$_4$ laser (the fundamental wave: 1064 nm) can be used. This laser can emit either a CW laser beam or a pulsed laser beam. In the case where a CW laser beam is emitted, the power density of the laser needs to be approximately 0.01 to 100 MW/cm$^2$ (preferably 0.1 to 10 MW/cm$^2$). The scan rate is set to approximately 10 to 2000 cm/sec for irradiation.

Note that the laser using, as a medium, single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant; an Ar ion laser; or a Ti:sapphire laser can perform continuous oscillation. In addition, it can also perform pulsed oscillation at a repetition rate of greater than or equal to 10 MHz by performing Q-switching operation, mode locking, or the like. A pulsed laser, which can emit a laser beam with a pulse width in a range of picoseconds or in a range of femtoseconds ($10^{-15}$ seconds), may be used.

Alternatively, flash lamp annealing which is performed using a halogen lamp, a xenon lamp, or the like may be applied for a similar object.

Further, light emitted from an ultraviolet lamp, a black light, a metal halide lamp, a carbon arc lamp, a high pressure sodium lamp, or a high pressure mercury lamp may be used. In that case, a lamp light source may be lighted for a necessary period or multiple times for irradiation.

Figure 1C:
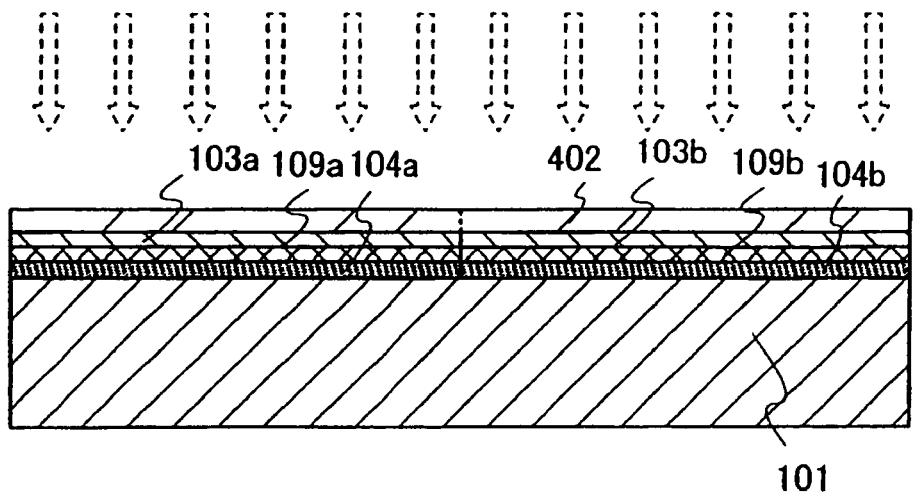

FIG. 1C illustrates an example in which the single-crystal semiconductor layers 102a and 102b are irradiated with laser light, with the single-crystal semiconductor layers 102a and 102b being in contact with each other; the single-crystal semiconductor layers 102a and 102b are integrated; and a continuous single-crystal semiconductor layer 402 is formed. The single-crystal semiconductor layers 102a and 102b are integrated by the bond generated by the energy beam in a surface where the edge portions are in contact with each other. In this manner, the single-crystal semiconductor layers 102a and 102b are integrated and thus a single-crystal semiconductor layer 402 that has a large area can be formed.

Further, crystal defects can be repaired by energy beam irradiation. This step is preferably performed in achieving the repair because the single-crystal semiconductor layers 102a and 102b have thermal and/or mechanical damage which results in deterioration in crystallinity when the single-crystal semiconductor layers 102a and 102b are bonded to the support substrate 101.

In FIG. 1C, the single-crystal semiconductor layers 102a and 102b are dehydrogenated in this step; therefore, crystal defects can be repaired without causing a void in the single-crystal semiconductor layers 102a and 102b. In addition, when treatment of irradiating the single-crystal semiconductor layers 102a and 102b with an energy laser beam is performed in a nitrogen atmosphere, the surface of the single-crystal semiconductor layers 102a and 102b can be planarized.

Next, another method for manufacturing a single-crystal semiconductor layer over a support substrate as in FIG. 1A is described with reference to FIGS. 3A to 3D.

Figure 3A:
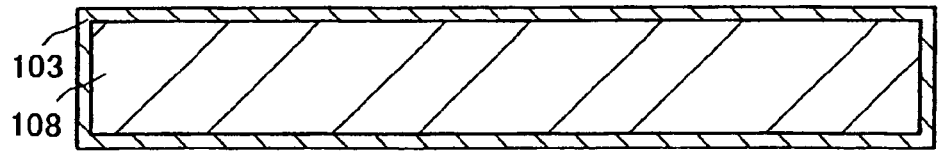
FIGS. 3A to 3D are cross-sectional views illustrating a method for manufacturing an SOI substrate of the present invention.
Figure 3B:
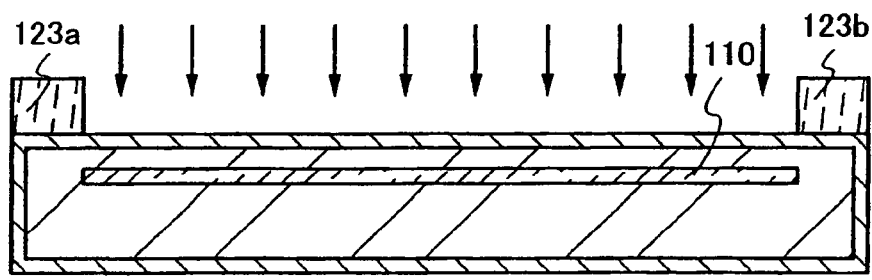

As illustrated in FIG. 3A, an oxide film 103 is formed over a semiconductor substrate 108. The oxide film 103 is preferably formed at a temperature of greater than or equal to 700° C., preferably at a temperature of 950 to 1100° C., to perform thermal oxidation in an atmosphere containing HCl at 0.5 to 10 volume % (preferably 3 volume %) with respect to oxygen. As illustrated in FIG. 3B, a separation layer 110 is selectively formed in the semiconductor substrate with the use of the mask layers 123a and 123b.

Figure 3C:
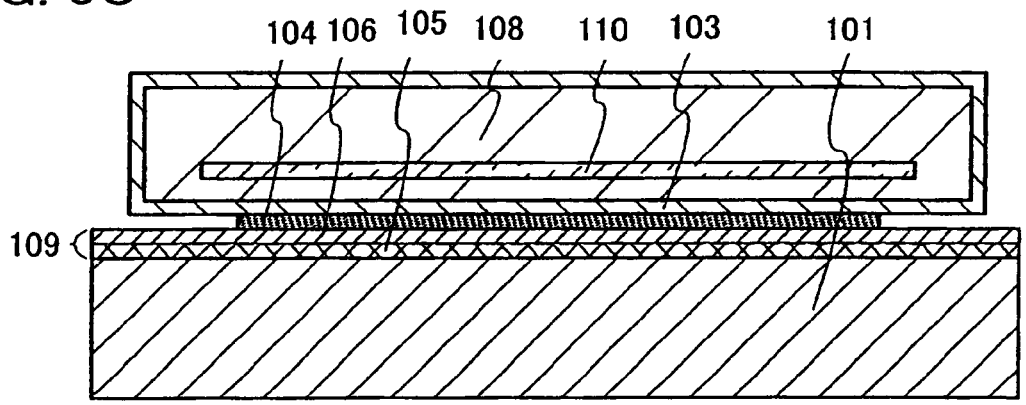

In FIG. 3C, a blocking layer 109 is provided over a support substrate 101. The blocking layer 109 can be formed of a silicon nitride oxide film 105 and a silicon oxynitride film 106, for example. The silicon nitride oxide film 105 has an effect of preventing a metal impurity which is contained in the support substrate 101 from diffusing to a single-crystal semiconductor layer 102 side. The silicon oxynitride film 106 has an operation of relieving the internal stress of the silicon nitride oxide film 105. The stress distortion of the single-crystal semiconductor layer 102 can be relieved while impurity contamination thereof can be prevented by providing such a combined blocking layer 109.

An insulating layer 104 is selectively provided over the blocking layer 109, similarly to FIG. 2C. This insulating layer 104 is a layer having a planar surface and a hydrophilic surface. An insulating layer which is formed by chemical reaction is preferable as an insulating layer that can be formed on such a surface. The insulating layer 104 which has a planar surface and forms a hydrophilic surface is provided with a thickness of 0.2 to 500 nm. With such a thickness, it is possible to smooth roughness of a surface on which a film is to be formed and also to ensure smoothness of a growing surface of the film. As the insulating layer 104, a silicon oxide film is preferably formed. The thickness of the silicon oxide film is 10 to 200 nm, preferably 10 to 100 nm, and more preferably 20 to 50 nm. A silicon oxide film which is formed by a chemical vapor deposition method with the use of an organic silane gas is preferable as the silicon oxide film.

The support substrate 101, over which such a blocking layer 109 and an insulating layer 104 are formed, and the semiconductor substrate 108, over which the oxide film 103 is formed, are disposed in close contact and bonded to each other. In this case, the bond is formed by bonding the oxide film 103 and the insulating layer 104. When the insulating layer 104 over the support substrate 101 and the oxide film 103 over the semiconductor substrate 108 are made to face each other to press one part from external, the oxide film 103 and the insulating layer 104 are pulled with each other by increase in strength of Van der Waals forces which is resulted from locally shortening of a distance between the bonded surfaces and contribution of a hydrogen bond. Further, the distance between the insulating layer 104 over the support substrate 101 and the oxide film 103 over the semiconductor substrate 108, which face each other, shortens even in a neighboring region. Therefore, a region where Van der Waals forces act strongly and a region where a hydrogen bond contributes expand, so that bonding is advanced and the bond is spread in the entire region of the bonded surface.

Figure 3D:
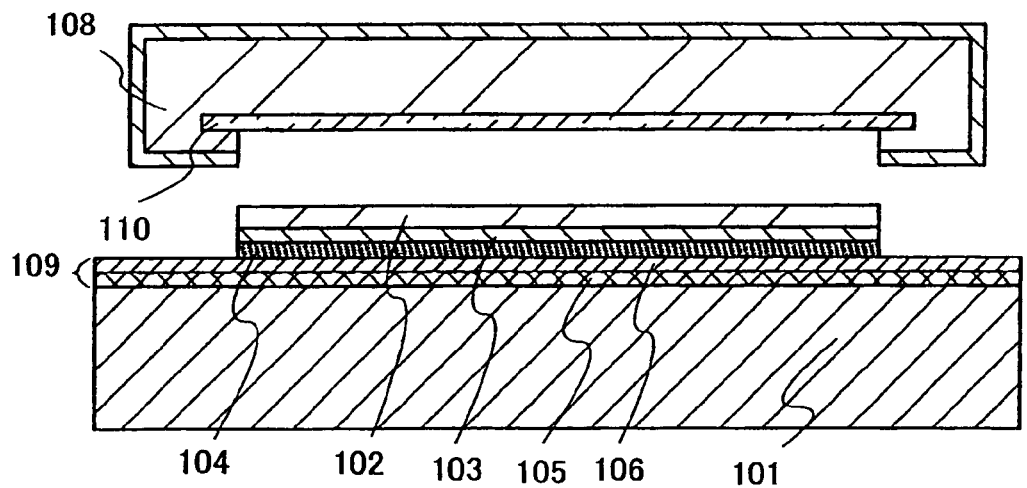

FIG. 3D illustrates a phase in which the single-crystal semiconductor layer 102 is separated from the semiconductor substrate 108. Heat treatment is performed with the semiconductor substrate 108 and the support substrate 101 being overlapped with each other. The semiconductor substrate 108 is separated by heat treatment with the single-crystal semiconductor layer 102 left over the support substrate 101. Heat treatment is preferably performed at a temperature of greater than or equal to a film formation temperature, preferably a temperature of greater than or equal to 400° C. and less than or equal to 600° C. However, heat treatment is performed at a temperature at which the support substrate 101 does no shrink. This is because, if the support substrate 101 shrinks, it will be difficult to integrate the single-crystal semiconductor layers in subsequent steps. Heat treatment is performed in this temperature range, so that the minute voids which are formed in the separation layer 110 vary in volume and the semiconductor layer can be separated along the separation layer 110. Since the insulating layer 104 is bonded to the support substrate 110, the single-crystal semiconductor layer 102 having the same crystallinity as the semiconductor substrate 108 is bonded over the support substrate 101.

As to the single-crystal semiconductor layer 102 over the support substrate which is formed as in FIG. 3D, the plurality of single-crystal semiconductor layers are bonded by shrink of the glass substrate due to heat treatment, so that the single-crystal semiconductor layers can be integrated by irradiation treatment with an energy beam, as illustrated in FIGS. 1A to 1C. Thus, a large-area single-crystal semiconductor layer can be formed over the support substrate 101.

According to this embodiment mode, even in the case of the support substrate 101, an allowable temperature limit of which is less than or equal to 700° C., such as a glass substrate, the single-crystal semiconductor layer 102, a bonding portion of which has strong adhesion, can be obtained. Various glass substrates used in the electronics industry, which are referred to as non-alkaline glass substrates, such as aluminosilicate glass substrates, aluminoborosilicate glass substrates, and barium borosilicate glass substrates, can be applied. That is, a single-crystal semiconductor layer can be formed over a substrate that is longer than one meter on each side. With the use of such a large-area substrate, not only a display device such as a liquid crystal display but also a semiconductor integrated circuit can be manufactured. In addition, as to the semiconductor substrate, thermal oxidation is performed in an atmosphere containing halogen in an initial phase of the steps, so that a gettering effect can be obtained, which is effective in reutilizing the semiconductor substrate.

Shrink of a glass substrate due to heat treatment is utilized so that a distance between single-crystal semiconductor layers, which are provided in advance, is made to disappear. Therefore, warpage of the glass substrate and the single-crystal semiconductor layers and peeling of the single-crystal semiconductor layers from the glass substrate can be prevented. Further, since the plurality of single-crystal semiconductor layers can be integrated to form a continuous film, an SOI substrate having a large-area single-crystal semiconductor layer can be manufactured.

A semiconductor substrate is subjected to heat treatment at a high temperature of greater than or equal to a strain point of the glass substrate, and the glass substrate is provided with a blocking layer at a temperature less than or equal to the strain point to bond together. Accordingly, a single-crystal semiconductor layer can be prevented from being contaminated by impurities. Further, interface state density of an interface between the single-crystal semiconductor layer and the glass substrate can be lowered. Accordingly, a semiconductor device which is sufficient for practical use can be provided.

Thus, even in a case of a large-sized semiconductor device, a semiconductor device having high performance and high reliability can be manufactured with high throughput and high productivity.

Embodiment Mode 2

This embodiment mode will describe an example in which a semiconductor device is manufactured using a single-crystal semiconductor layer which is formed of the single-crystal semiconductor layer where the plurality of single-crystal semiconductor layers formed over the support substrate, which is manufactured in Embodiment Mode 1, are integrated. Specifically, a liquid crystal display device in which a liquid crystal display element is used for a display element will be described. Note that repetitive description of the same portions and portions having the same function as Embodiment Mode 1 will be omitted.

Figure 16A:
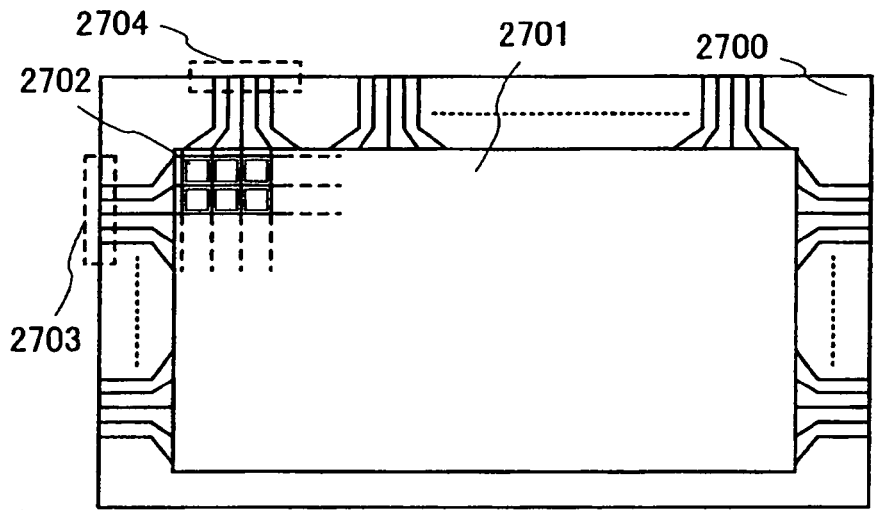
FIGS. 16A to 16C are plan views each illustrating a semiconductor device of the present invention.

FIG. 16A is a top view illustrating a structure of a display panel according to the present invention. A pixel portion 2701 in which pixels 2702 are arranged in matrix, a scan line input terminal 2703, and a signal line input terminal 2704 are formed over a substrate 2700 having an insulating surface. The number of pixels may be set in accordance with various standards. In the case of XGA, the number of pixels is 1024×768×3 (RGB). In the case of UXGA, the number of pixels is 1600×1200×3 (RGB), and in the case of full-spec high-definition display, it is 1920×1080×3 (RGB).

The pixels 2702 are arranged in matrix by being provided at intersections of scan lines extended from the scan line input terminal 2703 and signal lines extended from the signal line input terminal 2704. Each pixel 2702 includes a switching element and a pixel electrode layer connected thereto. A typical example of a switching element is a TFT. A TFT has a gate electrode side connected to the scan line and a source or drain side connected to the signal line, so that each pixel can be controlled independently by a signal inputted from external.

The main components of a TFT include a semiconductor layer, a gate insulating layer, and a gate electrode layer. In addition, the TFT also includes wiring layers connected to source and drain regions formed in the semiconductor layer. As typical structures of such a TFT, the following are known: a top-gate TFT in which a semiconductor layer, a gate insulating layer, and a gate electrode layer are sequentially stacked over a substrate, and a bottom-gate TFT in which a gate electrode layer, a gate insulating layer, and an LPSS layer are sequentially stacked over a substrate. Either of such structures can be applied to the present invention.

Although FIG. 16A illustrates a structure of a display panel in which signals inputted to the scan line and the signal line are controlled by an external driver circuit, a driver IC may be mounted on the substrate by a chip on glass (COG) method. Alternatively, a tape automated bonding (TAB) method may be employed as another mode.

Figure 16B:
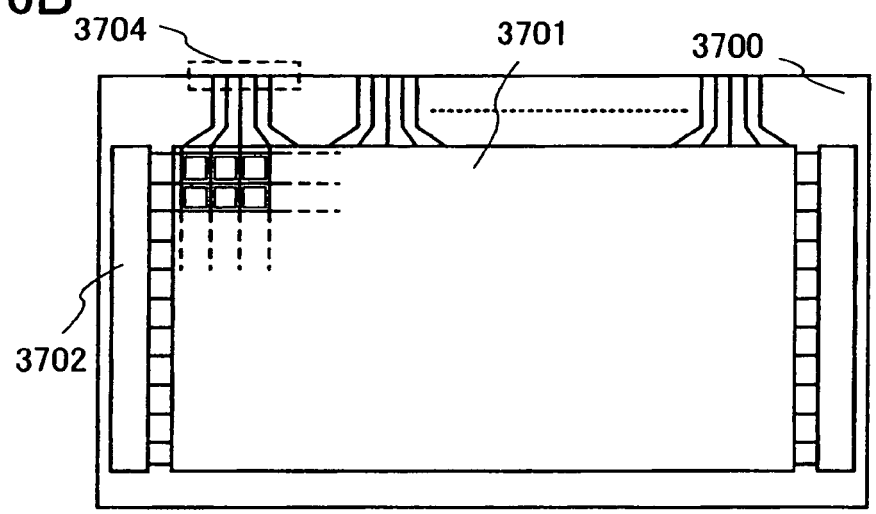
Figure 16C:
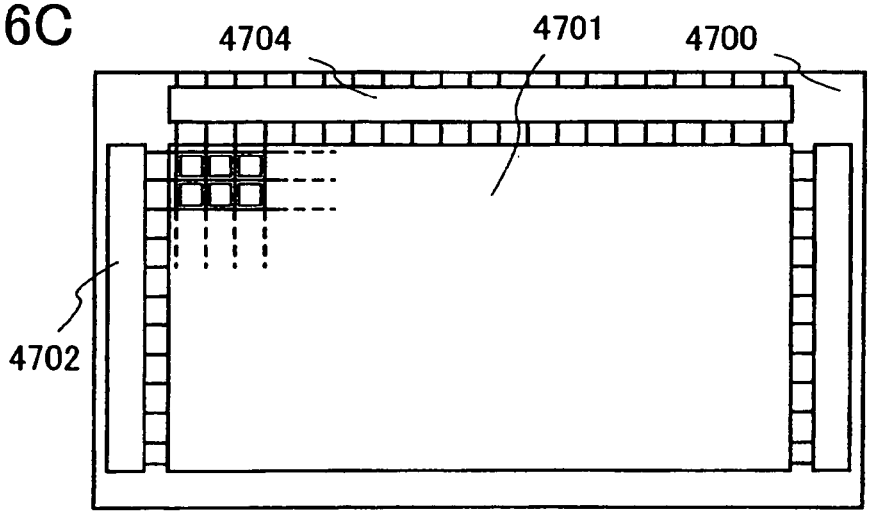

In addition, a scan line driver circuit 3702 can be formed over a substrate 3700 as illustrated in FIG. 16B. In FIG. 16B, a pixel portion 3701 is controlled by an external driver circuit similarly to FIG. 16A in which the pixel portion 3701 is connected to a signal line driver circuit 3704. In FIG. 16C, a pixel portion 4701, a scan line driver circuit 4702, and a signal line driver circuit 4704 can be integrated over a substrate 4700.

As shown in Embodiment Mode 1, a blocking layer 109, an insulating layer 104, and an oxide film 103 are provided over a support substrate 101 which is a glass substrate to form a single-crystal semiconductor layer 402 (see FIG. 4A).

Figure 15A:
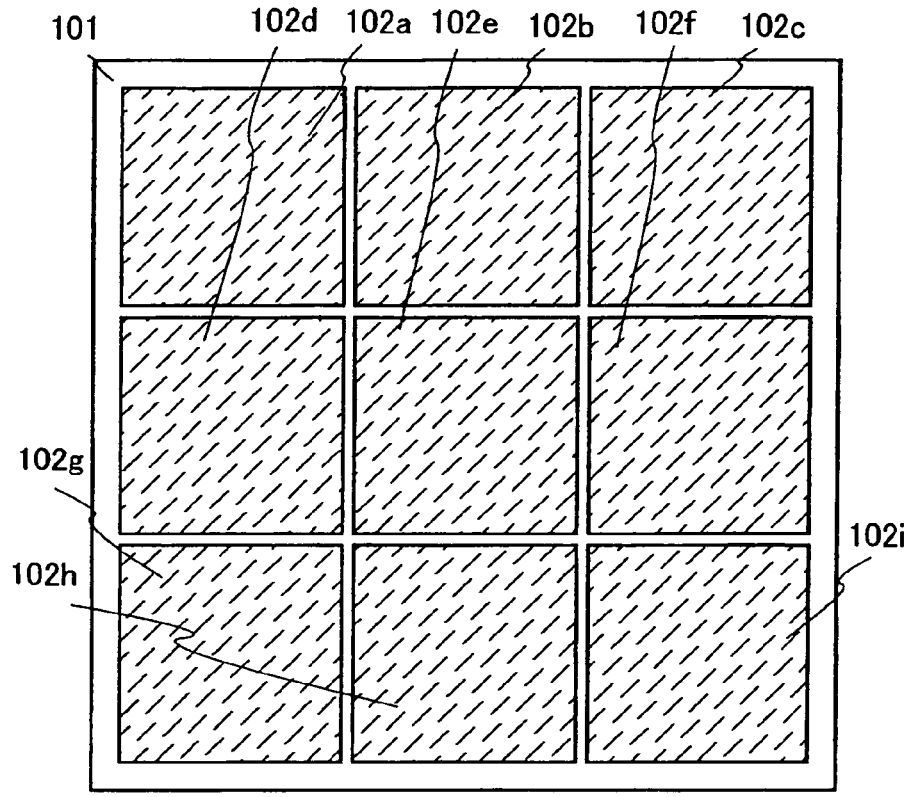
FIGS. 15A and 15B are views each illustrating a method for manufacturing a semiconductor device of the present invention.
Figure 15B:
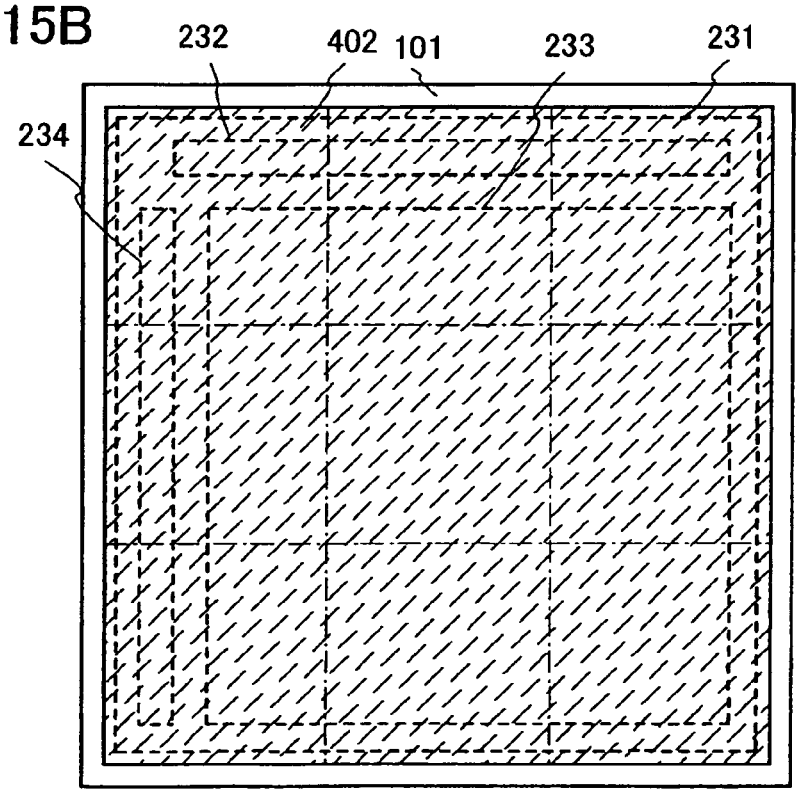

With the use of the present invention, the single-crystal semiconductor layer can be formed as a continuous film over a large-sized glass substrate which is referred to as a mother glass substrate with which a display panel is manufactured. First, as with Embodiment Mode 1, a plurality of single-crystal semiconductor layers 102 (102a, 102b, 102c, 102d, 102e, 102f, 102g, 102h, and 102i) are bonded with certain distances over a mother glass substrate as the support substrate 101 which is a glass substrate (see FIG. 15A). Next, each distance between any two single-crystal semiconductor layers of the single-crystal semiconductor layers 102 (102a, 102b, 102c, 102d, 102e, 102f, 102g, 102h, and 102i) is shortened by heating the support substrate 101, which is a glass substrate, to shrink, and thus the single-crystal semiconductor layers 102 (102a, 102b, 102c, 102d, 102e, 102f, 102g, 102h, and 102i) are disposed in contact with each other. Further, the single-crystal semiconductor layers 102 (102a, 102b, 102c, 102d, 102e, 102f, 102g, 102h, and 102i), which are in contact with each other, are irradiated with an energy beam to integrate the single-crystal semiconductor layers 102 (102a, 102b, 102c, 102d, 102e, 102f, 102g, 102h, and 102i) and to form the single-crystal semiconductor layer 402 (see FIG. 15B). As illustrated in FIG. 15B, a display panel 231 which is a large-sized semiconductor device can be manufactured using the large-area single-crystal semiconductor layer 402. The large-sized display panel 231 includes a scan line driver circuit region 234, a signal line driver circuit region 233, and a pixel formation region 232, and the single-crystal semiconductor layer 402 is bonded to the support substrate 101 (a mother glass substrate) so that these regions are included. Needless to say, the large-area single-crystal semiconductor layer 402 can also be cut to obtain a plurality of display panels.

A p-type impurity such as boron, aluminum, or gallium is added to the single-crystal semiconductor layer 402 in order to control the threshold voltage. For example, as a p-type impurity, boron may be added at a concentration of greater than or equal to $5\times10^{17}$ cm$^{-3}$ and less than or equal to $1\times10^{18}$ cm$^{-3}$. A silicon nitride layer and a silicon oxide layer are stacked over the support substrate 101 as the blocking layer 109. Providing the blocking layer over the support substrate 101 can prevent contamination of the single-crystal semiconductor layer 402. Note that a silicon nitride oxide layer, an aluminum nitride layer, or an aluminum nitride oxide layer may be applied as an alternative to a silicon nitride layer.

The single-crystal semiconductor layer 402 is etched to form single-crystal semiconductor layers 183, 184, and 185 which are separated in island shapes in accordance with arrangement of semiconductor elements. Etching may be performed using a mask by photolithography or the like.

Etching treatment may be performed either by plasma etching (dry etching) or by wet etching. Plasma etching is more suitable for processing a large-area substrate. As an etching gas, a fluorine or chlorine source gas such as $CF_4$, $NF_3$, $Cl_2$, or $BCl_3$ may be used, and an inert gas such as He or Ar may also be added into the etching gas as appropriate. Further, when etching treatment is performed by atmospheric discharge plasma, local discharge processing becomes possible; therefore, there is no need to form a mask layer over the entire surface of the substrate.

In the present invention, conductive layers for forming wiring layers or electrode layers and mask layers for forming predetermined patterns may also be formed by a method whereby patterns can be selectively formed like a droplet discharge method. A droplet discharge (ejection) method (which is also called an ink-jet method depending on methods) is a method capable forming a predetermined pattern (e.g., a conductive layer or an insulating layer) by selectively discharging (ejecting) droplets of a composition that has been premixed for a specific purpose. In this case, treatment for controlling the wettability or adhesiveness may be applied to a region in which the object layer is formed. In addition, another method whereby patterns can be transferred or drawn can be used. For example, a printing method (e.g., a pattern formation method such as screen printing or offset printing) or the like can also be used.

A mask used in this embodiment mode is formed with a resin material such as an epoxy rein, an acrylic rein, a phenol resin, a novolac resin, a melamine resin, or a urethane resin. Further, it is also possible to use an organic material such as benzocyclobutene, parylene, fluorinated arylene ether, or polyimide; a compound material formed by polymerization of siloxane polymers; and the like. Alternatively, a positive resist or a negative resist may be used. In using any of the above-described materials in using a droplet discharge method, the surface tension and viscosity of the materials are controlled as appropriate by adjusting the concentration of a solvent or by adding a surfactant or the like.

A gate insulating layer 107 which covers the semiconductor layers 183, 184, and 185 is formed. The gate insulating layer 107 is formed by depositing an insulating film containing silicon to a thickness of 10 to 150 nm by a plasma CVD method, a sputtering method, or the like. It is acceptable as long as the gate insulating layer 107 is formed with a material such as a silicon oxide material or a silicon nitride material typified by silicon nitride, silicon oxide, silicon oxynitride, or silicon nitride oxide. Further, the gate insulating layer 107 may be formed to have either a stacked-layer structure or a single-layer structure. Alternatively, the gate insulating layer 107 may be formed to have a three-layer structure of a silicon nitride film, a silicon oxide film, and a silicon nitride film, a single layer of a silicon oxynitride, or a two-layer structure of the above-described materials. Preferably, a silicon nitride film having a dense film quality may be used. Further, a thin silicon oxide film with a thickness of 1 to 100 nm, preferably 1 to 10 nm, or more preferably 2 to 5 nm may be formed between the semiconductor layers and the gate insulating layer. Such a thin silicon oxide film can be formed by oxidizing the surface of a semiconductor region by a GRTA method, a LRTA method, or the like to form a thermally oxidized film. Note that in order to form a dense insulating film with little gate leakage current at a low deposition temperature, it is preferable to mix a rare gas element such as argon into a reactive gas so that the rare gas element is mixed into the insulating film to be formed.

Next, a first conductive film with a thickness of 20 to 100 nm and a second conductive film with a thickness of 100 to 400 nm are stacked as gate electrode layers over the gate insulating layer 107. The first conductive film and the second conductive film can be formed by a sputtering method, an evaporation method, a CVD method, or the like. The first conductive film and the second conductive film may be formed using an element selected from among tantalum (Ta), tungsten (W), titanium (Ti), molybdenum (Mo), aluminum (Al), copper (Cu), chromium (Cr), or neodymium (Nd), or an alloy material or a compound material containing such an element as its main component. Alternatively, the first conductive film and the second conductive film may be formed using a semiconductor film typified by a polycrystalline silicon film doped with an impurity element such as phosphorus or an AgPdCu alloy. Further, the structure of the first conductive film and the second conductive film is not limited to a two-layer structure, but a three-layer structure may also be employed, for example, such that a tungsten film with a thickness of 50 nm, an aluminum-silicon (Al—Si) alloy film with a thickness of 500 nm, and a titanium nitride film with a thickness of 30 nm are sequentially stacked as the first to third conductive films. Further, when employing a three-layer structure, the tungsten film used for the first conductive film may be replaced with a tungsten nitride film, the aluminum-silicon (Al—Si) alloy film used for the second conductive film may be replaced with an aluminum-titanium (Al—Ti) alloy film, and the titanium nitride film used for the third conductive film may be replaced with a titanium film. Furthermore, a single-layer structure may also be used.

Next, resist masks 110a, 110b, 110d, 110e, and 110f are formed by a photolithography method, and the first conductive film and the second conductive film are processed into desired shapes. As a result, first gate electrode layers 120, 122, 124, and 125, a first conductive layer 126, and conductive layers 111, 112, 114, 115, and 116 are formed (see FIG. 4C). Then, the first gate electrode layers 120, 122, 124, 125, and 126 and the conductive layers 111, 112, 114, 115, and 116 can be etched into desired tapered shapes by an inductively coupled plasma (ICP) etching method with appropriate control of the etching conditions (e.g., the amount of electric energy applied to a coiled electrode layer, the amount of electric energy applied to an electrode layer on the substrate side, and the electrode temperature on the substrate side). In addition, angles and the like of the tapered shapes may also be controlled by the shapes of the masks 110a, 110b, 110d, 110e, and 110f. Note that an etching gas can be selected as appropriate from a chlorine source gas typified by $Cl_2$, $BCl_3$, $SiCl_4$, or $CCl_4$; a fluorine source gas typified by $CF_4$, $SF_6$, or $NF_3$; and $O_2$. In this embodiment mode, the second conductive film is etched with an etching gas containing $CF_4$, $Cl_2$, $O_2$, and the like, and the first conductive film is successively etched with an etching gas containing $CF_4$ and $Cl_2$.

Next, the conductive layers 111, 112, 114, 115, and 116 are processed into desired shapes by using the masks 110a, 110b, 110d, 110e, and 110f, respectively. At this time, the conductive layers are etched under the condition of high etching selectivity (a high ratio of the etching rate of the second conductive film for forming the conductive layers to the etching rate of the first conductive film for forming the first gate electrode layers). By this etching, the conductive layers 111, 112, 114, 115, and 116 are etched, whereby second gate electrode layers 131, 132, 134, and 135 and a second conductive layer 136 are formed. In this embodiment mode, the second gate electrode layers and the second conductive layer are also tapered. Taper angles of the second gate electrode layers and the conductive layers are larger than those of the first gate electrode layers 120, 122, 124, 125, and 126. Note that a taper angle means an angle of the side surface with respect to each surface of the first gate electrode layer, the second gate electrode layer, the first conductive layer, and the second conductive layer. Accordingly, when the taper angle is set large, e.g., 90 degrees, the conductive layer has a perpendicular side surface. In this embodiment mode, $Cl_2$, $SF_6$, and $O_2$ are used as the etching gas for formation of the second gate electrode layers and the second conductive layer.

In this embodiment mode, each of the first gate electrode layers, the conductive layers, and the second gate electrode layers is formed to be tapered; therefore, both of the two gate electrode layers are tapered. However, the present invention is not limited thereto. For example, one of the gate electrode layers may be tapered while the other gate electrode layer may have a perpendicular side surface by anisotropic etching. In addition, the taper angle of each stacked gate electrode layer may be either the same or different from one another as in this embodiment mode. When each gate electrode layer is tapered, the gate electrode layer can be tightly covered with a film stacked thereover. Therefore, defects can be reduced and thus reliability can be improved.

Through the above-described steps, a gate electrode layer 117 having the first gate electrode layer 120 and the second gate electrode layer 131, and a gate electrode layer 118 having the first gate electrode layer 122 and the second gate electrode layer 132 can be formed in a peripheral driver circuit region 204; and a gate electrode layer 127 having the first gate electrode layer 124 and the second gate electrode layer 134, a gate electrode layer 128 having the first gate electrode layer 125 and the second gate electrode layer 135, and a conductive layer 129 having the first conductive layer 126 and the second conductive layer 136 can be formed in the pixel region 206 (see FIG. 4D). Although dry etching is performed for the formation of the gate electrode layers in this embodiment mode, wet etching may also be used.

The gate insulating layer 107 may be slightly etched by the etching step for formation of the gate electrode layers. In that case, the gate insulating layer 107 has a reduced thickness.

When the gate electrode layers are formed to have narrow width, thin film transistors capable of high-speed operation can be formed. Two methods of forming a gate electrode layer having a narrow width in the channel direction is described below.

The first method includes the steps of forming a mask of a gate electrode layer and reducing the width of the mask by etching, ashing, or the like, thereby forming a mask with a narrow width. By using a mask which has been processed into a narrow width in advance, a gate electrode layer can also be formed into a narrow width.

The second method includes the steps of forming a normal mask, forming a gate electrode layer using the mask, and reducing the width of the gate electrode layer by side etching. As a result, a gate electrode layer with a narrow width can be obtained. Through the above-described steps, a thin film transistor with a short channel length can be formed, and a thin film transistor capable of high-speed operation can also be formed.

Next, the semiconductor layers are doped with an n-type impurity element 151, using the gate electrode layers 117, 118, 127, and 128 as masks. Thus, first n-type impurity regions 140a, 140b, 141a, 141b, 142a, 142b, and 142c are formed (see FIG. 5A). In this embodiment mode, doping is performed by using phosphine ($PH_3$) as a doping gas containing an impurity element (the doping gas is obtained by diluting $PH_3$ with hydrogen ($H_2$); the percentage of $PH_3$ in the gas is 5%) under such conditions that a gas flow rate is 80 sccm, a beam current is 54 μA/cm, an acceleration voltage is 50 kV, and a dose is $7.0 \times 10^{13}$ ions/cm$^2$. Here, doping is performed such that each of the first n-type impurity regions 140a, 140b, 141a, 141b, 142a, 142b, and 142c contains the n-type impurity element at a concentration of approximately $1 \times 10^{17}$ to $5 \times 10^{18}$/cm$^3$. In this embodiment mode, phosphorus (P) is used as the n-type impurity element.

In this embodiment mode, the impurity region which overlaps with the gate electrode layer with the gate insulating layer interposed therebetween is called a Lov region, while the impurity region which does not overlap with the gate electrode layer with the gate insulating layer interposed therebetween is called a Loff region. In FIGS. 5A to 5C, the impurity regions are indicated by hatching on a white background. This does not mean that the white background portion is not added with an impurity element, but is shown so that it will be intuitively understood that the concentration distribution of the impurity element in the region reflects mask or doping conditions. Note that the same can be said for the other drawings in this specification.

Next, masks 153a to 153d which cover the single-crystal semiconductor layer 183 and part of the single-crystal semiconductor layer 185 are formed. Then, the semiconductor layers are doped with an n-type impurity element 152 by using the masks 153a to 153d and the second gate electrode layer 132 as masks. Thus, second n-type impurity regions 144a and 144b, third n-type impurity regions 145a and 145b, second n-type impurity regions 147a, 147b, and 147c, and third n-type impurity regions 148a, 148b, 148c, and 148d are formed. In this embodiment mode, doping is performed by using $PH_3$ as a doping gas containing an impurity element (the doping gas is obtained by diluting $PH_3$ with hydrogen ($H_2$); the percentage of $PH_3$ in the gas is 5%) under such conditions that a gas flow rate is 80 sccm, a beam current is 540 μA/cm, an acceleration voltage is 70 kV, and a dose is $5.0 \times 10^{15}$ ions/cm$^2$. Here, doping is performed such that each of the second n-type impurity regions 144a and 144b contains the n-type impurity element at a concentration of approximately $5 \times 10^{19}$ to $5 \times 10^{20}$/cm$^3$. The third n-type impurity regions 145a and 145b are formed so as to contain the n-type impurity element at about the same concentration as or at a slightly higher concentration than the third n-type impurity regions 148a to 148d. In addition, a channel formation region 146 is formed in the semiconductor layer 184, and channel formation regions 149a and 149b are formed in the semiconductor layer 185 (see FIG. 5B).

The second n-type impurity regions 144a, 144b, 147a, 147b, and 147c are n-type high-concentration impurity regions and each function as a source region or a drain region. On the other hand, the third n-type impurity regions 145a, 145b, 148a, 148b, 148c, and 148d are n-type low-concentration impurity regions and function as lightly doped drain (LDD) regions. The third n-type impurity regions 145a and 145b that are covered with the first gate electrode layer 122, with the gate insulating layer 107 interposed therebetween, are Lov regions, which can alleviate an electric field in the vicinity of the drain and can suppress degradation of on-state current due to hot carriers. As a result, a thin film transistor capable of high-speed operation can be formed. On the other hand, being formed in Loff regions that are not covered with the gate electrode layer 127 and the gate electrode layer 128, the third n-type impurity regions 148a, 148b, 148c, and 148d have an effect of reducing off-current. As a result, a highly reliable and low-power-consumption semiconductor device can be manufactured.

Next, the masks 153a to 153d are removed, and masks 155a and 155b which cover the single-crystal semiconductor layers 183 and 185, respectively, are formed. Then, the semiconductor layers are doped with a p-type impurity element 154 by using the masks 155a and 155b and the gate electrode layer 117 as masks, whereby first p-type impurity regions 160a and 160b and second p-type impurity regions 161a and 161b are formed. In this embodiment mode, boron (B) is used as an impurity element; therefore, doping is performed by using diborane ($B_2H_6$) as a doping gas containing an impurity element (the doping gas is obtained by diluting $B_2H_6$ with hydrogen ($H_2$); the percentage of $B_2H_6$ in the gas is 15%) under such conditions that a gas flow rate is 70 sccm, a beam current is 180 μA/cm, an acceleration voltage is 80 kV, and a dose is $2.0 \times 10^{15}$ ions/cm$^2$. Here, doping is performed such that each of the first p-type impurity regions 160a and 160b and the second p-type impurity regions 161a and 161b contains the p-type impurity element at a concentration of approximately $1 \times 10^{20}$ to $5 \times 10^{21}$/cm$^3$. In this embodiment mode, the second p-type impurity regions 161a and 161b reflect the shapes of the gate electrode layer 117, and formed in a self-aligned manner so as to contain a lower concentration of impurities than the first p-type impurity regions 160a and 160b. In addition, a channel formation region 162 is formed in the single-crystal semiconductor layer 183.

The first p-type impurity regions 160a and 160b are n-type high-concentration impurity regions and each function as a source region or a drain region. On the other hand, the second p-type impurity regions 161a and 161b are low-concentration impurity regions and function as lightly doped drain (LDD) regions. The second p-type impurity regions 161a and 161b that are covered with the first gate electrode layer 120, with the gate insulating layer 107 interposed therebetween, are Lov regions, which can alleviate an electric field in the vicinity of the drain and can suppress degradation of on-state current due to hot carriers.

Then, the masks 155a and 155b are removed by $O_2$ ashing or with a resist stripper, whereby oxide films are also removed. After that, insulating films so-called sidewalls may be formed so as to cover the side surfaces of the gate electrode layers. The sidewalls can be formed by a plasma CVD method or a low-pressure CVD (LPCVD) method by using an insulating film containing silicon.

In order to activate the impurity element, heat treatment, strong light irradiation, or laser irradiation may further be performed. In that case, the impurity element can be activated, while at the same time plasma damage to the gate insulating layer and plasma damage to the interface between the gate insulating layer and the single-crystal semiconductor layers can be recovered.

Next, an interlayer insulating layer which covers the gate electrode layers and the gate insulating layer is formed. In this embodiment mode, an insulating film 167 and an insulating film 168 are stacked (see FIG. 6A). Specifically, a stacked structure is formed by sequentially depositing a silicon nitride oxide film with a thickness of 100 nm as the insulating film 167 and depositing a silicon oxynitride film with a thickness of 900 nm as the insulating film 168. Alternatively, it is also possible to form a three-layer structure by sequentially depositing a silicon oxynitride film with a thickness of 30 nm so as to cover the gate electrode layers and the gate insulating layer, depositing a silicon nitride oxide film with a thickness of 140 nm, and depositing a silicon oxynitride film with a thickness of 800 nm. In this embodiment mode, the insulating films 167 and 168 are successively formed by a plasma CVD method similarly to the base film. Materials for forming the insulating films 167 and 168 are not limited to those described above. For example, a silicon nitride film, a silicon nitride oxide film, a silicon oxynitride film, and/or a silicon oxide film that are/is formed by a sputtering method or a plasma CVD method may also be employed. Further, it is also possible to use a single layer of another insulating film containing silicon, or a stacked structure of three or more layers of such insulating films.

As other materials for forming the insulating films 167 and 168, it is also possible to use a material selected from among aluminum nitride (AlN), aluminum oxynitride (AlON), aluminum nitride oxide (AlNO) in which the weight of nitrogen is greater than that of oxygen, aluminum oxide, diamond-like carbon (DLC), a carbon film containing nitrogen (CN), or other inorganic insulating materials. Alternatively, a siloxane resin may also be used. Note that a siloxane resin corresponds to a resin having a Si—O—Si bond. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. As a further alternative, both an organic group containing at least hydrogen and a fluoro group may be used as the substituent. Further, organic insulating materials may also be used. Examples of the organic materials include polyimide, acrylic, polyamide, polyimide amide, resist, benzocyclobutene, and polysilazane. It is also possible to use a highly flat film formed by a coating method.

Next, contact holes (openings) that reach the single-crystal semiconductor layers and the gate electrode layers are formed in the insulating films 167 and 168 and the gate insulating layer 107, using a resist mask. Etching may be performed only once or a plurality of times depending on the etching selectivity of the materials used for the insulating films. In this embodiment mode, the first etching is performed under such a condition that the insulating film 168 which is a silicon oxynitride film, the insulating film 167 which is a silicon nitride oxide film, and the gate insulating layer 107 can have etching selectivity. Thus, the insulating film 168 is removed. Next, the second etching is performed in which the insulating film 167 and the gate insulating layer 107 are removed, whereby openings that reach the first p-type impurity regions 160a and 160b and the second n-type impurity regions 144a, 144b, 147a, and 147b functioning as source regions or drain regions are formed. In this embodiment mode, the first etching is performed by wet etching, and the second etching is performed by dry etching. As an etchant of wet etching, it is preferable to use a solution containing fluorinated acid such as a mixed solution of ammonium hydrogenfluoride and ammonium fluoride. As an etching gas, a chlorine source gas typified by $Cl_2$, $BCl_3$, $SiCl_4$, or $CCl_4$; a fluorine source gas typified by $CF_4$, $SF_6$, or $NF_3$; or $O_2$ can be used. Further, an inert gas may be mixed into the etching gas. As the inert gas element that is mixed, one or more elements selected from among He, Ne, Ar, Kr, or Xe can be used.

Then, a conductive film is formed so as to cover the openings, and the conductive film is etched. Thus, source or drain electrode layers 169a, 169b, 170a, 170b, 171a, and 171b which are each connected to part of the respective source or drain regions are formed. The source or drain electrode layers can be formed by the steps of depositing a conductive film by a PVD method, a CVD method, an evaporation method, or the like, and etching the deposited conductive film into predetermined shapes. Alternatively, conductive layers can be selectively formed at predetermined positions by a droplet discharge method, a printing method, an electroplating method, or the like. Still alternatively, a reflow method or a damascene method may be used. As materials for forming the source or drain electrode layers, metals such as Ag, Au, Cu, Ni, Pt, Pd, Ir, Rh, W, Al, Ta, Mo, Cd, Zn, Fe, Ti, Zr, or Ba, Si, or Ge, alloys thereof, or nitride thereof can be used. Further, a stacked-layer structure of such materials may be used. In this embodiment mode, a stacked-layer structure is formed by forming a 60 nm thick titanium (Ti) film, a 40 nm thick titanium nitride film, a 700 nm thick aluminum film, and a 200 nm thick titanium (Ti) film. Then, the films are processed into desired shapes.

Figures 6A, 6B, 6C:
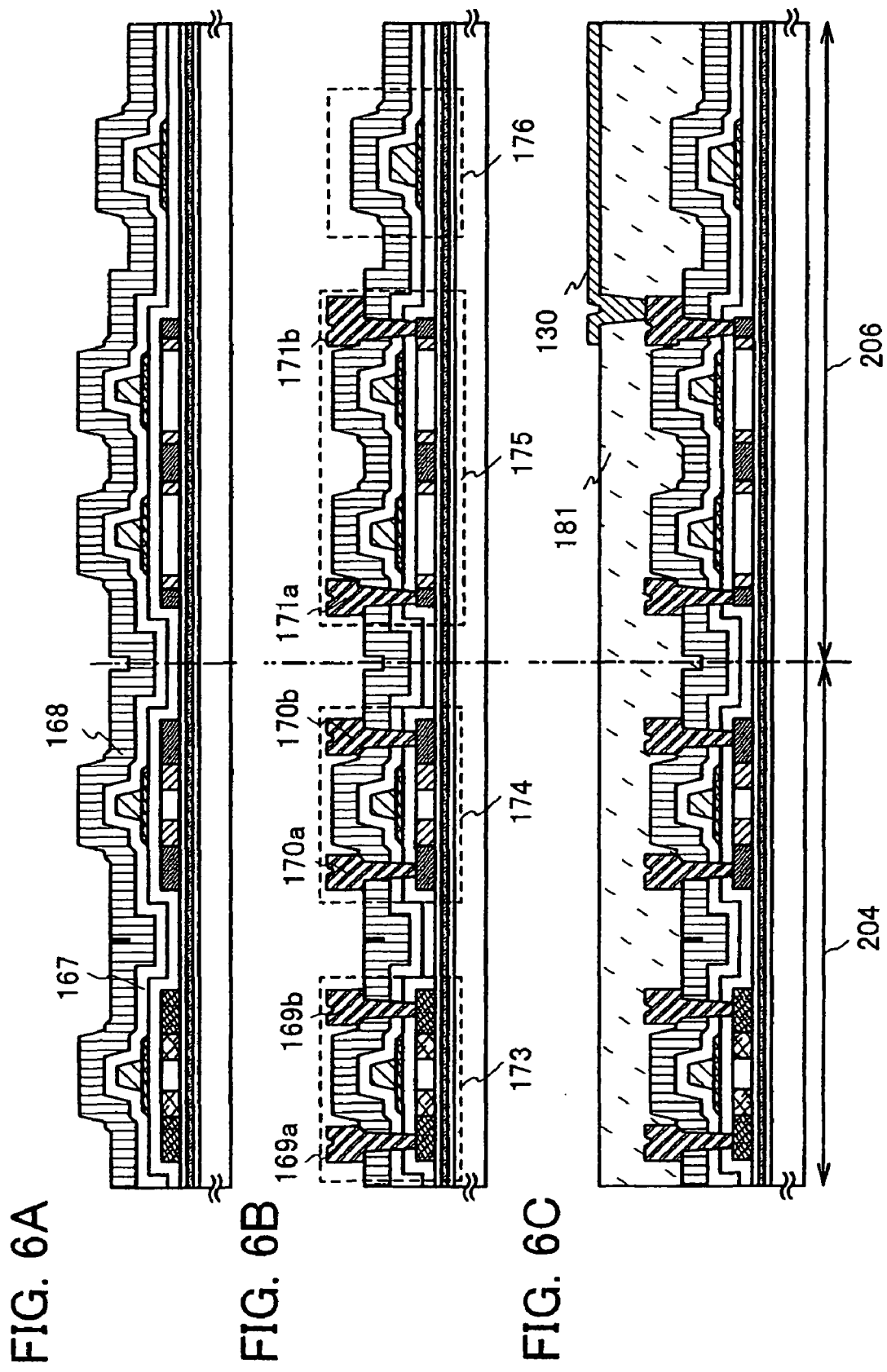
FIGS. 6A to 6C are cross-sectional views illustrating a method for manufacturing a semiconductor device of the present invention.

Though the above-described steps, an active matrix substrate can be fabricated which includes a transistor 173, which is a p-channel thin film transistor, having a p-type impurity region in a Lov region and a transistor 174, which is an n-channel thin film transistor, having an n-type impurity region in a Loff region, in the peripheral driver circuit region 204, and also includes a transistor 175, which is an n-channel thin film transistor with a multi-channel structure, having an n-type impurity region in a Loff region and a capacitor 176, in the pixel region 206 (see FIG. 6C). Then, the active matrix substrate can be used for a display device having a liquid crystal display element.

With the use of a single-crystal semiconductor layer, a pixel region and a driver circuit region can be integrated over the same glass substrate. In that case, the transistor 175 in the pixel region, and the transistors 173 and 174 in the driver circuit region are formed at the same time. The transistors used in the driver circuit region are included in a CMOS circuit.

The structure of the thin film transistor in the pixel region is not limited to that shown in this embodiment mode. Any of a single-gate structure having one channel formation region, a double-gate structure having two channel formation regions, and a triple-gate structure having three channel formation regions may be employed. In addition, thin film transistors in the peripheral driver circuit region may also have any of a single-gate structure, a double-gate structure, and a triple-gate structure.

Note that the present invention can be applied to a dual-gate type in which two gate electrode layers are disposed over and under a channel region, with gate insulating films interposed between the channel region and the two gate electrode layers.

Next, an insulating film 181 is formed as a second interlayer insulating layer (see FIG. 6C).

As materials for forming the insulating film 181, it is possible to use a material selected from among silicon oxide, silicon nitride, silicon oxynitride, silicon nitride oxide, aluminum nitride (AlN), aluminum oxynitride (AlON), aluminum nitride oxide (AlNO) in which the weight of nitrogen is greater than that of oxygen, aluminum oxide, diamond-like carbon (DLC), a carbon film containing nitrogen (CN), phosphosilicate glass (PSG), borophosphosilicate glass (BPSG), an alumina film, polysilazane, or other substances containing an inorganic insulating material. Alternatively, a siloxane resin may be used. Further alternatively, a photosensitive or non-photosensitive organic insulating material such as polyimide, acrylic, polyamide, polyimide amide, resist, or benzocyclobutene can be used.

In this embodiment mode, an interlayer insulating layer provided for planarization is required to have high heat resistance, a high insulating property, and a high level of planarity.

Therefore, a coating method typified by a spin coating method is preferably used as a method for forming the insulating film 181.

As a method of forming the insulating film 181, dipping, spray coating, doctor knife, roll coater, curtain coater, knife coater, a CVD method, an evaporation method, or the like can be used. The insulating film 181 may also be formed by a droplet discharge method. In that case, a liquid material can be saved. As a further alternative, a method whereby patterns can be transferred or drawn like a droplet discharge method can be used. For example, a printing method (e.g., a pattern formation method such as screen printing or offset printing) or the like can also be used.

Next, a minute opening, that is, a contact hole is formed in the insulating film 181 in the pixel region 206.

Then, the insulating film 181 is etched by using a parallel plate RIE apparatus. Note that etching time may be determined so that the wiring layer and the insulating film 168 are over-etched. Under the condition where the wiring layer and the insulating film 168 are over-etched, variation in thickness in the substrate and variation in etching rate can be reduced.

Further, an ICP apparatus may also be used as the etching apparatus. Through the above steps, an opening that reaches the source or drain electrode layer 171b is formed in the pixel region 206.

Next, a pixel electrode layer 130 is formed so as to be in contact with the source or drain electrode layer. The pixel electrode layer 130 can be formed using indium tin oxide (ITO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, indium tin oxide containing titanium oxide, or metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

FIGS. 7A and 7B illustrate a plan view and a cross-sectional view of a semiconductor device, respectively, and FIG. 7A is a plan view of a semiconductor device and FIG. 7B is a cross-sectional view taken along line C-D in FIG. 7A. An external terminal connection region 202 to which an FPC is bonded, a sealing region 203, a peripheral driver circuit region 204, and a pixel region 206 are provided. The external terminal connection region 202 is provided with a terminal electrode layer 178 which is connected to an external terminal.

Next, an insulating layer 381 called an orientation film is formed by a printing method or a droplet discharge method to cover the pixel electrode layer 130 and the insulating film 181. Note that the insulating layer 381 can be selectively formed by using a screen printing method or an offset printing method. After that, rubbing treatment is performed. The rubbing treatment is not necessarily performed when the mode of liquid crystal is, for example, a VA mode. An insulating layer 383 serving as an orientation film is similar to the insulating layer 381. Then, the sealant 192 is formed by a droplet discharge method in a peripheral region of the pixel region.

After that, an opposite substrate 195 provided with the insulating layer 383 serving as an orientation film, a conductive layer 384 serving as an opposite electrode, a colored layer 385 serving as a color filter, and a polarizer 391 (also referred to as a polarizing plate) is bonded to the support substrate 101 that is a TFT substrate with a spacer 387 interposed therebetween, and a liquid crystal layer 382 is provided in a gap therebetween. Since the liquid crystal display device of this embodiment mode is of transmissive type, a polarizer (polarizing plate) 143 is provided on a side of the support substrate 101 opposite to the side of having elements. The polarizer can be provided over the substrate using an adhesive layer. The sealant may be mixed with a filler, and further, the opposite substrate 195 may be provided with a blocking film (black matrix), or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to be overlapped with a transistor and a CMOS circuit for the sake of reducing reflection of external light by wirings of the transistor and the CMOS circuit. Note that the black matrix may be provided so as to be overlapped with a capacitor. This is because reflection by a metal film forming the capacitor can be prevented.

The liquid crystal layer can be formed by a dispenser method (dropping method), or an injecting method whereby liquid crystals are injected using a capillary phenomenon after bonding the support substrate 101 including an element to the opposite substrate 195. A dropping method is preferably employed when using a large-sized substrate to which it is difficult to apply an injecting method.

Although the spacer may be provided in such a way that particles each having a size of several micrometers are sprayed, the spacer may be formed by a method in which a resin film is formed over an entire surface of the substrate and then etched. A material of the spacer is applied by a spinner and then subjected to light exposure and development to form a predetermined pattern. Moreover, the material is heated at 150 to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the opposite substrate is bonded. The shape can be conical, pyramidal, or the like, and there is no particular limitation on the shape.

Then, terminal electrode layer 178 electrically connected to the pixel region is provided with an FPC 194 that is a wiring board for connection, through an anisotropic conductive layer 196. The FPC 194 functions to transmit signals or potential from the outside. Through the above steps, a liquid crystal display device having a display function can be manufactured.

The polarizing plate and the liquid crystal layer may be stacked with a retardation film interposed therebetween. In addition, an anti-reflection film which prevents reflection of light from external on a viewing side may be provided on the nearest viewing side.

As the semiconductor layer used in this embodiment mode, a single-crystal semiconductor layer according to the present invention can be used. After a plurality of single-crystal semiconductor layers are provided adjacent to each other with a certain distance over a support substrate, heat treatment is performed on the support substrate. The support substrate shrinks by this heat treatment, and the adjacent single-crystal semiconductor layers are in contact with each other due to the shrink. Energy beam irradiation is performed with the plurality of single-crystal semiconductor layers being in contact with each other, the plurality of single-crystal semiconductor layers are integrated, and thus a continuous single-crystal semiconductor layer is formed. Laser light is preferable as an energy beam.

A condition of heat treatment which is performed on the support substrate and the distance of the plurality of single-crystal semiconductor layers are set so that the distance between the single-crystal semiconductor layers over the support substrate is eliminated and the single-crystal semiconductor layers are in contact with each other by heat treatment performed on the support substrate. In order to deform the support substrate so as to shrink, a heat treatment temperature is preferably greater than or equal to a strain point of the support substrate. The distance between the single-crystal semiconductor layers depends on the size of the semiconductor substrate which is a base and the size of the support substrate. For example, the distance may be greater than or equal to 0.1 μm and less than or equal to 1 μm. This heat treatment may be performed under reduced pressure or atmospheric pressure, and as to an atmosphere, the heat treatment may be performed under a nitrogen atmosphere, an oxygen atmosphere, or the like.

Shrink of the support substrate due to heat treatment is utilized so that a distance between single-crystal semiconductor layers, which are provided in advance, is made to disappear. Therefore, warpage of the support substrate and the single-crystal semiconductor layers and peeling of the single-crystal semiconductor layers from the support substrate can be prevented. Further, since the plurality of single-crystal semiconductor layers can be integrated to form a continuous film, an SOI substrate having a large-area single-crystal semiconductor layer can be manufactured.

A semiconductor substrate is subjected to heat treatment at a high temperature of greater than or equal to a strain point of the support substrate, and the support substrate is provided with a blocking layer at a temperature less than or equal to the strain point to bond together. Accordingly, a single-crystal semiconductor layer can be prevented from being contaminated by impurities. Further, interface state density of an interface between the single-crystal semiconductor layer and the support substrate can be lowered. Accordingly, a semiconductor device which is sufficient for practical use can be provided.

Thus, even in a case of a large-sized semiconductor device, a semiconductor device including a liquid crystal display element having high performance and high reliability can be manufactured with high throughput and high productivity.

Embodiment Mode 3

A semiconductor device having a light-emitting element can be formed by applying the present invention, and the light-emitting element emits light by any one of bottom emission, top emission, and dual emission. This embodiment mode will describe an example of a method for manufacturing a semiconductor device in which a semiconductor device having a display function (also referred to as a display device or a light-emitting device) is manufactured as a bottom-emission, dual-emission, or top-emission semiconductor device having high performance and high reliability with high yield, with reference to FIGS. 8A and 8B, 9, and 10.

A semiconductor device illustrated in FIGS. 8A and 8B employs a bottom-emission structure in which light is emitted in a direction indicated by an arrow. FIG. 8A is a plan view of the semiconductor device, and FIG. 8B is a cross sectional view taken along line E-F of FIG. 8A. In FIGS. 8A and 8B, the semiconductor device includes an external terminal connection region 252, a sealing region 253, a driver circuit region 254, and a pixel region 256.

The semiconductor device illustrated in FIGS. 8A and 8B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, a blocking layer 601, an insulating layer 604, an oxide film 603, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The semiconductor device includes the external terminal connection region 252, the sealing region 253, the driver circuit region 254, and the pixel region 256. The filler 693 can be formed by a dropping method using a composition in a liquid state. A semiconductor device (light-emitting display device) is sealed by attaching the element substrate 600 provided with the filler by a dropping method and the sealing substrate 695 to each other.

In the semiconductor device illustrated in FIGS. 8A and 8B, the first electrode layer 685 is formed using a light-transmitting conductive material so as to transmit light emitted from the light-emitting element 690, and the second electrode layer 689 is formed using a reflective conductive material so as to reflect light emitted from the light-emitting element 690.

Since it is acceptable as long as the second electrode layer 689 has reflectivity, a conductive film formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range, and an aluminum film is used in this embodiment mode.

The first electrode layer 685 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Figure 9:
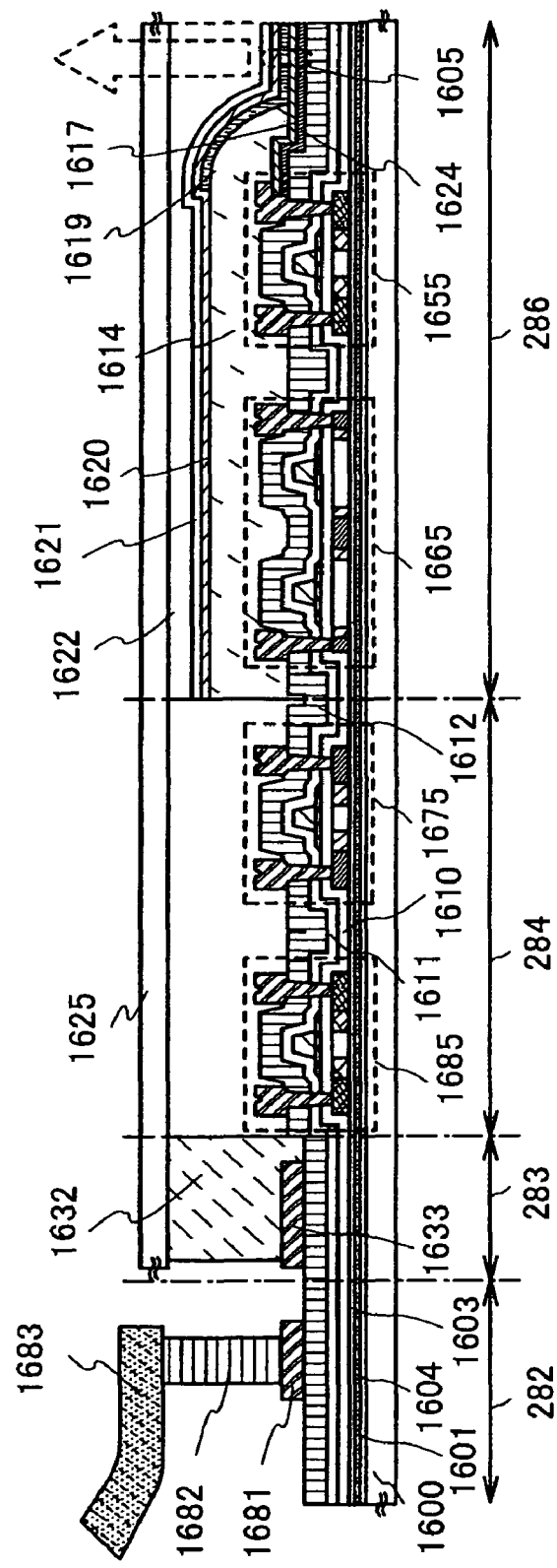
FIG. 9 is a cross-sectional view illustrating a semiconductor device of the present invention.

A semiconductor device illustrated in FIG. 9 employs a top-emission structure in which light is emitted in a direction indicated by an arrow. The semiconductor device illustrated in FIG. 9 includes an element substrate 1600, a thin film transistor 1655, a thin film transistor 1665, a thin film transistor 1675, a thin film transistor 1685, a wiring layer 1624, a first electrode layer 1617, a light-emitting layer 1619, a second electrode layer 1620, a filler 1622, a sealant 1632, a blocking layer 1601, an insulating layer 1604, an oxide film 1603, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, and an FPC 1683.

The semiconductor device illustrated in FIG. 9 includes an external terminal connection region 282, a sealing region 283, a driver circuit region 284, and a pixel region 286. In the semiconductor device illustrated in FIG. 9, the wiring layer 1624 that is a reflective metal layer is provided below the first electrode layer 1617. The first electrode layer 1617 that is a transparent conductive film is formed over the wiring layer 1624. Since it is acceptable as long as the wiring layer 1624 has reflectivity, a conductive film or the like formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range. The above-described conductive film having reflectivity may also be used as the first electrode layer 1617, and in that case, the wiring layer 1624 having reflectivity is not necessarily provided.

The first electrode layer 1617 and the second electrode layer 1620 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of approximately 5 to 30 nm) so as to be able to transmit light, light can be emitted through the first electrode layer 1617 and the second electrode layer 1620. As a metal thin film which can be used for the first electrode layer 1617 and the second electrode layer 1620, a conductive film formed of titanium, tungsten, nickel, gold, platinum, silver, aluminum, magnesium, calcium, lithium, or an alloy thereof, or the like can be used.

Figure 10:
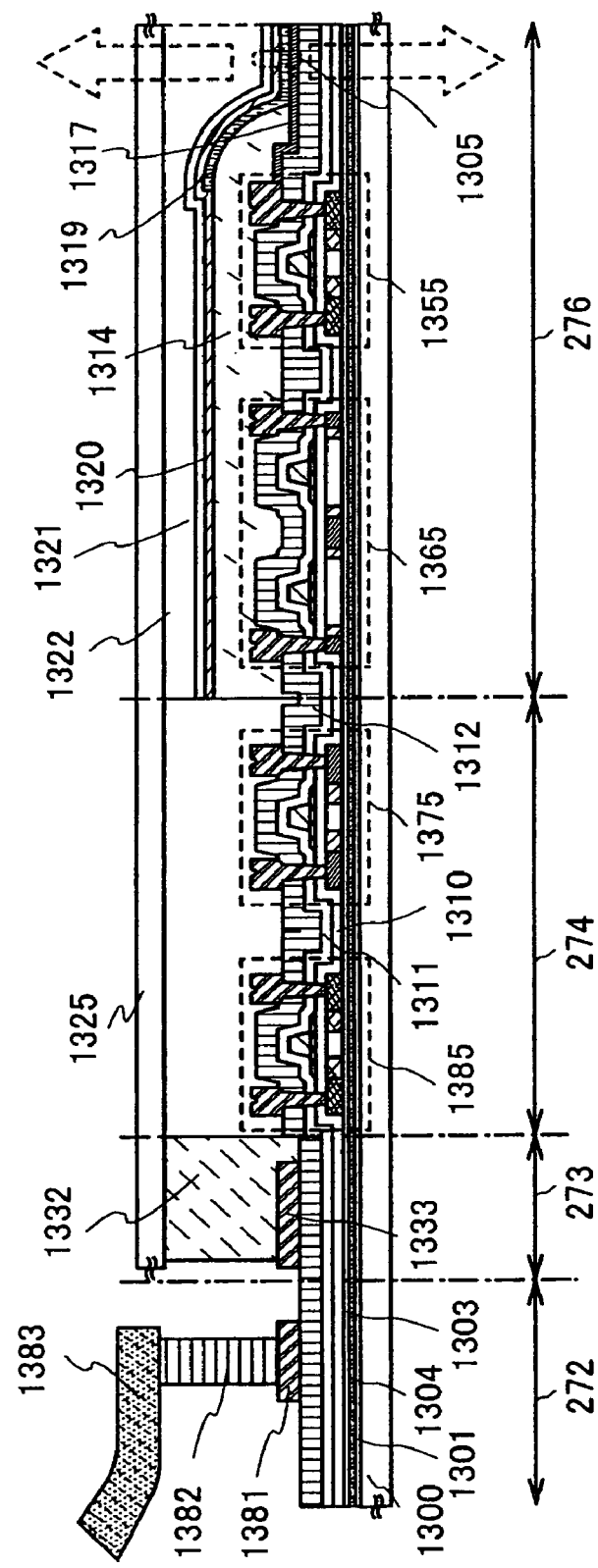
FIG. 10 is a cross-sectional view illustrating a semiconductor device of the present invention.

A semiconductor device illustrated in FIG. 10 includes an element substrate 1300, a thin film transistor 1355, a thin film transistor 1365, a thin film transistor 1375, a thin film transistor 1385, a first electrode layer 1317, a light-emitting layer 1319, a second electrode layer 1320, a filler 1322, a sealant 1332, a blocking layer 1301, an insulating layer 1304, an oxide film 1303, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383. The semiconductor device includes an external terminal connection region 272, a sealing region 273, a driver circuit region 274, and a pixel region 276.

The semiconductor device illustrated in FIG. 10 is dual-emission type and has a structure in which light is emitted in directions indicated by arrows from both the element substrate 1300 side and the sealing substrate 1325 side. Therefore, a light-transmitting electrode layer is used for each of the first electrode layer 1317 and the second electrode layer 1320.

In this embodiment mode, the first electrode layer 1317 and the second electrode layer 1320, which are light-transmitting electrode layers, may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of approximately 5 to 30 nm) so as to be able to transmit light, light can be emitted through the first electrode layer 1317 and the second electrode layer 1320. As a metal thin film which can be used for the first electrode layer 1317 and the second electrode layer 1320, a conductive film formed of titanium, tungsten, nickel, gold, platinum, silver, aluminum, magnesium, calcium, lithium, or an alloy thereof, or the like can be used.

In the above-described manner, the semiconductor device illustrated in FIG. 10 has a structure in which light emitted from a light-emitting element 1305 passes through the first electrode layer 1317 and the second electrode layer 1320 so that light is emitted from both sides.

A pixel of a semiconductor device that is formed using a light-emitting element can be driven by a simple matrix mode or an active matrix mode. Further, either digital driving or analog driving can be employed.

A color filter (colored layer) may be formed over a sealing substrate. The color filter (colored layer) can be formed by an evaporation method or a droplet discharge method. By using the color filter (colored layer), high-definition display can also be performed. This is because a broad peak can be modified to be sharp in the light emission spectrum of each color of RGB by the color filter (colored layer).

Full color display can be performed by formation of a material to emit light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion, and can mainly display characters and symbols.

By using a single-crystal semiconductor layer, a pixel region and a driver circuit region can be formed to be integrated over the same substrate. In that case, a transistor in the pixel region and a transistor in the driver circuit region are formed simultaneously.

The transistors provided in a semiconductor device of this embodiment mode illustrated in FIGS. 8A and 8B, 9, and 10 can be manufactured similarly to the transistors described in Embodiment Mode 2.

In FIGS. 8A and 8B, 9, and 10, a glass substrate is used as each of the element substrates 600, 1300, and 1600 which are bonded to single-crystal semiconductor layers.

As the semiconductor layer used in FIGS. 8A and 8B, 9, and 10 of this embodiment mode, a single-crystal semiconductor layer according to the present invention can be used. After a plurality of single-crystal semiconductor layers are provided adjacent to each other with a certain distance over a support substrate which is any of the element substrates 600, 1300, and 1600, heat treatment is performed on the support substrate. The support substrate shrinks by this heat treatment, and the adjacent single-crystal semiconductor layers are in contact with each other due to the shrink. Energy beam irradiation is performed with the plurality of single-crystal semiconductor layers being in contact with each other, the plurality of single-crystal semiconductor layers are integrated, and thus a continuous single-crystal semiconductor layer is formed. Laser light is preferable as an energy beam.

A condition of heat treatment which is performed on the support substrate and the distance of the plurality of single-crystal semiconductor layers are set so that the distance between the single-crystal semiconductor layers over the support substrate is eliminated and the single-crystal semiconductor layers are in contact with each other by heat treatment performed on the support substrate. In order to deform the support substrate so as to shrink, a heat treatment temperature is preferably greater than or equal to a strain point of the support substrate. The distance between the single-crystal semiconductor layers depends on the size of the semiconductor substrate which is a base and the size of the support substrate. For example, the distance may be greater than or equal to 0.1 μm and less than or equal to 1 μm. This heat treatment may be performed under reduced pressure or atmospheric pressure, and as to an atmosphere, the heat treatment may be performed under a nitrogen atmosphere, an oxygen atmosphere, or the like.

Shrink of the support substrate due to heat treatment is utilized so that a distance between single-crystal semiconductor layers, which are provided in advance, is made to disappear. Therefore, warpage of the support substrate and the single-crystal semiconductor layers and peeling of the single-crystal semiconductor layers from the support substrate can be prevented. Further, since the plurality of single-crystal semiconductor layers can be integrated to form a continuous film, an SOI substrate having a large-area single-crystal semiconductor layer can be manufactured.

A semiconductor substrate is subjected to heat treatment at a high temperature of greater than or equal to a strain point of the support substrate, and the support substrate is provided with a blocking layer at a temperature less than or equal to the strain point to bond together. Accordingly, a single-crystal semiconductor layer can be prevented from being contaminated by impurities. Further, interface state density of an interface between the single-crystal semiconductor layer and the support substrate can be lowered. Accordingly, a semiconductor device which is sufficient for practical use can be provided.

Thus, even in a case of a large-sized semiconductor device, a semiconductor device having high performance and high reliability can be manufactured with high throughput and high productivity.

This embodiment mode can be combined with Embodiment Mode 1, as appropriate.

Embodiment Mode 4

This embodiment mode will describe an example of a semiconductor device (also referred to as a display device or a light-emitting device) having a display function as a semiconductor device having high performance and high reliability. Specifically, a light-emitting display device using a light-emitting element for a display element will be described.

This embodiment mode will describe structures of light-emitting elements that can be used for display elements in the display device of the present invention with reference to FIGS. 13A to 13D.

FIGS. 13A to 13D illustrate structures of a light-emitting element in which an EL layer 860 is sandwiched between a first electrode layer 870 and a second electrode layer 850. The EL layer 860 includes a first layer 804, a second layer 803, and a third layer 802 as illustrated in the drawings. In FIGS. 13A to 13D, the second layer 803 is a light-emitting layer, and the first layer 804 and the third layer 802 are functional layers.

The first layer 804 is a layer having a function of transporting holes to the second layer 803. In FIGS. 13A to 13D, a hole-injecting layer included in the first layer 804 contains a substance having a high hole-injecting property, and molybdenum oxide, vanadium oxide, ruthenium oxide, tungsten oxide, manganese oxide, or the like can be used. Further, the first layer 804 can also be formed using the following: a phthalocyanine-based compound such as phthalocyanine (abbreviation: H$_2$Pc) or copper phthalocyanine (abbreviation: CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a high molecular compound such as poly(ethylene dioxythiophene)/poly(styrenesulfonic acid) (abbreviation: PEDOT/PSS); or the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property because electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material of the electrode layer can be selected regardless of a work function.

As the inorganic compound used for the composite material, an oxide of a transition metal is preferably used. In addition, an oxide of a metal belonging to Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic hydrocarbon, or a high molecular compound (e.g., an oligomer, a dendrimer, or a polymer). Note that as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property. Examples of the organic compound which can be used for the composite material are specifically listed below.

For example, as the aromatic amine compound, the following can be given: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As specific examples of the carbazole derivative which can be used for the composite material, the following can be given: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Further, the following can also be used: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; and the like.

Further, as the aromatic hydrocarbon which can be used for the composite material, the following can be given: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation:

DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of greater than or equal to $1\times10^{-6}$ cm$^2$/Vs and the carbon number of which is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Further, a high molecular compound such as poly(N-vinylcarbazole) (abbreviation: PVK) or poly(4-vinyltriphenylamine) (abbreviation: PVTPA) can also be used.

As a substance for forming a hole-transporting layer included in the first layer 804 in FIGS. 13A to 13D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenyl-amino)triphenylamine and 4,4',4''-tris[N-(3-methylphenyl)-N-phenylamino]triphenylamine. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the above-described substances or a stacked layer which includes two or more layers each containing the above-described substance.

The third layer 802 has a function of transporting and injecting electrons to the second layer 803. With reference to FIGS. 13A to 13D, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq) can be used. Further, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the above metal complexes, the following can be used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl] benzene (abbreviation: OXD-7); 3-(4-biphenylyl)-4-phenyl-5-(4-tert-butylphenyl)-1,2,4-triazole (abbreviation: TAZ), bathophenanthroline (abbreviation: BPhen); bathocuproine (abbreviation: BCP); or the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the above-described substance.

With reference to FIGS. 13A to 13D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof, for example, a layer of Alq containing magnesium (Mg) or the like can be used. It is preferable to use the layer which is made of a substance having an electron-transporting property and contains an alkali metal or an alkaline earth metal as the electron-injecting layer because electron injection from the electrode layer is efficiently performed by using the layer.

Next, the second layer 803 which is a light-emitting layer is described. The light-emitting layer has a function of emitting light and includes an organic compound having a light-emitting property. Further, the light-emitting layer may contain an inorganic compound. The light-emitting layer may be formed using various light-emitting organic compounds and inorganic compounds. The thickness of the light-emitting layer is preferably approximately 10 to 100 nm.

There are no particular limitations on the organic compound used for the light-emitting layer as long as it is a light-emitting organic compound. As the organic compound, for example, the following can be given: 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM 1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Further, a compound capable of emitting phosphorescence such as bis[2-(4',6'-difluorophenyl)pyridinato-N,C$^{2'}$]iridium(picolinate) (abbreviation: FIrpic), bis{2-[3',5'-bis(trifluoromethyl)phenyl]pyridinato-N,C$^{2'}$}iridium(picolinate) (abbreviation: Ir(CF$_3$ppy)$_2$(Pic)), tris(2-phenylpyridinato-N,C$^{2'}$)iridium (abbreviation: Ir(ppy)$_3$), bis(2-phenylpyridinato-N,C$^{2'}$)iridium (acetylacetonate) (abbreviation: Ir(ppy)$_2$(acac)), bis[2-(2'-thienyl)pyridinato-N,C$^{3'}$]iridium(acetylacetonate) (abbreviation: Ir(thp)$_2$(acac)), bis(2-phenylquinolinato-N,C$^{2'}$)iridium(acetylacetonate) (abbreviation: Ir(pq)$_2$(acac)), or bis[2-(2'-benzothienyl)pyridinato-N,C$^{3'}$]iridium(acetylacetonate) (abbreviation: Ir(btp)$_2$(acac)) can also be used.

Further, a triplet excitation light-emitting material containing a metal complex or the like may be used for the light-emitting layer in addition to a singlet excitation light-emitting material. For example, among pixels emitting red, green, and blue light, the pixel emitting red light whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. That is, when a triplet excitation light-emitting material is used for the pixel emitting red light, a smaller amount of current is necessary to be applied to a light-emitting element; thus, reliability can be improved. The pixel emitting red light and the pixel emitting green light may be formed using a triplet excitation light-emitting material and the pixel emitting blue light may be formed using a singlet excitation light-emitting material in order to achieve low power consumption. Low power consumption can be further achieved by formation of a light-emitting element that emits green light, which has high visibility for human eyes, with the use of a triplet excitation light-emitting material.

Another organic compound may be further added to the light-emitting layer as well as any of the above-described organic compounds which emit light. Examples of the organic compound that can be added are TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbreviation: CBP), and 1,3,5-tris[4-(N-carbazolyl)phenyl]benzene (abbreviation: TCPB). However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has higher physical strength than a low-molecular material and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride may be used. In particular, an oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a semiconductor device which is formed using a light-emitting element can be driven by a simple matrix mode or an active matrix mode. In either case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a semiconductor device including a light-emitting element can be improved. In addition, either digital driving or analog driving can be applied.

A color filter (colored layer) may be provided for a sealing substrate. The color filter (colored layer) can be formed by an evaporation method or a droplet discharge method. High-definition display can be performed with the use of the color filter (colored layer). This is because a broad peak can be modified to be sharp in a light emission spectrum of each of RGB by the color filter (colored layer).

Full color display can be performed by formation of a material emitting light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion, and can mainly display characters and symbols.

Figure 13A:
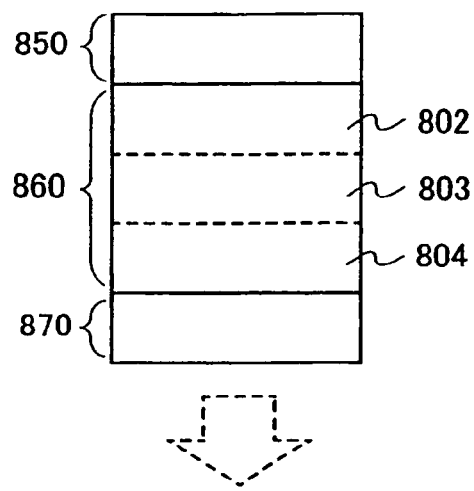
FIGS. 13A to 13D are cross-sectional views each illustrating a structure of a light-emitting element which can be applied to the present invention.
Figure 13B:
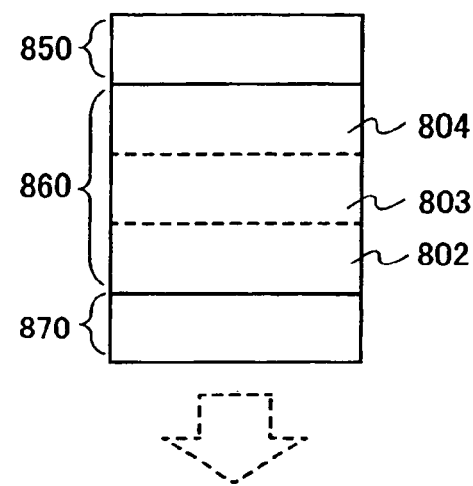

It is necessary to select materials for the first electrode layer 870 and the second electrode layer 850 considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as illustrated in FIG. 13A. In the case where the polarity of the driving thin film transistor is an n-channel type, the first electrode layer 870 may serve as a cathode and the second electrode layer 850 may serve as an anode as illustrated in FIG. 13B. Materials that can be used for the first electrode layer 870 and the second electrode layer 850 are described below. It is preferable to use a material having a high work function (specifically, a material having a work function of greater than equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron-transporting property, both the first electrode layer 870 and the second electrode layer 850 are scarcely restricted by a work function and various materials can be used.

The light-emitting elements in FIGS. 13A and 13B each have a structure in which light is extracted from the first electrode layer 870 and thus the second electrode layer 850 need not necessarily have a light-transmitting property. The second electrode layer 850 may be formed of a film mainly containing an element selected from Ti, Ni, W, Cr, Pt, Zn, Sn, In, Ta, Al, Cu, Au, Ag, Mg, Ca, Li or Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing types of the first electrode layer 870 and the second electrode layer 850.

FIG. 13B illustrates the case where the EL layer 860 is formed by stacking the third layer 802, the second layer 803, and the first layer 804 in this order from the first electrode layer 870 side.

Figure 13C:
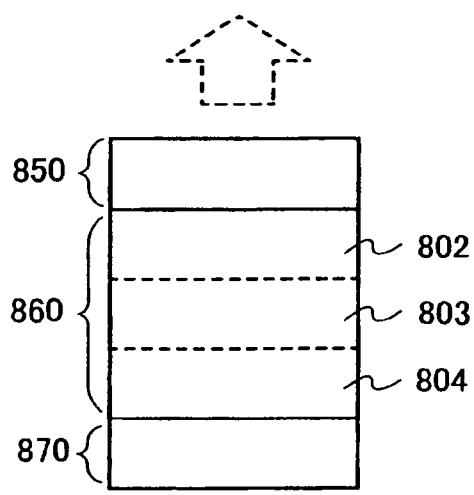
Figure 13D:
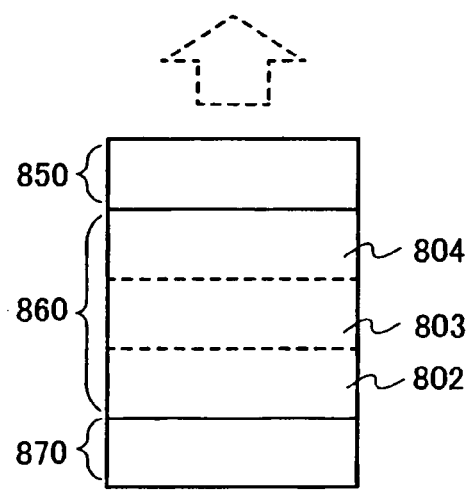

FIG. 13C illustrates a structure in which an electrode layer having reflectivity is used for the first electrode layer 870 and an electrode layer having a light-transmitting property is used for the second electrode layer 850 in FIG. 13A. Light emitted from the light-emitting element is reflected by the first electrode layer 870, transmitted through the second electrode layer 850, and emitted to the outside. Similarly, FIG. 13D illustrates a structure in which an electrode layer having reflectivity is used for the first electrode layer 870 and an electrode layer having a light-transmitting property is used for the second electrode layer 850 in FIG. 13B. Light emitted from the light-emitting element is reflected by the first electrode layer 870, transmitted through the second electrode layer 850, and emitted to the outside.

Further, various methods can be used as a method for forming the EL layer 860 when an organic compound and an inorganic compound are mixed in the EL layer 860. For example, there is a co-evaporation method for vaporizing both an organic compound and an inorganic compound by resistance heating. Further, for co-evaporation, an inorganic compound may be vaporized by an electron beam (EB) while an organic compound is vaporized by resistance heating. Furthermore, a method for sputtering an inorganic compound while vaporizing an organic compound by resistance heating to deposit the both at the same time may also be used. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be used.

This embodiment mode can be combined with any of Embodiment Modes 1 to 3, as appropriate.

According to the present invention, even in a case of a large-sized semiconductor device, a semiconductor device having high performance and high reliability can be manufactured with high throughput and high productivity.

Embodiment Mode 5

This embodiment mode will describe other examples of a semiconductor device having a display function as a semiconductor device having high performance and high reliability. In this embodiment mode, other structures that can be applied to the light-emitting element in the semiconductor device of the present invention will be described with reference to FIGS. 11A to 11C and 12A to 12C.

Light-emitting elements using electroluminescence can be roughly classified into light-emitting elements that use an organic compound as a light-emitting material and light-emitting elements that use an inorganic compound as a light-emitting material. In general, the former are referred to as organic EL elements, while the latter are referred to as inorganic EL elements.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particles of a light-emitting material are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As a light-emission mechanisms, there are donor-acceptor recombination type light emission that utilizes a donor level and an acceptor level, and localized type light emission that utilizes inner-shell electron transition of a metal ion. In general, donor-acceptor recombination light emission is employed in dispersion type inorganic EL elements and localized type light emission is employed in thin-film type inorganic EL elements in many cases.

A light-emitting material that can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state. Although the solid-phase method requires baking at a relatively high temperature, the solid-phase method is easy; thus, the solid phase method has high productivity and is suitable for mass production.

A liquid-phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the grain size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), or barium gallium sulfide ($BaGa_2S_4$).

For a luminescence center of an EL element which exhibits localized type light emission, the following can be used: manganese (Mn), copper (Cu), samarium (Sm), terbium (Tb), erbium (Er), thulium (Tm), europium (Eu), cerium (Ce), praseodymium (Pr), and the like. Note that a halogen element such as fluorine (F) or chlorine (Cl) may also be added. The halogen element can function to compensate electric charge.

Meanwhile, for a luminescence center of an EL element which exhibits donor-acceptor recombination light emission, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits donor-acceptor recombination light emission by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state.

In the case of performing solid-phase reaction, it is also possible to use a compound containing the first impurity element and the second impurity element as the impurity element. In that case, the impurity elements can be easily diffused, and solid-phase reaction can easily proceed; therefore, a uniform light-emitting material can be obtained. Further, since unnecessary impurity elements are not mixed, a light-emitting material with high purity can be obtained. As the compound containing the first impurity element and the second impurity element, copper chloride (CuCl), silver chloride (AgCl), or the like can be used.

Note that the concentration of the impurity element with respect to the base material may be 0.01 to 10 atomic %, preferably, 0.05 to 5 atomic %.

With regard to a thin-film-type inorganic EL element, an electroluminescent layer contains the above-described light-emitting material and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 11A:
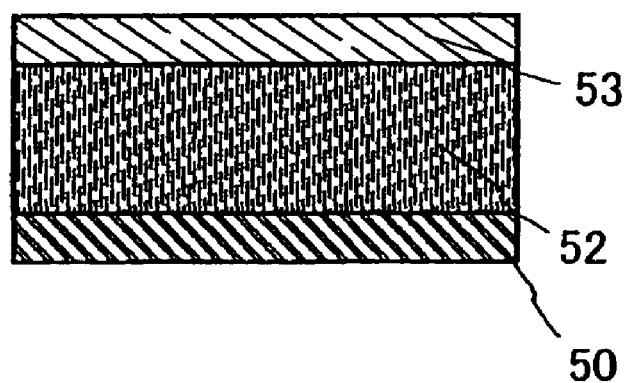
FIGS. 11A to 11C are cross-sectional views each illustrating a structure of a light-emitting element which can be applied to the present invention.
Figure 11B:
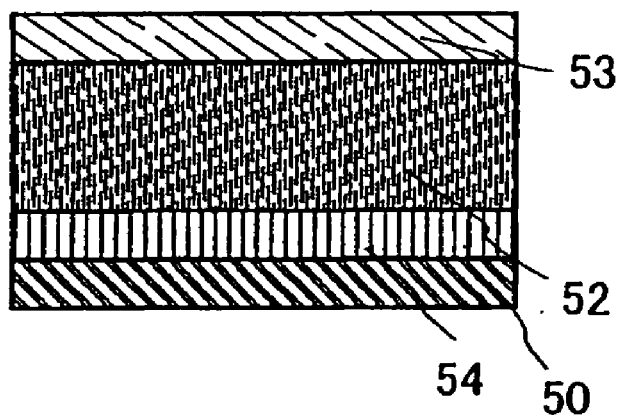
Figure 11C:
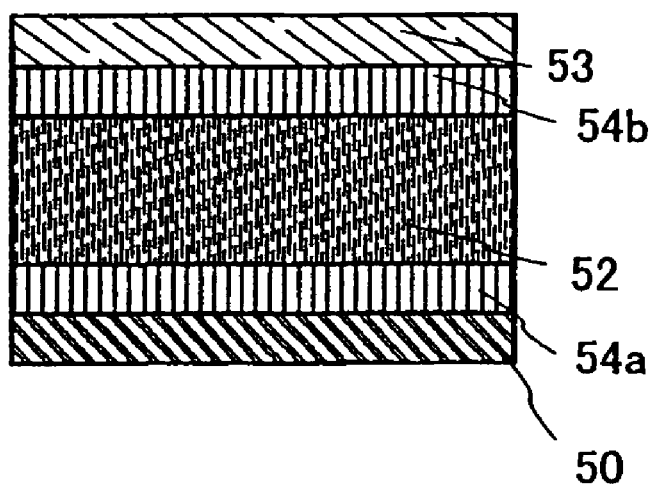

FIGS. 11A to 11C illustrate examples of a thin-film-type inorganic EL element that can be used as a light-emitting element. Each of the light-emitting elements illustrated in FIGS. 11A to 11C includes a first electrode layer 50, an electroluminescent layer 52, and a second electrode layer 53.

The light-emitting elements illustrated in FIGS. 11B and 11C each have a structure in which an insulating layer is provided between the electrode layer and the electroluminescent layer of the light-emitting element illustrated in FIG. 11A. The light-emitting element illustrated in FIG. 11B has an insulating layer 54 between the first electrode layer 50 and the electroluminescent layer 52. The light-emitting element illustrated in FIG. 11C has an insulating layer 54a between the first electrode layer 50 and the electroluminescent layer 52, and an insulating layer 54b between the second electrode layer 53 and the electroluminescent layer 52. As described above, the insulating layer may be provided between the electroluminescent layer and one or both of the pair of electrode layers. In addition, the insulating layer may have either a single layer or a plurality of stacked layers.

Although the insulating layer 54 is provided to be in contact with the first electrode layer 50 in FIG. 11B, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particles of a light-emitting material in a binder. The light-emitting material is processed into particulate forms. When particles with a desired size cannot be obtained due to a method for forming a light-emitting material, the material may be processed into particulate forms by being ground in a mortar or the like. A binder is a substance for fixing particles of a light-emitting material in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharge method whereby an electroluminescent layer can be selectively formed, a printing method (e.g., screen printing or offset printing), a coating method such as a spin coating method, a dipping method, a dispenser method, or the like. Although there is no particular limitation on a thickness of the electroluminescent layer; however, it is preferably in the range of 10 to 1000 nm. In the electroluminescent layer which contains a light-emitting material and a binder, the percentage of the light-emitting material may be greater than or equal to 50 wt % and less than or equal to 80 wt.

Figure 12A:
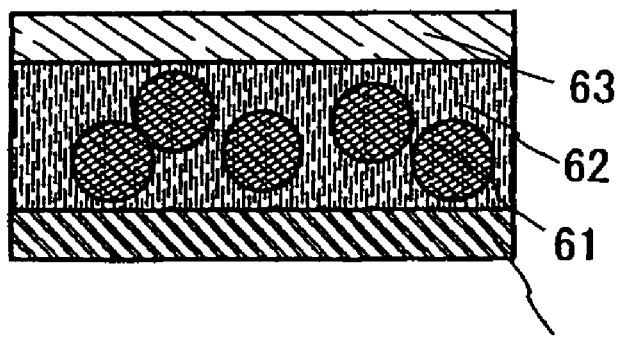
FIGS. 12A to 12C are cross-sectional views each illustrating a structure of a light-emitting element which can be applied to the present invention.
Figure 12B:
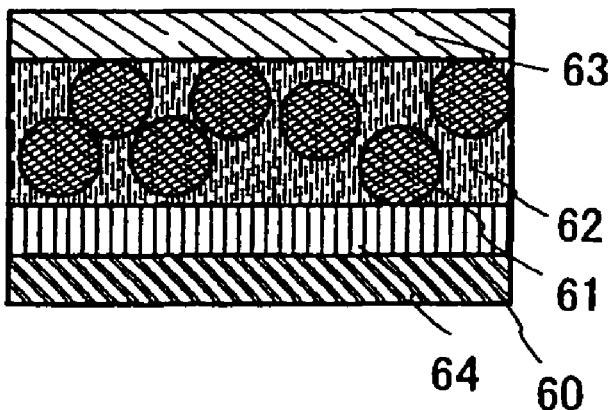
Figure 12C:
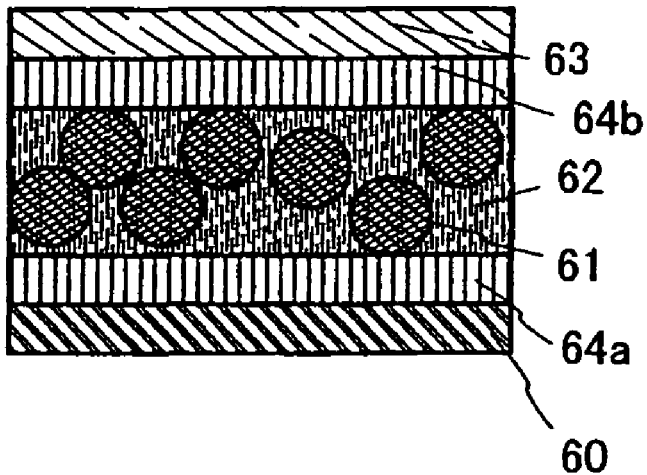

FIGS. 12A to 12C illustrate examples of a dispersion-type inorganic EL element that can be used as a light-emitting element. The light-emitting element illustrated in FIG. 12A has a structure in which a first electrode layer 60, an electroluminescent layer 62, and a second electrode layer 63 are stacked, and the electroluminescent layer 62 contains a light-emitting material 61 fixed by a binder.

As a binder that can be used in this embodiment mode, an organic material, an inorganic material, or a mixed material of an organic material and an inorganic material can be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide or polybenzimidazole, or a siloxane resin. Note that a siloxane resin corresponds to the bond of Si—O—Si. Siloxane has a skeleton structure with the bond of silicon (Si) and oxygen (O). As a substituent, an organic group containing at least hydrogen (e.g., an alkyl group or aromatic hydrocarbon) is used. Further, a fluoro group may be used as the substituent, or both a fluoro group and an organic group containing at least hydrogen may be used as the substituent. Further, it is also possible to use a resin material such as a vinyl resin (e.g. polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles of, for example, barium titanate ($BaTiO_3$) or strontium titanate ($SrTiO_3$) are mixed as appropriate into the above-described resin, the dielectric constant of the material can be controlled.

As an inorganic material contained in the binder, the following materials can be used: silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic material. When a high-dielectric-constant inorganic material is mixed into an organic material (by addition or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder that can be used in this embodiment mode, a solvent may be appropriately selected in which a binder material can be dissolved and with which a solution having a viscosity suitable for a method for forming the electroluminescent layer (various wet processes) and a desired film thickness can be formed. An organic solvent or the like can be used. For example, when a siloxane resin is used as a binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements illustrated in FIGS. 12B and 12C each have a structure in which an insulating layer is provided between the electrode layer and the electroluminescent layer of the light-emitting element illustrated in FIG. 12A. The light-emitting element illustrated in FIG. 12B has an insulating layer 64 between the first electrode layer 60 and the electroluminescent layer 62. The light-emitting element illustrated in FIG. 12C has an insulating layer 64a between the first electrode layer 60 and the electroluminescent layer 62, and an insulating layer 64b between the second electrode layer 63 and the electroluminescent layer 62. As described above, the insulating layer may be provided between the electroluminescent layer and one or both of the pair of electrode layers. In addition, the insulating layer may have either a single layer or a plurality of stacked layers.

In addition, although the insulating layer 64 is provided to be in contact with the first electrode layer 60 in FIG. 12B, the insulating layer 64 may also be provided to be in contact with the second electrode layer 63 by reversing the order of the insulating layer and the electroluminescent layer.

Although the insulating layers 54 illustrated in FIGS. 11B and 11C and the insulating layer 64 illustrated in FIGS. 12B and 12C are not particularly limited, a preferable insulating layer has a high withstand voltage and dense film quality, and more preferably has a high dielectric constant. For example, the following materials can be used: silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Further, a mixed film of such materials or a stacked film of two or more layers using such materials can also be used. The insulating films can be formed by sputtering, evaporation, CVD, or the like. Further, it is also possible to form an insulating layer by dispersing particles of an insulating material in a binder. The binder material may be formed using a material and method similar to those of the binder contained in the electroluminescent layer. Although the thickness of such an insulating layer is not particularly limited, it is preferably in the range of 10 to 1000 nm.

The light-emitting element shown in this embodiment mode emits light when a voltage is applied between the pair of electrode layers which sandwich the electroluminescent layer, and can be operated by either DC driving or AC driving.

This embodiment mode can be combined with any of Embodiment Modes 1 to 3, as appropriate.

According to the present invention, even in a case of a large-sized semiconductor device, a semiconductor device having high performance and high reliability can be manufactured with high throughput and high productivity.

Embodiment Mode 6

This embodiment mode will describe structures of a backlight. A backlight is provided in a semiconductor device having a liquid crystal element as shown in Embodiment Mode 2 as a backlight unit having a light source. In the backlight unit, the light source is surrounded by a reflector plate so that light is scattered efficiently.

Figure 14A:
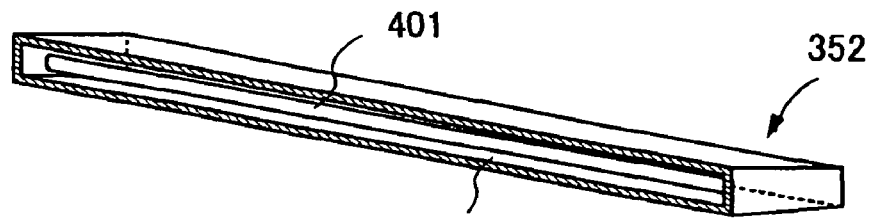
FIGS. 14A to 14D are views illustrating a lighting device which can be applied to the present invention.

As illustrated in FIG. 14A, a cold cathode tube 401 can be used as a light source in a backlight unit 352. In order to reflect light from the cold cathode tube 401 efficiently, a lamp reflector 332 can be provided. In many cases, the cold cathode tube 401 is used for a large-sized semiconductor device because of the intensity of the luminance from the cold cathode tube. Therefore, the backlight unit having a cold cathode tube can be used for a display of a personal computer.

Figure 14B:
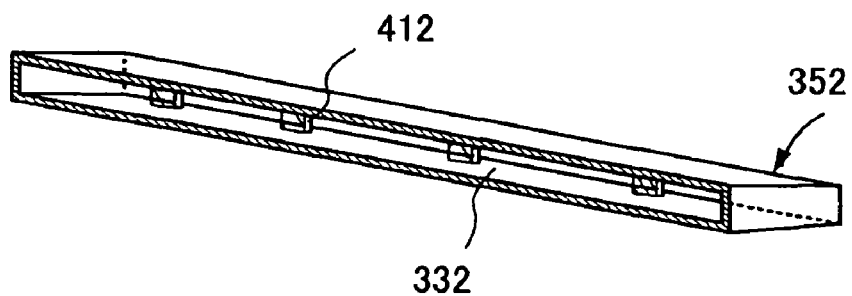

As illustrated in FIG. 14B, light-emitting diodes (LEDs) 412 can be used as a light source in the backlight unit 352. For example, light-emitting diodes (W) 412 emitting white light are arranged at predetermined intervals. In order to reflect light from the light-emitting diodes (W) 412 efficiently, the lamp reflector 332 can be provided.

Figure 14C:
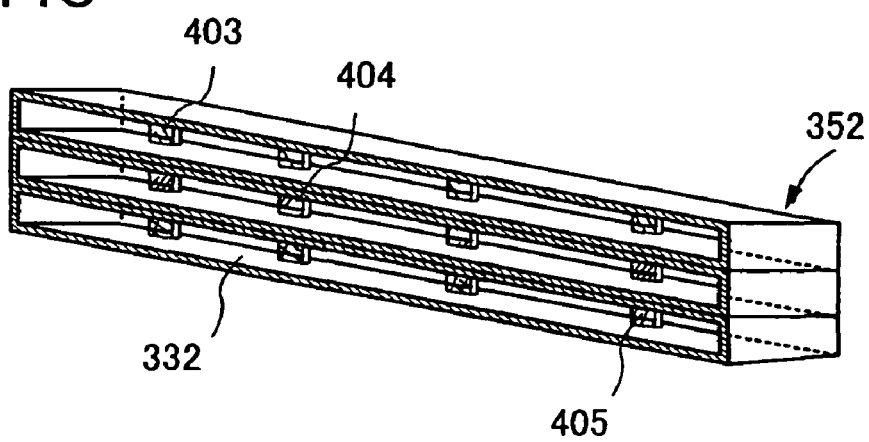

As illustrated in FIG. 14C, light-emitting diodes (LEDs) 403, 404, and 405 emitting light of colors of RGB can be used as a light source in the backlight unit 352. When the light-emitting diodes (LEDs) 403, 404, and 405 emitting light of colors of RGB are used, color reproducibility can be enhanced compared to the case where only the light-emitting diodes (LEDs) 412 emitting white light are used. In order to reflect light from the light-emitting diodes efficiently, the lamp reflector 332 can be provided.

Figure 14D:
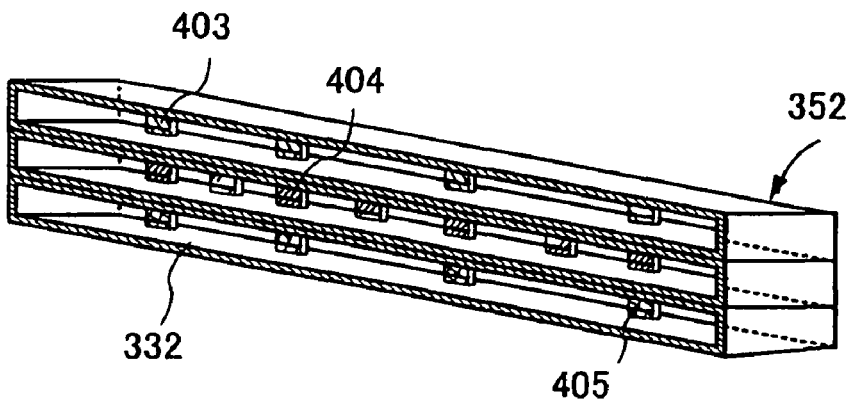

As illustrated in FIG. 14D, when the light-emitting diodes (LEDs) 403, 404, and 405 emitting light of colors of RGB are used as a light source, it is not necessary that the number and arrangement thereof are the same. For example, more light-emitting diodes emitting light of a color that has low light-emitting intensity (such as green) may be arranged than light-emitting diodes emitting other color light.

Furthermore, the light-emitting diodes 412 emitting white light may be combined with the light-emitting diodes (LEDs) 403, 404, and 405 emitting light of colors of RGB.

When a field sequential mode is applied in a case of using the light-emitting diodes of RGB, color display can be performed by sequentially lighting the light-emitting diodes of RGB in accordance with the time.

The light-emitting diode is suitable for a large-sized semiconductor device because the luminance thereof is high. In addition, color reproducibility of the light-emitting diode is superior to that of a cold cathode tube because the color purity of each color of RGB is favorable, and an arrangement area can be reduced. Therefore, a narrower frame can be achieved when the light-emitting diode is applied to a small-sized semiconductor device.

Further, a light source does not need to be provided like the backlight units which are illustrated in FIGS. 14A to 14D. For example, when a backlight having light-emitting diodes is mounted on a large-sized semiconductor device, the light-emitting diodes can be arranged on the back side of a substrate. In this case, the light-emitting diodes of each color can be arranged in order at predetermined intervals. Color reproducibility can be enhanced by the arrangement of the light-emitting diodes.

Therefore, according to the present invention, a semiconductor device using such a backlight and having high performance and high reliability can be manufactured with high productivity. A backlight having a light-emitting diode is particularly suitable for a large-sized semiconductor device, and a high-quality image can be provided even in a dark place by enhancement of the contrast ratio of the large-sized semiconductor device.

This embodiment mode can be combined with Embodiment Mode 2, as appropriate.

Embodiment Mode 7

A television device can be completed using a semiconductor device which includes a display element and is formed by the present invention. An example of a television device for the purpose of providing high performance and high reliability will be described.

Figure 23:
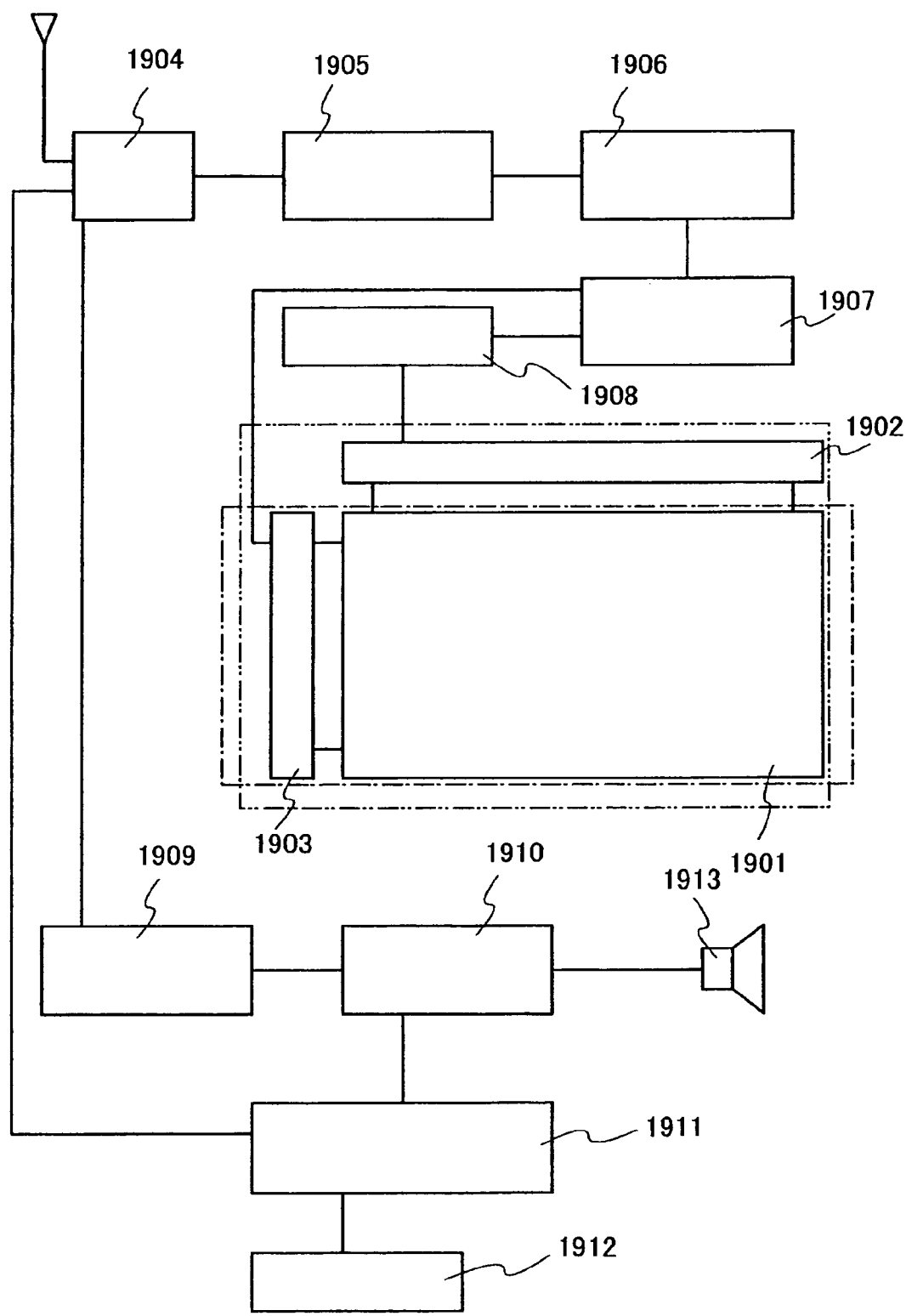
FIG. 23 is a block diagram illustrating a main structure of an electronic device to which the present invention is applied.

FIG. 23 is a block diagram illustrating a main configuration of a television device (e.g., a liquid crystal television device or an EL television device). A display panel can be formed in any mode as follows: a structure like FIG. 16B in which TFTs are formed, a pixel region 1901 and a scan line drive circuit 1903 are formed over the same substrate, and a signal line drive circuit 1902 is separately formed as a driver IC; a structure like FIG. 16C in which the pixel region 1901, the signal line drive circuit 1902, and the scan line drive circuit 1903 are formed over the same substrate; and the like.

As for the structures of other external circuits, a video signal amplifier circuit 1905 for amplifying video signals among signals received at a tuner 1904, a video signal processing circuit 1906 for converting signals output from the video signal amplifier circuit 1905 into color signals corresponding to red, green, and blue, a control circuit 1907 for converting the video signals into an input specification of the driver ICs, and the like are provided on the input side of the video signals. The control circuit 1907 outputs signals to each of the scan line side and the signal line side. In the case of digital driving, a signal divider circuit 1908 may be provided on the signal line side so that input digital signals can be divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control data on the receiving station (reception frequency) or sound volume from an input portion 1912, and transmits signals to the tuner 1904 and the audio signal processing circuit 1910.

Figure 20A:
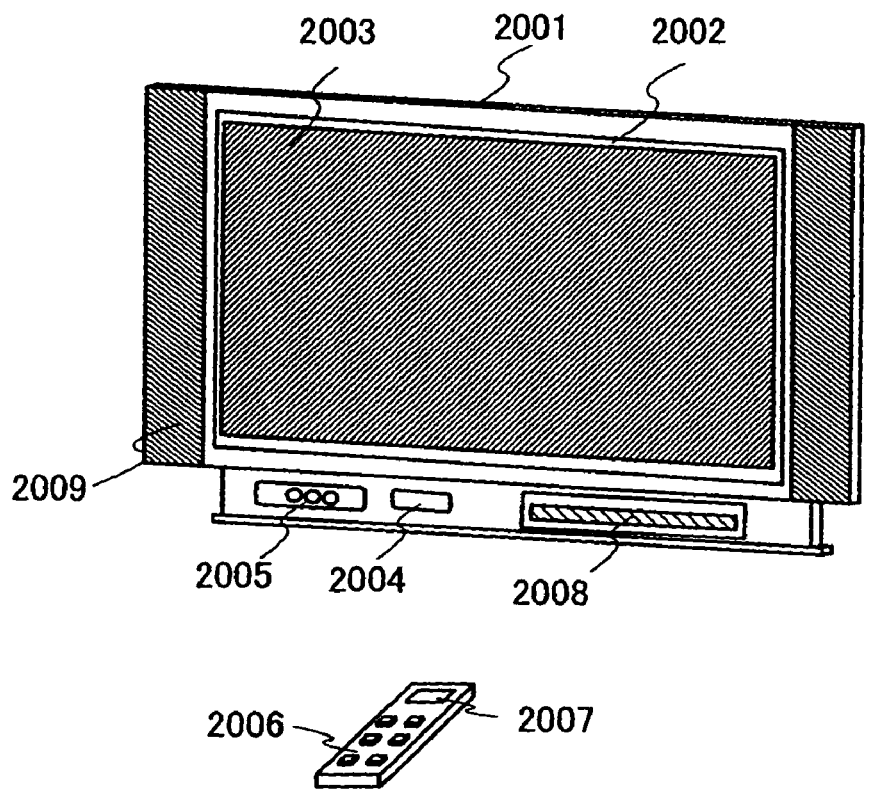
FIGS. 20A and 20B are views each illustrating an electronic device to which the present invention is applied.
Figure 20B:
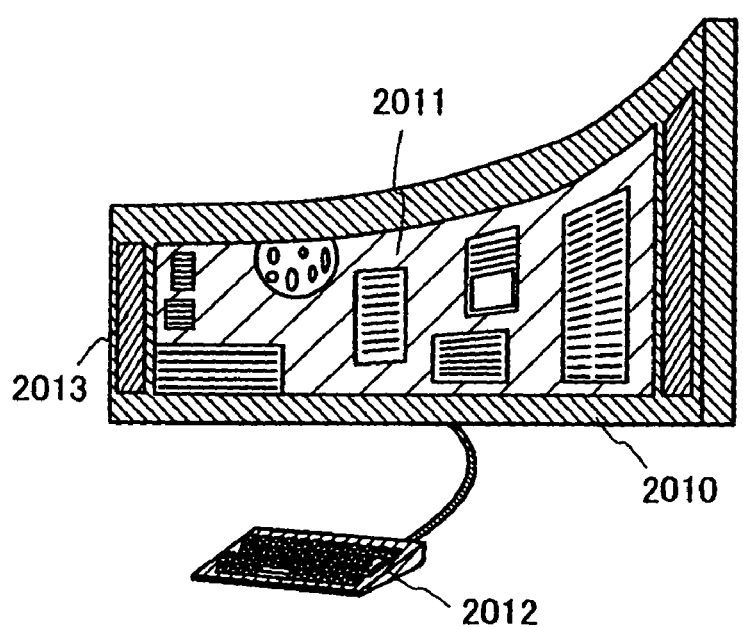

By incorporating a display module into a housing as illustrated in FIGS. 20A and 20B, a television device can be completed. A display panel in which components up to an FPC are set as illustrated in FIGS. 8A and 8B is generally called an EL display module. When an EL display module as illustrated in FIGS. 8A and 8B is used, an EL television device can be completed, and when a liquid crystal display module as illustrated in FIGS. 7A and 7B is used, a liquid crystal television device can be completed. Using a display module, a main display screen 2003 can be formed, and other accessories such as speaker portions 2009 and operation switches are provided. In this manner, a television device can be completed according to the present invention.

In addition, reflected light of incident light from external may be blocked with the use of a retardation plate or a polarizing plate. In a top-emission display device, an insulating layer serving as a partition wall may be colored to be used as a black matrix. This partition wall can also be formed by a droplet discharge method or the like. Carbon black or the like may be mixed into a black resin of a pigment material or a resin material such as polyimide, or a stacked layer thereof may be used. By a droplet discharge method, different materials may be discharged to the same region plural times to form the partition wall. A quarter wave plate ($\lambda/4$) or a half wave plate ($\lambda/2$) may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in this order, and light emitted from the light-emitting element is transmitted therethrough and is emitted to the outside from the polarizing plate side. The retardation plate or the polarizing plate may be provided on a side to which light is emitted or may be provided on both sides in the case of a dual-emission semiconductor device in which light is emitted from the both sides. In addition, an anti-reflective film may be provided on the outer side of the polarizing plate. Accordingly, high-definition and precise images can be displayed.

A display panel 2002 using a display element is incorporated into a housing 2001 as illustrated in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 that displays information to be outputted may also be provided for this remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel superior in viewing angle, and the sub-screen 2008 may be formed using a liquid crystal display panel capable of displaying with low power consumption. In order to prioritize low power consumption, a structure in which the main screen 2003 is formed using a liquid crystal display panel, the sub-screen 2008 is formed using an EL display panel, and the sub-screen is able to flash on and off may be employed. According to the present invention, a semiconductor device having high performance and high reliability can be manufactured with high productivity even with the use of a large-sized substrate with a number of TFTs and electronic components.

FIG. 20B illustrates a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 20B is formed using a bendable material; therefore, the television device includes the bent display portion. Since the shape of the display portion can be freely set, a television device having a desired shape can be manufactured.

According to the present invention, a semiconductor device having high performance and high reliability which includes a display function can be manufactured with high productivity. Therefore, a television device having high performance and high reliability can be manufactured with high productivity.

Needless to say, the present invention is certainly not limited to the television device and is also applicable to various uses such as a monitor of a personal computer and a display medium having a large area, for example, an information display board at a train station, an airport, or the like, or an advertisement display board on the street.

Embodiment Mode 8

This embodiment mode will describe an example of a semiconductor device for the purpose of providing high performance and high reliability. Specifically, as examples of the semiconductor device, examples of a microprocessor and a semiconductor device which has an arithmetic function and can transmit and receive data without contact will be described.

Figure 17:
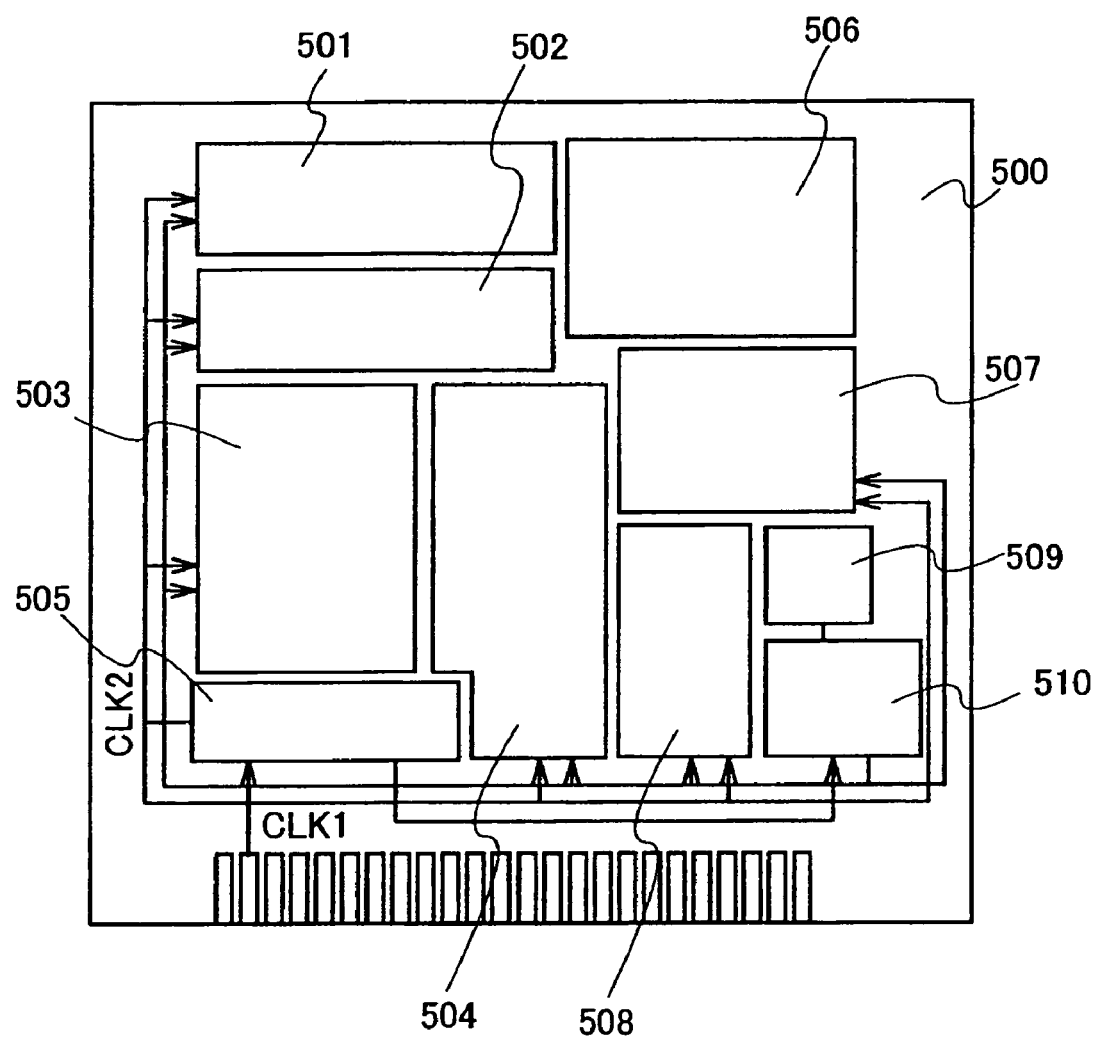
FIG. 17 is a block diagram illustrating a configuration of a microprocessor which is obtained from a semiconductor substrate.

FIG. 17 illustrates a structure of a microprocessor 500 that can be obtained using a semiconductor substrate of the present invention as an example of a semiconductor device. As described above, the microprocessor 500 is manufactured using the semiconductor substrate according to this embodiment mode. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction inputted to the microprocessor 500 through the bus interface 508 is inputted to the instruction decoder 503 and decoded. Then, the instruction is inputted to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 depending on the state of the microprocessor. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 illustrated in FIG. 17 is just an example of the simplified structure, and practical microprocessors have various structures depending on usage.

Since an integrated circuit is formed using a single-crystal semiconductor layer whose crystals are oriented in a certain direction and which is bonded to a glass substrate in the microprocessor 500, higher processing speed and lower power consumption can be achieved.

Figure 18:
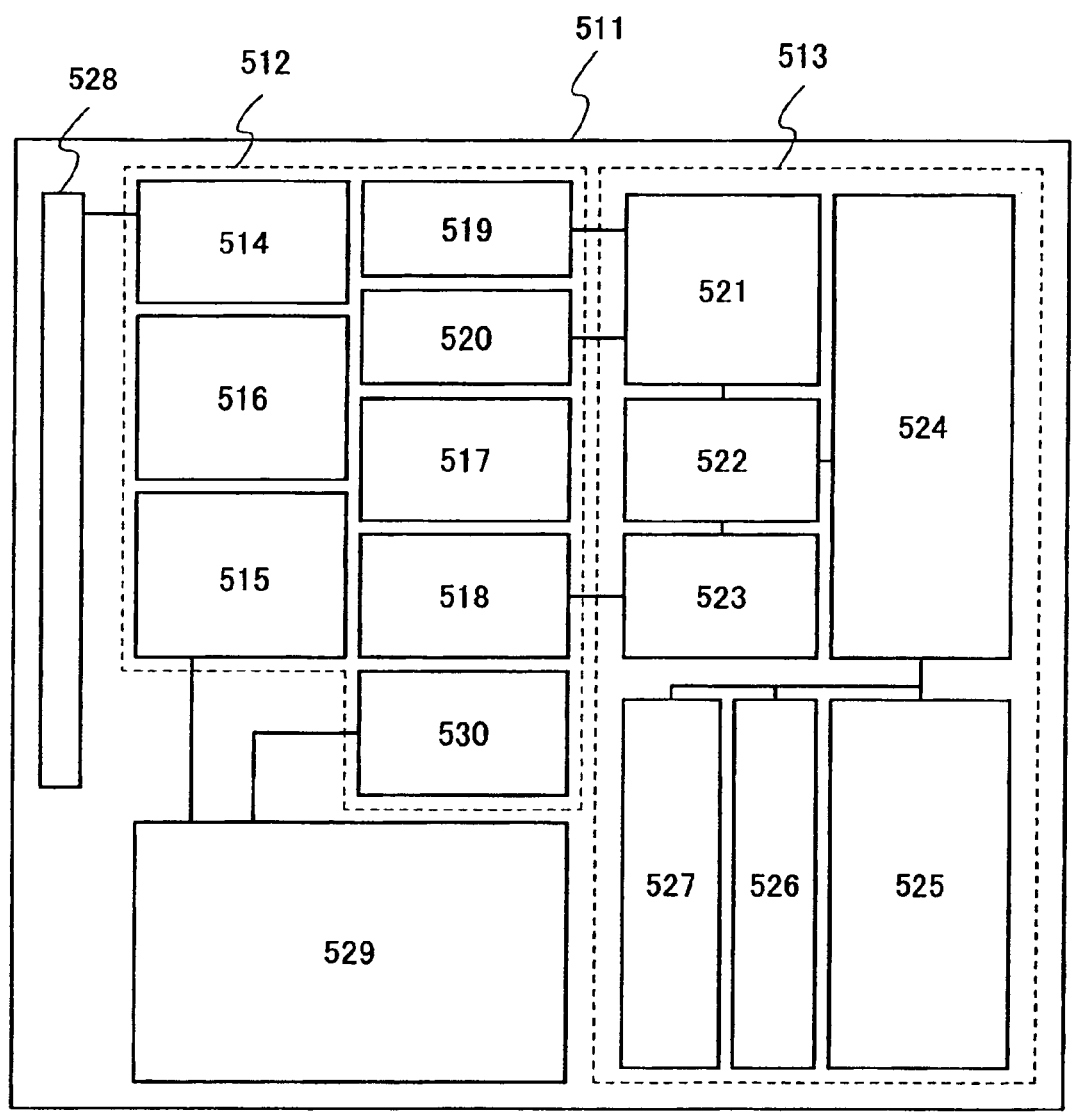
FIG. 18 is a block diagram illustrating a configuration of an RFCPU which is obtained from a semiconductor substrate.

Next, a structure of an RFCPU obtained by using the semiconductor substrate of the present invention will be described as an example of a semiconductor device which has an arithmetic function and can transmit and receive data without contact, with reference to FIG. 18. FIG. 18 illustrates an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, an interface (CPU interface) 524, a central processing unit (CPU) 525, a random access memory (RAM) 526, and a read only memory (ROM) 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached, as another component, to a substrate having an insulating surface that partially constitutes the RFCPU 511.

The reset circuit 517 generates a signal that resets the digital circuit portion 513 to be initialized. For example, the reset circuit 517 generates, as a reset signal, a signal that rises with delay after increase in the power supply voltage. The oscillator circuit 518 changes the frequency and the duty ratio of a clock signal depending on a control signal generated by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal depending on the power supply voltage or current consumption in the central processing unit 525. The power supply voltage is monitored by the power supply control circuit 530.

A signal that is inputted to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which a part of process is conducted in the circuit dedicated to arithmetic and the other part of the arithmetic process is conducted by the central processing unit 525 using a program.

Since an integrated circuit is formed using a single-crystal semiconductor layer whose crystals are oriented in a certain direction and which is bonded to a glass substrate in the RFCPU 511, higher processing speed and lower power consumption can be achieved. Accordingly, even when the capacitor portion 529 which supplies electric power is miniaturized, long-term operation can be secured.

Embodiment Mode 9

This embodiment mode will be described with reference to FIGS. 21A and 21B. This embodiment mode shows an example of a module using a panel including the semiconductor device manufactured in Embodiment Modes 1 to 8. In this embodiment mode, an example of a module including a semiconductor device for the purpose of providing high performance and high reliability will be described.

Figure 21A:
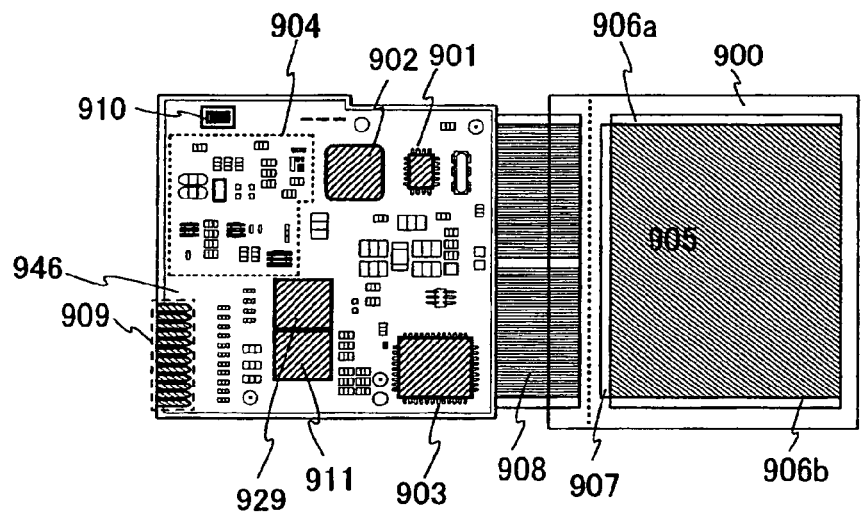
FIGS. 21A and 21B are views each illustrating an electronic device to which the present invention is applied.

A module of an information terminal illustrated in FIG. 21A includes a printed wiring board 946 on which a controller 901, a central processing unit (CPU) 902, a memory 911, a power supply circuit 903, an audio processing circuit 929, a transmission/reception circuit 904, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scan line drive circuit 906a and a second scan line drive circuit 906b which select a pixel included in the pixel region 905, and a signal line drive circuit 907 which supplies a video signal to the selected pixel.

Various control signals are inputted and outputted through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power supply circuit 903 may be directly mounted on the panel 900 by a chip on glass (COG) method. Moreover, various elements such as a capacitor and a buffer are provided over the printed wiring board 946, so that a noise in power supply voltage or a signal and delay in signal rising are prevented.

Figure 21B:
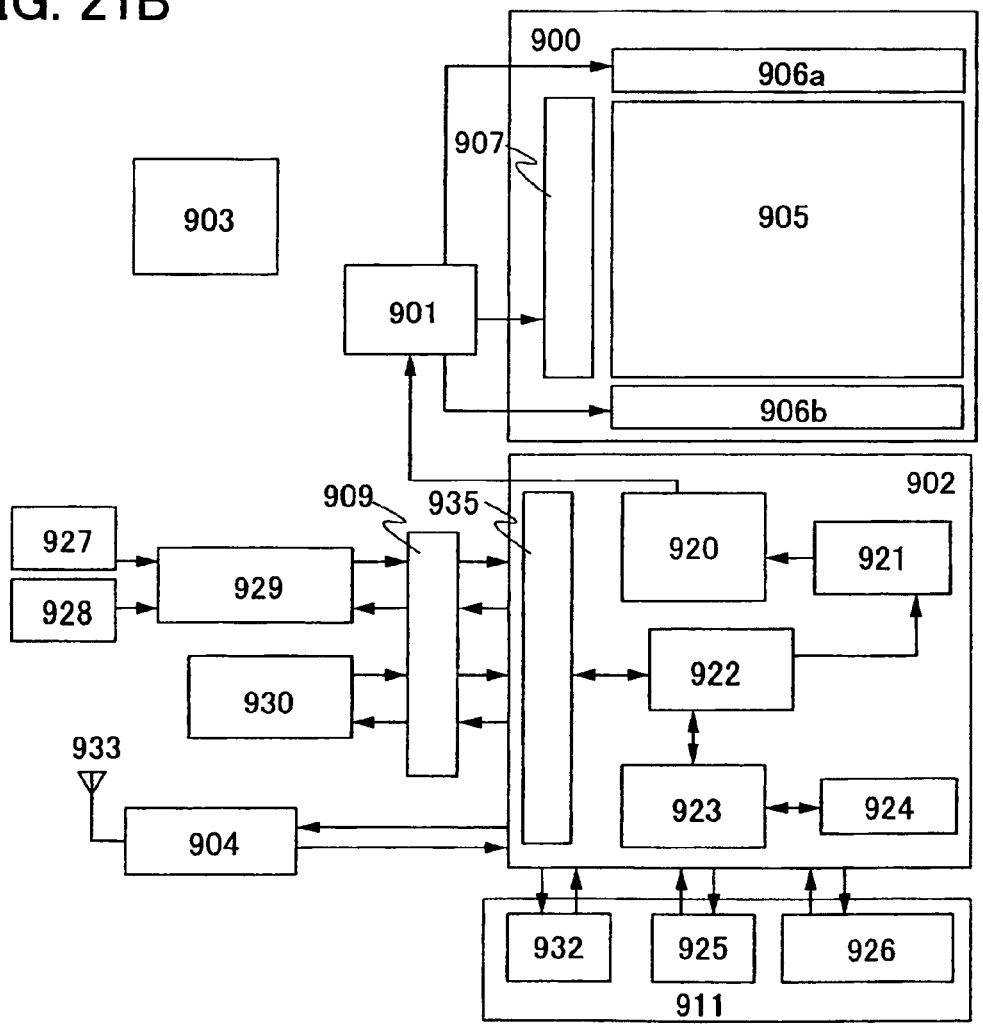

FIG. 21B is a block diagram of the module illustrated in FIG. 21A. A module 999 includes a VRAM 932, a DRAM 925, a flash memory 926, and the like in the memory 911. The VRAM 932 stores image data to be displayed on the panel, the DRAM 925 stores image data or audio data, and the flash memory 926 stores various programs.

The power supply circuit 903 generates power supply voltage applied to the panel 900, the controller 901, the CPU 902, the audio processing circuit 929, the memory 911, and the transmission/reception circuit 904. Moreover, depending on the specifications of the panel, a current source is provided in the power supply circuit 903 in some cases.

The CPU 902 includes a control signal generating circuit 920, a decoder 921, a register 922, an arithmetic circuit 923, a RAM 924, an interface 935 for the CPU, and the like. Various signals inputted to the CPU 902 through the interface 935 are inputted to the arithmetic circuit 923, the decoder 921, and the like after once being held in the register 922. The arithmetic circuit 923 carries out an arithmetic operation based on the input signal and specifies an address to which various instructions are sent. On the other hand, the signal inputted to the decoder 921 is decoded and inputted to the control signal generating circuit 920. The control signal generating circuit 920 generates a signal including various instructions based on the inputted signal and sends it to the address specified by the arithmetic circuit 923, specifically, the memory 911, the transmission/reception circuit 904, the audio processing circuit 929, the controller 901, and the like.

The memory 911, the transmission/reception circuit 904, the audio processing circuit 929, and the controller 901 operate in accordance with respective instructions received. The operations will be briefly described below.

The signal inputted from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits the converted image data to the controller 901.

The controller 901 processes a signal including image data transmitted from the CPU 902 in accordance with the specifications of the panel and supplies the signal to the panel 900. The controller 901 generates a Hsync signal, a Vsync signal, a clock signal CLK, alternating voltage (AC Cont), and a switching signal L/R based on the power supply voltage inputted from the power supply circuit 903 and various signals inputted from the CPU 902 and supplies them to the panel 900.

In the transmission/reception circuit 904, a signal transmitted and received as an electric wave at the antenna 933 is processed. Specifically, high frequency circuits such as an isolator, a band path filter, a voltage controlled oscillator (VCO), a low pass filter (LPF), a coupler, and a balun are included. Among the signals transmitted and received at the transmission/reception circuit 931, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power supply circuit 903, the audio processing circuit 929, and the memory 911 can be incorporated as a package of this embodiment mode. This embodiment mode is applicable to any circuit other than high frequency circuits such as an isolator, a band path filter, a voltage controlled oscillator (VCO), a low pass filter (LPF), a coupler, and a balun.

Embodiment Mode 10

Figure 22:
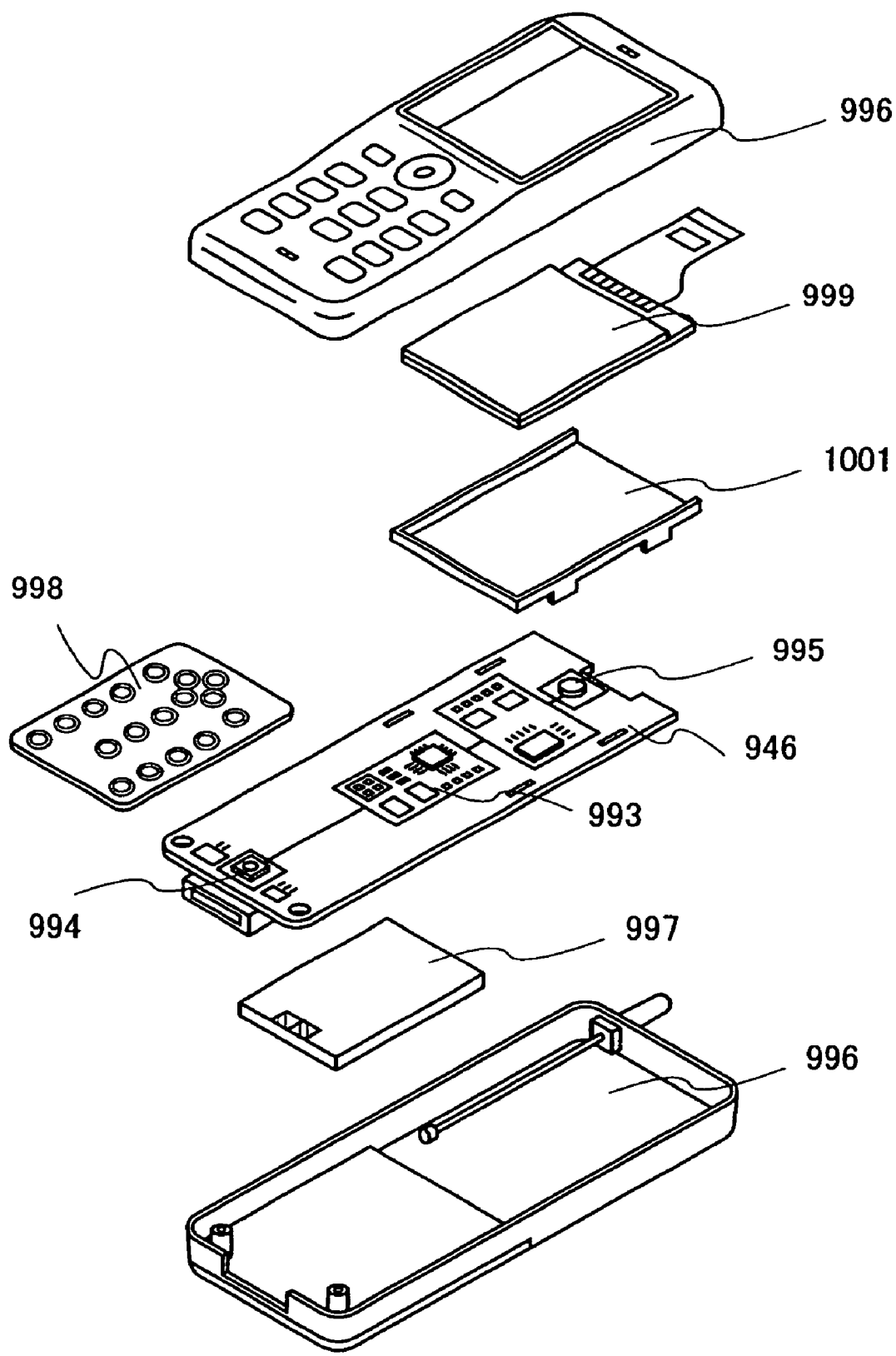
FIG. 22 is a view illustrating an electronic device to which the present invention is applied.

This embodiment mode will be described with reference to FIGS. 21A and 211B and 22. FIG. 22 illustrates one mode of a portable compact phone (a cellular phone) which includes the module manufactured in Embodiment Mode 9 and operates wirelessly. The panel 900 is detachably incorporated into a housing 1001 so as to be easily combined with the module 999. The shape and the size of the housing 1001 can changed as appropriate in accordance with an electronic device incorporated therein.

The housing 1001 in which the panel 900 is fixed is fitted to the printed wiring board 946 and set up as a module. A controller, a CPU, a memory, a power supply circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through the FPC 908.

The module 999, an input unit 998, and a battery 997 are stored in a housing 996. The pixel region of the panel 900 is arranged so that it can be seen through a window formed in the housing 996.

The housing 996 illustrated in FIG. 22 is an example of an exterior shape of the phone. However, an electronic device of this embodiment mode can be changed into various modes depending on functions and intended purposes. In the following embodiment mode, examples of the modes will be described.

Embodiment Mode 11

By application of the present invention, various semiconductor devices having a display function can be manufactured. That is, the present invention can be applied to various electronic devices in which these semiconductor devices having a display function are incorporated into display portions. In this embodiment mode, examples of electronic devices including a semiconductor device having a display function for the purpose of providing high performance and high reliability will be described.

As electronic devices of the present invention, television devices (also simply referred to as televisions or television receivers), cameras such as digital cameras or digital video cameras, cellular phone sets (also simply referred to as cellular phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like can be given. Specific examples thereof will be described with reference to FIGS. 19A to 19E.

Figure 19A:
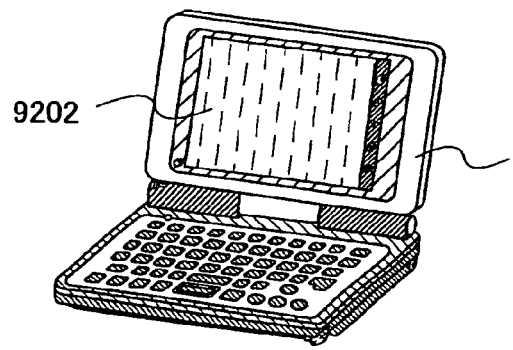
FIGS. 19A to 19E are views each illustrating an electronic device to which the present invention is applied.

A portable information terminal illustrated in FIG. 19A includes a main body 9201, a display portion 9202, and the like. The semiconductor device of the present invention can be applied to the display portion 9202. Consequently, a portable information terminal having high performance and high reliability can be provided.

Figure 19B:
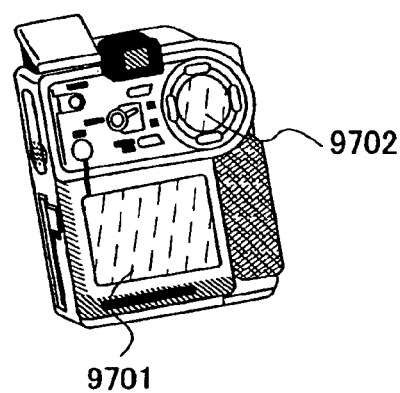

A digital video camera illustrated in FIG. 19B includes a display portion 9701, a display portion 9702, and the like. The semiconductor device of the present invention can be applied to the display portion 9701. Consequently, a digital video camera having high performance and high reliability can be provided.

Figure 19C:
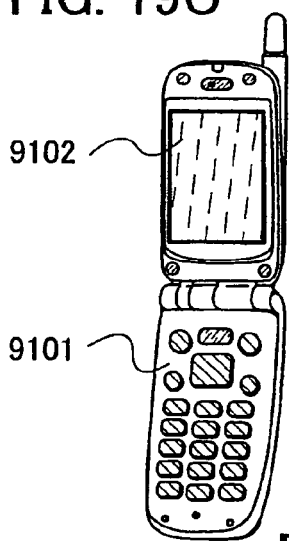

A cellular phone illustrated in FIG. 19C includes a main body 9101, a display portion 9102, and the like. The semiconductor device of the present invention can be applied to the display portion 9102. Consequently, a cellular phone having high performance and high reliability can be provided.

Figure 19D:
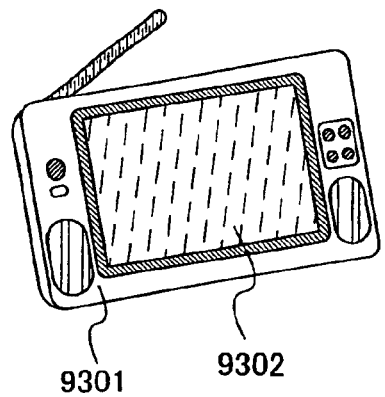

A portable television device illustrated in FIG. 19D includes a main body 9301, a display portion 9302, and the like. The semiconductor device of the present invention can be applied to the display portion 9302. Consequently, a portable television device having high performance and high reliability can be provided. The semiconductor device of the present invention can be applied to various types of television devices including a small-sized television incorporated in a portable terminal such as a cellular phone, a medium-sized television that is portable, and a large-sized television (e.g., greater than or equal to 40 inches in size).

Figure 19E:
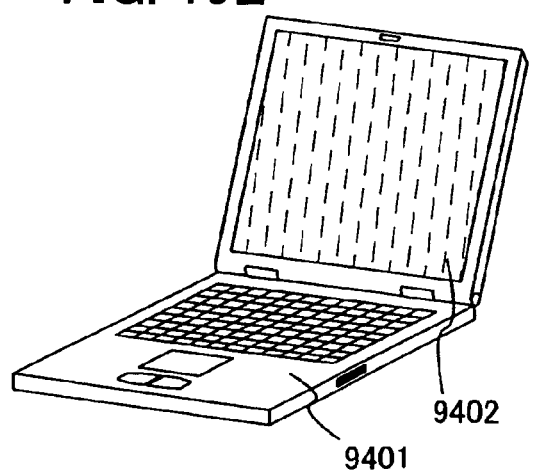

A portable computer illustrated in FIG. 19E includes a main body 9401, a display portion 9402, and the like. The semiconductor device of the present invention can be applied to the display portion 9402. Consequently, a portable computer having high performance and high reliability can be provided.

In this manner, with the use of the semiconductor device of the present invention, electronic devices having high performance and high reliability can be provided.

The present application is based on Japanese Patent Application serial No. 2007-127148 filed with Japan Patent Office on May 11, 2007, the entire contents of which are hereby incorporated by reference.

What is claimed is:

1. A method for manufacturing an SOI substrate comprising:
performing heat treatment in an oxidizing atmosphere containing halogen to form an oxide film on each surface of a first semiconductor substrate and a second semiconductor substrate;
performing irradiation with ions including one or a plurality of atoms, which are different in mass, from each one surface side of the first semiconductor substrate and the second semiconductor substrate to form a separation layer having a porous structure in each region, a depth of which is close to an average depth at which the ions reach from the each surface of the first semiconductor substrate and the second semiconductor substrate;
forming a blocking layer formed of a silicon nitride film or a silicon nitride oxide film over the oxide film on the each surface of the first semiconductor substrate and the second semiconductor substrate;
forming a silicon oxide film over the blocking layer of each of the first semiconductor substrate and the second semiconductor substrate;
generating a crack in the separation layer, performing a first heat treatment for separating each of the first semiconductor substrate and the second semiconductor substrate with the separation layer, and forming a first single-crystal semiconductor layer from the first semiconductor substrate and a second single-crystal semiconductor layer from the second semiconductor substrate with a certain distance over a glass substrate, in a state where the each surface of the first semiconductor substrate and the second semiconductor substrate are overlapped with the glass substrate to overlap with the silicon oxide film interposed therebetween;
performing a second heat treatment on the glass substrate at a temperature of greater than or equal to a strain point of the glass substrate to shrink the glass substrate after separating each of the first semiconductor substrate and the second semiconductor substrate with the separation layer, wherein the first single-crystal semiconductor layer and the second single-crystal semiconductor layer are in contact with each other by performing the second heat treatment; and
after performing the second heat treatment, irradiating the first single-crystal semiconductor layer and the second single-crystal semiconductor layer with laser light, thereby integrating the first single-crystal semiconductor layer and the second single-crystal semiconductor layer to form a third single-crystal semiconductor layer comprising the first single-crystal semiconductor layer and the second single-crystal semiconductor layer.

2. The method for manufacturing an SOI substrate according to claim 1, wherein the ions including the one or the plurality of atoms, which are different in mass, are hydrogen ions which are different in mass.

3. The method for manufacturing an SOI substrate according to claim 2, wherein the hydrogen ions, which are different in mass, are $H^+$, $H_2^+$, and $H_3^+$ ions.

4. The method for manufacturing an SOI substrate according to claim 3, wherein, among the hydrogen ions, a proportion of $H_3^+$ ion is higher than proportions of other ion species.

5. The method for manufacturing an SOI substrate according to claim 1, wherein the halogen is obtained from one or plural kinds of gases selected from among HF, $NF_3$, HBr, $Cl_2$, $ClF_3$, $BCl_3$, $F_2$, and $Br_2$.

6. The method for manufacturing an SOI substrate according to claim 1, wherein the first heat treatment for generating the crack is performed at a temperature lower than a temperature of the second heat treatment of which is higher than the strain point of the glass substrate.

7. A method for manufacturing a semiconductor device comprising forming a semiconductor element from the SOI substrate formed according to claim 1.

8. A method for manufacturing a semiconductor device comprising forming a semiconductor element from the SOI substrate formed accord to claim 1, and
forming a display element which is electrically connected to the semiconductor element.

9. The method for manufacturing a semiconductor device according to claim 8, wherein a liquid crystal display element is formed as the display element.

10. The method for manufacturing a semiconductor device according to claim 8, wherein a light-emitting element is formed as the display element.

11. A method for manufacturing an SOI substrate comprising:
performing heat treatment in an oxidizing atmosphere containing halogen to form an oxide film on each surface of a first semiconductor substrate and a second semiconductor substrate;
performing irradiation with ions including one or a plurality of atoms, which are different in mass, from each one surface side of the first semiconductor substrate and the second semiconductor substrate to form a separation layer having a porous structure in each region, a depth of which is close to an average depth at which the ions reach from the each surface of the first semiconductor substrate and the second semiconductor substrate;
forming a blocking layer formed of a silicon nitride film or a silicon nitride oxide film over the oxide film on the each surface of the first semiconductor substrate and the second semiconductor substrate;
forming a silicon oxide film over the blocking layer of each of the first semiconductor substrate and the second semiconductor substrate;

generating a crack in the separation layer, performing a first heat treatment for separating each of the first semiconductor substrate and the second semiconductor substrate with the separation layer, and forming a first single-crystal semiconductor layer from the first semiconductor substrate and a second single-crystal semiconductor layer from the second semiconductor substrate with a certain distance over a glass substrate, in a state where the each surface of the first semiconductor substrate and the second semiconductor substrate are overlapped with the glass substrate to overlap with the silicon oxide film interposed therebetween;

performing a second heat treatment on the glass substrate at a temperature of greater than or equal to a strain point of the glass substrate to shrink the glass substrate after separating each of the first semiconductor substrate and the second semiconductor substrate with the separation layer, wherein the first single-crystal semiconductor layer and the second single-crystal semiconductor layer are in contact with each other by performing the second heat treatment; and after performing the second heat treatment, irradiating the first single-crystal semiconductor layer and the second single-crystal semiconductor layer with laser light, thereby bonding the first single-crystal semiconductor layer with the second single-crystal semiconductor layer and integrating the first single-crystal semiconductor layer and the second single-crystal semiconductor layer to form a third single-crystal semiconductor layer comprising the first single-crystal semiconductor layer and the second single-crystal semiconductor layer.

12. The method for manufacturing an SOI substrate according to claim 11, wherein the ions including the one or the plurality of atoms, which are different in mass, are hydrogen ions which are different in mass.

13. The method for manufacturing an SOI substrate according to claim 12, wherein the hydrogen ions, which are different in mass, are $H^+$, $H_2^+$, and $H_3^+$ ions.

14. The method for manufacturing an SOI substrate according to claim 13, wherein, among the hydrogen ions, a proportion of $H_3^+$ ion is higher than proportions of other ion species.

15. The method for manufacturing an SOI substrate according to claim 11, wherein the halogen is obtained from one or plural kinds of gases selected from among HF, $NF_3$, HBr, $Cl_2$, $ClF_3$, $BCl_3$, $F_2$, and $Br_2$.

16. The method for manufacturing an SOI substrate according to claim 11, wherein the first heat treatment for generating the crack is performed at a temperature lower than a temperature of the second heat treatment of which is higher than the strain point of the glass substrate.

17. A method for manufacturing a semiconductor device comprising forming a semiconductor element from the SOI substrate formed according to claim 11.

18. A method for manufacturing a semiconductor device comprising forming a semiconductor element from the SOI substrate formed accord to claim 11, and
forming a display element which is electrically connected to the semiconductor element.

19. The method for manufacturing a semiconductor device according to claim 18, wherein a liquid crystal display element is formed as the display element.

20. The method for manufacturing a semiconductor device according to claim 18, wherein a light-emitting element is formed as the display element.

21. A method for manufacturing an SOI substrate comprising:
performing irradiation with ion from a surface of each of a first semiconductor substrate and a second semiconductor substrate and forming a separation layer in each of the first semiconductor substrate and the second semiconductor substrate;

forming an oxide film on each surface of the first semiconductor substrate and the second semiconductor substrate;

disposing the first semiconductor substrate and the second semiconductor substrate on a glass substrate with the oxide film interposed therebetween;

performing a first heat treatment for separating each of the first semiconductor substrate and the second semiconductor substrate with the separation layer to form a first single-crystal semiconductor layer from the first semiconductor substrate and a second single-crystal semiconductor layer from the second semiconductor substrate with a certain distance over the glass substrate;

performing a second heat treatment on the glass substrate at a temperature of greater than or equal to a strain point of the glass substrate to shrink the glass substrate after separating each of the first semiconductor substrate and the second semiconductor substrate with the separation layer, wherein the first single-crystal semiconductor layer and the second single-crystal semiconductor layer are in contact with each other by performing the second heat treatment; and after performing the second heat treatment, irradiating the first single-crystal semiconductor layer and the second single-crystal semiconductor layer with laser light, thereby integrating the first single-crystal semiconductor layer and the second single-crystal semiconductor layer to form a third single-crystal semiconductor layer comprising the first single-crystal semiconductor layer and the second single-crystal semiconductor layer.

22. The method for manufacturing an SOI substrate according to claim 21, wherein the ion includes one or a plurality of atoms which is different in mass thereof.

23. The method for manufacturing an SOI substrate according to claim 22, wherein the ion includes hydrogen ions which are different in mass.

24. The method for manufacturing an SOI substrate according to claim 23, wherein the hydrogen ions which are different in mass are $H^+$, $H_2^+$, and $H_3^+$ ions.

25. The method for manufacturing an SOI substrate according to claim 24, wherein, among the hydrogen ions, a proportion of $H_3^+$ ion is higher than proportions of other ion species.

26. The method for manufacturing an SOI substrate according to claim 21, wherein the first heat treatment for generating a crack is performed at a temperature lower than a temperature of the second heat treatment of which is higher than the strain point of the glass substrate.

27. A method for manufacturing a semiconductor device comprising forming a semiconductor element from the SOI substrate formed according to claim 21.

28. A method for manufacturing a semiconductor device comprising forming a semiconductor element from the SOI substrate formed accord to claim 21, and forming a display element which is electrically connected to the semiconductor element.

29. The method for manufacturing a semiconductor device according to claim 28, wherein a liquid crystal display element is formed as the display element.

30. The method for manufacturing a semiconductor device according to claim 28, wherein a light-emitting element is formed as the display element.

31. A method for manufacturing an SOI substrate comprising:
performing irradiation with ion from a surface of each of a first semiconductor substrate and a second semiconductor substrate and forming a separation layer in each of the first semiconductor substrate and the second semiconductor substrate;
forming an oxide film on each surface of the first semiconductor substrate and the second semiconductor substrate;
disposing the first semiconductor substrate and the second semiconductor substrate on a glass substrate with the oxide film interposed therebetween;
performing a first heat treatment for separating each of the first semiconductor substrate and the second semiconductor substrate with the separation layer to form a first single-crystal semiconductor layer from the first semiconductor substrate and a second single-crystal semiconductor layer from the second semiconductor substrate with a certain distance over the glass substrate;
performing a second heat treatment on the glass substrate at a temperature of greater than or equal to a strain point of the glass substrate to shrink the glass substrate after separating each of the first semiconductor substrate and the second semiconductor substrate with the separation layer, wherein the first single-crystal semiconductor layer and the second single-crystal semiconductor layer are in contact with each other by performing the second heat treatment; and
after performing the second heat treatment, irradiating the first single-crystal semiconductor layer and the second single-crystal semiconductor layer with laser light, thereby bonding the first single-crystal semiconductor layer with the second single-crystal semiconductor layer and integrating the first single-crystal semiconductor layer and the second single-crystal semiconductor layer to form a third single-crystal semiconductor layer comprising the first single-crystal semiconductor layer and the second single-crystal semiconductor layer.

32. The method for manufacturing an SOI substrate according to claim 31, wherein the ion includes one or a plurality of atoms which is different in mass thereof.

33. The method for manufacturing an SOI substrate according to claim 32, wherein the ion includes hydrogen ions which are different in mass.

34. The method for manufacturing an SOI substrate according to claim 33, wherein the hydrogen ions which are different in mass are $H^+$, $H_2^+$, and $H_3^+$ ions.

35. The method for manufacturing an SOI substrate according to claim 34, wherein, among the hydrogen ions, a proportion of $H_3^+$ ion is higher than proportions of other ion species.

36. The method for manufacturing an SOI substrate according to claim 31, wherein the first heat treatment for generating a crack is performed at a temperature lower than a temperature of the second heat treatment of which is higher than the strain point of the glass substrate.

37. A method for manufacturing a semiconductor device comprising forming a semiconductor element from the SOI substrate formed according to claim 31.

38. A method for manufacturing a semiconductor device comprising forming a semiconductor element from the SOI substrate formed accord to claim 31, and
forming a display element which is electrically connected to the semiconductor element.

39. The method for manufacturing a semiconductor device according to claim 38, wherein a liquid crystal display element is formed as the display element.

40. The method for manufacturing a semiconductor device according to claim 38, wherein a light-emitting element is formed as the display element.

* * * * *

UNITED STATES PATENT AND TRADEMARK OFFICE
CERTIFICATE OF CORRECTION

PATENT NO. : 7,825,007 B2
APPLICATION NO. : 12/078410
DATED : November 2, 2010
INVENTOR(S) : Shunpei Yamazaki et al.

It is certified that error appears in the above-identified patent and that said Letters Patent is hereby corrected as shown below:

At column 9, line 65, "$H_2^+ + H_2H_3^+ + H$" should be -- $H_2^+ + H_2 \rightarrow H_3^+ + H$ --;

At column 36, line 56, "PCZPCN1" should be -- PCzPCN1 --;

At column 54, line 4, "211B" should be -- 21B --;

At column 56, line 31, "treatment of which" should be -- treatment which --;

At column 60, line 21, "treatment of which" should be -- treatment which --.

Signed and Sealed this
Third Day of May, 2011

David J. Kappos
*Director of the United States Patent and Trademark Office*